(12) United States Patent
Kagan et al.

(10) Patent No.: US 12,309,047 B2
(45) Date of Patent: *May 20, 2025

(54) SYSTEMS AND METHODS FOR PROCESSING METER INFORMATION IN A NETWORK OF INTELLIGENT ELECTRONIC DEVICES

(71) Applicant: EI ELECTRONICS LLC., Westbury, NY (US)

(72) Inventors: Erran Kagan, Great Neck, NY (US); Luna A. Koval, Commack, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 663 days.

This patent is subject to a terminal disclaimer.

(21) Appl. No.: 17/088,814

(22) Filed: Nov. 4, 2020

(65) Prior Publication Data
US 2021/0058311 A1 Feb. 25, 2021

Related U.S. Application Data

(63) Continuation of application No. 13/836,671, filed on Mar. 15, 2013, now Pat. No. 10,862,784, which is a
(Continued)

(51) Int. Cl.
*H04L 43/0876* (2022.01)
*G01D 4/00* (2006.01)
(Continued)

(52) U.S. Cl.
CPC ......... *H04L 43/0876* (2013.01); *G01D 4/004* (2013.01); *H04L 67/06* (2013.01);
(Continued)

(58) Field of Classification Search
CPC ..... H04L 43/0876; H04L 67/06; H04L 67/56; H04L 12/54; G06Q 50/06; Y02B 90/20;
(Continued)

(56) References Cited

U.S. PATENT DOCUMENTS 2,883,255 A 4/1959 Anderson
2,987,704 A 6/1961 Gimpel et al.
(Continued)

FOREIGN PATENT DOCUMENTS

CN 101799681 A 8/2010
CN 111444240 A 7/2020
(Continued)

OTHER PUBLICATIONS

ION Technology, 7500 ION 7600 ION High Visibility Energy & Power Quality Compliance Meters, Power Measurement, specification, pp. 1-8, revision date Nov. 30, 2000.
(Continued)

*Primary Examiner* — James N Fiorillo
(74) *Attorney, Agent, or Firm* — Robinson + Cole LLP

(57) ABSTRACT

Systems and methods are provided for managing software scripts. One system comprises one or more meters, each configured to measure parameters of a commodity. The system also comprises a server and a plurality of client devices. The server is in communication with the one or more meters by way of a communication network and is configured to receive and store the measured parameters from the one or more meters. The client devices communicate with the server via the communication network. Also, the system includes a base device in communication with the client devices. The base device is configured to store one or more functional chains, each of the one or more functional chains comprising software code defining a plurality of functional actions to be performed in a specific sequence. The base device comprises an interface that allows the plurality of client devices to reference the functional chain.

31 Claims, 27 Drawing Sheets

Related U.S. Application Data continuation-in-part of application No. 13/644,877, filed on Oct. 4, 2012, now abandoned.

(60) Provisional application No. 61/542,935, filed on Oct. 4, 2011.

(51) Int. Cl.
  *G01R 22/06* (2006.01)
  *G06Q 50/06* (2024.01)
  *H04L 67/06* (2022.01)
  *H04L 67/56* (2022.01)
  *H04W 4/38* (2018.01)

(52) U.S. Cl.
  CPC .......... *H04L 67/56* (2022.05); *G01R 22/063* (2013.01); *G06Q 50/06* (2013.01); *H04W 4/38* (2018.02); *Y02B 90/20* (2013.01); *Y04S 20/30* (2013.01)

(58) Field of Classification Search
  CPC .......... Y02B 90/00; G01D 4/004; G01D 4/00; G01R 22/063; G01R 22/06; H04W 4/38; Y04S 20/30
  USPC ........................................................ 709/224
  See application file for complete search history.

(56) References Cited

U.S. PATENT DOCUMENTS

| | | |
|---|---|---|
| 3,142,820 A | 7/1964 | Daniels |
| 3,453,540 A | 7/1969 | Dusheck, Jr. |
| 3,824,441 A | 7/1974 | Heyman et al. |
| 4,246,623 A | 1/1981 | Sun |
| 4,466,071 A | 8/1984 | Russell |
| 4,489,386 A | 12/1984 | Breddan |
| 4,884,021 A | 11/1989 | Hammond et al. |
| 4,996,646 A | 2/1991 | Farrington |
| 5,014,229 A | 5/1991 | Mofachern |
| 5,166,887 A | 11/1992 | Farrington et al. |
| 5,170,360 A | 12/1992 | Porter et al. |
| 5,185,705 A | 2/1993 | Farrington |
| 5,212,441 A | 5/1993 | McEachern et al. |
| 5,224,054 A | 6/1993 | Wallis |
| 5,233,538 A | 8/1993 | Wallis |
| 5,237,511 A | 8/1993 | Caird et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,122 A | 4/1994 | Halpern |
| 5,302,890 A | 4/1994 | McEachern et al. |
| 5,307,009 A | 4/1994 | McEachern et al. |
| 5,315,527 A | 5/1994 | Beckwith |
| 5,347,464 A | 9/1994 | McEachern et al. |
| 5,544,064 A | 8/1996 | Beckwith |
| 5,559,719 A | 9/1996 | Johnson et al. |
| 5,574,654 A | 11/1996 | Bingham et al. |
| 5,581,173 A | 12/1996 | Yalla et al. |
| 5,706,204 A | 1/1998 | Cox et al. |
| 5,724,556 A | 3/1998 | Souder et al. |
| 5,764,523 A | 6/1998 | Yoshinaga et al. |
| 5,774,366 A | 6/1998 | Beckwith |
| 5,796,977 A | 8/1998 | Sarangdhar et al. |
| 5,801,643 A | 9/1998 | Williams et al. |
| 5,819,203 A | 10/1998 | Moore et al. |
| 5,822,165 A | 10/1998 | Moran |
| 5,832,210 A | 11/1998 | Akiyama et al. |
| 5,874,903 A | 2/1999 | Shuey et al. |
| 5,898,387 A | 4/1999 | Davis et al. |
| 5,899,960 A | 5/1999 | Moore et al. |
| 5,986,574 A | 11/1999 | Colton |
| 6,018,690 A | 1/2000 | Saito et al. |
| 6,028,857 A | 2/2000 | Poor |
| 6,038,516 A | 3/2000 | Alexander et al. |
| 6,073,169 A | 6/2000 | Shuey et al. |
| 6,098,175 A | 8/2000 | Lee |
| 6,100,817 A | 8/2000 | Mason, Jr. et al. |
| 6,121,593 A | 9/2000 | Mansbery et al. |
| 6,151,653 A | 11/2000 | Lin et al. |
| 6,157,329 A | 12/2000 | Lee et al. |
| 6,167,329 A | 12/2000 | Engel et al. |
| 6,195,614 B1 | 2/2001 | Kochan |
| 6,279,037 B1 | 8/2001 | Tams et al. |
| 6,289,267 B1 | 9/2001 | Alexander et al. |
| 6,343,299 B1 | 1/2002 | Huang et al. |
| 6,396,839 B1 | 5/2002 | Ardalan et al. |
| 6,405,128 B1 | 6/2002 | Bechtolsheim et al. |
| 6,437,692 B1 | 8/2002 | Petite et al. |
| 6,487,457 B1 * | 11/2002 | Hull .................... G05B 19/042 700/86 |
| 6,493,644 B1 | 12/2002 | Jonker et al. |
| 6,496,511 B1 | 12/2002 | Wang et al. |
| 6,519,537 B1 | 2/2003 | Yang |
| 6,528,957 B1 | 3/2003 | Luchaco |
| 6,564,332 B1 | 5/2003 | Nguyen et al. |
| 6,565,608 B1 | 5/2003 | Fein et al. |
| 6,615,147 B1 | 9/2003 | Jonker et al. |
| 6,636,030 B1 | 10/2003 | Rose et al. |
| 6,657,552 B2 | 12/2003 | Belski et al. |
| 6,671,654 B1 | 12/2003 | Forth et al. |
| 6,671,802 B1 | 12/2003 | Ott |
| 6,717,394 B2 | 4/2004 | Elms |
| 6,735,535 B1 | 5/2004 | Kagan et al. |
| 6,751,563 B2 | 6/2004 | Spanier et al. |
| 6,836,737 B2 | 12/2004 | Petite et al. |
| 6,842,707 B2 | 1/2005 | Raichle et al. |
| 6,900,738 B2 | 5/2005 | Crichlow |
| 6,904,385 B1 * | 6/2005 | Budike, Jr. ............. G06Q 50/06 702/182 |
| 6,957,158 B1 | 10/2005 | Hancock et al. |
| 6,972,364 B2 | 12/2005 | Diedrichsen |
| 6,985,087 B2 | 1/2006 | Soliman |
| 7,006,934 B2 | 2/2006 | Jonker et al. |
| 7,010,438 B2 | 3/2006 | Hancock et al. |
| 7,043,459 B2 | 5/2006 | Peevey |
| 7,049,975 B2 | 5/2006 | Vanderah et al. |
| 7,050,808 B2 | 5/2006 | Janusz et al. |
| 7,072,779 B2 | 7/2006 | Hancock et al. |
| 7,085,824 B2 | 8/2006 | Forth et al. |
| 7,085,938 B1 | 8/2006 | Pozzuoli et al. |
| 7,126,493 B2 * | 10/2006 | Junker .................... H04W 4/80 455/500 |
| 7,129,848 B2 | 10/2006 | Milliot et al. |
| 7,203,319 B2 | 4/2007 | Ben-Zur et al. |
| 7,243,050 B2 | 7/2007 | Armstrong |
| 7,249,265 B2 | 7/2007 | Carolsfeld et al. |
| 7,271,996 B2 | 9/2007 | Kagan et al. |
| 7,299,308 B2 | 11/2007 | Kondo et al. |
| 7,304,586 B2 | 12/2007 | Wang et al. |
| 7,337,081 B1 | 2/2008 | Kagan |
| 7,342,507 B2 | 3/2008 | Jonker et al. |
| 7,436,687 B2 | 10/2008 | Patel |
| 7,444,454 B2 | 10/2008 | Yancey et al. |
| 7,511,468 B2 | 3/2009 | McEachern et al. |
| 7,514,907 B2 | 4/2009 | Rajda et al. |
| 7,616,656 B2 | 11/2009 | Wang et al. |
| 7,668,663 B2 | 2/2010 | Kurnik et al. |
| 7,702,779 B1 * | 4/2010 | Gupta .................... G06F 9/50 709/224 |
| 7,739,728 B1 | 6/2010 | Koehler et al. |
| 7,813,822 B1 | 10/2010 | Hoffberg |
| 7,899,630 B2 | 3/2011 | Kagan |
| 7,916,015 B1 | 3/2011 | Evancich et al. |
| 7,916,060 B2 | 3/2011 | Zhu et al. |
| 7,921,199 B1 | 4/2011 | Shirriff et al. |
| 7,961,736 B2 | 6/2011 | Ayyagari |
| 7,962,298 B2 | 6/2011 | Przydatek et al. |
| 7,999,696 B2 | 8/2011 | Wang et al. |
| 8,019,836 B2 | 9/2011 | Elliott et al. |
| 8,024,073 B2 | 9/2011 | Imes et al. |

(56) References Cited

U.S. PATENT DOCUMENTS

| | | |
|---|---|---|
| 8,078,418 B2 | 12/2011 | Banhegyesi et al. |
| 8,160,824 B2 | 4/2012 | Spanier et al. |
| 8,190,381 B2 | 5/2012 | Spanier et al. |
| 8,193,929 B1 | 6/2012 | Siu et al. |
| 8,250,246 B2 | 8/2012 | Brockmann et al. |
| 8,335,936 B2 | 12/2012 | Jonsson et al. |
| 8,402,267 B1 | 3/2013 | Graham et al. |
| 8,599,036 B2 | 12/2013 | Wang et al. |
| 8,635,036 B2 | 1/2014 | Pamulaparthy et al. |
| 8,700,347 B2 | 4/2014 | Spanier et al. |
| 8,717,007 B2 | 5/2014 | Banhegyesi |
| 8,812,979 B2 | 8/2014 | Khanke et al. |
| 8,933,815 B2 | 1/2015 | Kagan et al. |
| 9,080,894 B2 | 7/2015 | Spanier et al. |
| 9,094,227 B2 | 7/2015 | Park |
| 9,161,102 B2 | 10/2015 | Millstein et al. |
| 9,268,552 B1 | 2/2016 | Kiiskila et al. |
| 9,310,792 B2 | 4/2016 | Lu et al. |
| 10,303,860 B2 | 5/2019 | Koval et al. |
| 2002/0024453 A1 | 2/2002 | Maeda |
| 2002/0032535 A1 | 3/2002 | Alexander et al. |
| 2002/0048269 A1 | 4/2002 | Hong et al. |
| 2002/0052972 A1 | 5/2002 | Mm |
| 2002/0065872 A1 | 5/2002 | Genske et al. |
| 2002/0073211 A1 | 6/2002 | Lin et al. |
| 2002/0105435 A1 | 8/2002 | Yee et al. |
| 2002/0120723 A1 | 8/2002 | Forth et al. |
| 2002/0129342 A1 | 9/2002 | Kil et al. |
| 2002/0133504 A1 | 9/2002 | Mahos et al. |
| 2002/0162014 A1 | 10/2002 | Przydatek et al. |
| 2002/0169570 A1 | 11/2002 | Spanier et al. |
| 2002/0174223 A1 | 11/2002 | Childers et al. |
| 2002/0188706 A1 | 12/2002 | Richards et al. |
| 2003/0005130 A1 | 1/2003 | Cheng |
| 2003/0014200 A1 | 1/2003 | Jonker et al. |
| 2003/0065757 A1 | 4/2003 | Mentze et al. |
| 2003/0084280 A1 | 5/2003 | Bryan et al. |
| 2003/0093429 A1 | 5/2003 | Nishikawa et al. |
| 2003/0110380 A1 | 6/2003 | Carolsfeld et al. |
| 2003/0163508 A1 | 8/2003 | Goodman |
| 2003/0178982 A1 | 9/2003 | Elms |
| 2003/0179714 A1 | 9/2003 | Gilgenbach et al. |
| 2003/0187550 A1 | 10/2003 | Wilson et al. |
| 2003/0200285 A1 | 10/2003 | Hansen et al. |
| 2003/0204756 A1 | 10/2003 | Ransom et al. |
| 2003/0226058 A1 | 12/2003 | Miller et al. |
| 2004/0078474 A1 | 4/2004 | Ramaswamy |
| 2004/0098459 A1 | 5/2004 | Leukert-Knapp et al. |
| 2004/0107025 A1 | 6/2004 | Ransom et al. |
| 2004/0127775 A1* | 7/2004 | Miyazaki ............... G16H 50/20 600/300 |
| 2004/0128260 A1 | 7/2004 | Amedure et al. |
| 2004/0138834 A1 | 7/2004 | Blackett et al. |
| 2004/0162642 A1 | 8/2004 | Gasper et al. |
| 2004/0170181 A1 | 9/2004 | Bogdon et al. |
| 2004/0172207 A1 | 9/2004 | Hancock et al. |
| 2004/0177062 A1 | 9/2004 | Urquhart et al. |
| 2004/0187028 A1 | 9/2004 | Perkins et al. |
| 2004/0193329 A1 | 9/2004 | Ransom et al. |
| 2004/0208182 A1 | 10/2004 | Boles et al. |
| 2004/0243735 A1 | 12/2004 | Rosenbloom et al. |
| 2004/0250059 A1 | 12/2004 | Ramelson et al. |
| 2005/0027464 A1 | 2/2005 | Jonker et al. |
| 2005/0033956 A1 | 2/2005 | Krempl |
| 2005/0060110 A1 | 3/2005 | Jones et al. |
| 2005/0093571 A1 | 5/2005 | Suaris et al. |
| 2005/0138421 A1 | 6/2005 | Fedronic et al. |
| 2005/0138432 A1 | 6/2005 | Ransom et al. |
| 2005/0144437 A1 | 6/2005 | Ransom et al. |
| 2005/0169309 A1 | 8/2005 | Tripathi et al. |
| 2005/0183128 A1 | 8/2005 | Assayag et al. |
| 2005/0187725 A1 | 8/2005 | Cox |
| 2005/0202808 A1 | 9/2005 | Fishman et al. |
| 2005/0234837 A1* | 10/2005 | Ramachandran ...... G06Q 50/06 705/412 |
| 2005/0240540 A1 | 10/2005 | Borleske et al. |
| 2005/0273280 A1 | 12/2005 | Cox |
| 2005/0273281 A1 | 12/2005 | Wall et al. |
| 2006/0020788 A1 | 1/2006 | Han et al. |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0083260 A1 | 4/2006 | Wang et al. |
| 2006/0085419 A1 | 4/2006 | Rosen |
| 2006/0089932 A1* | 4/2006 | Buehler ............... G06F 21/6218 707/999.009 |
| 2006/0145890 A1 | 7/2006 | Junker et al. |
| 2006/0155422 A1 | 7/2006 | Uy et al. |
| 2006/0155442 A1 | 7/2006 | Luo et al. |
| 2006/0161360 A1 | 7/2006 | Yao et al. |
| 2006/0161400 A1 | 7/2006 | Kagan |
| 2006/0200599 A1 | 9/2006 | Manchester et al. |
| 2006/0206433 A1 | 9/2006 | Scoggins |
| 2006/0267560 A1 | 11/2006 | Rajda et al. |
| 2006/0274899 A1 | 12/2006 | Zhu et al. |
| 2007/0047735 A1 | 3/2007 | Celli et al. |
| 2007/0058634 A1 | 3/2007 | Gupta et al. |
| 2007/0061786 A1 | 3/2007 | Zhou et al. |
| 2007/0067119 A1* | 3/2007 | Loewen ............... G01R 22/065 702/57 |
| 2007/0067121 A1 | 3/2007 | Przydatek et al. |
| 2007/0096765 A1 | 5/2007 | Kagan |
| 2007/0096942 A1 | 5/2007 | Kagan et al. |
| 2007/0106618 A1 | 5/2007 | Wu et al. |
| 2007/0114987 A1 | 5/2007 | Kagan |
| 2007/0120705 A1 | 5/2007 | Kiiskila et al. |
| 2007/0152058 A1 | 7/2007 | Yeakley et al. |
| 2007/0186111 A1 | 8/2007 | Durand |
| 2007/0240159 A1 | 10/2007 | Sugiyama |
| 2007/0255861 A1* | 11/2007 | Kain ..................... H04L 63/029 710/8 |
| 2007/0263643 A1 | 11/2007 | Nadhawan |
| 2007/0266004 A1 | 11/2007 | Wall et al. |
| 2008/0028395 A1 | 1/2008 | Motta et al. |
| 2008/0033920 A1* | 2/2008 | Colclasure ......... G06F 16/2453 |
| 2008/0052384 A1 | 2/2008 | Marl et al. |
| 2008/0071482 A1 | 3/2008 | Zweigle et al. |
| 2008/0074285 A1* | 3/2008 | Guthrie ................. H04L 67/12 340/870.02 |
| 2008/0077806 A1* | 3/2008 | Cui ..................... G06F 21/6227 713/193 |
| 2008/0086222 A1 | 4/2008 | Kagan |
| 2008/0103631 A1 | 5/2008 | Koliwad et al. |
| 2008/0104149 A1 | 5/2008 | Vishniac et al. |
| 2008/0130639 A1 | 6/2008 | Costa-Requena et al. |
| 2008/0147334 A1 | 6/2008 | Kagan |
| 2008/0168434 A1 | 7/2008 | Gee et al. |
| 2008/0172192 A1 | 7/2008 | Banhegyesi |
| 2008/0187116 A1 | 8/2008 | Reeves et al. |
| 2008/0195562 A1* | 8/2008 | Worth .................... G06Q 50/06 705/412 |
| 2008/0195794 A1 | 8/2008 | Banker |
| 2008/0201723 A1 | 8/2008 | Bottaro et al. |
| 2008/0215264 A1 | 9/2008 | Spanier et al. |
| 2008/0228830 A1 | 9/2008 | Hawtin |
| 2008/0234957 A1 | 9/2008 | Banhegyesi et al. |
| 2008/0235355 A1* | 9/2008 | Spanier ................. G06F 16/27 709/219 |
| 2008/0238406 A1 | 10/2008 | Banhegyesi |
| 2008/0238713 A1 | 10/2008 | Banhegyesi et al. |
| 2008/0243404 A1 | 10/2008 | Banhegyesi |
| 2008/0291054 A1* | 11/2008 | Groft ................... G06Q 30/0284 340/932.2 |
| 2009/0012728 A1 | 1/2009 | Spanier et al. |
| 2009/0037163 A1* | 2/2009 | Kong .................... G06F 9/455 703/21 |
| 2009/0055912 A1 | 2/2009 | Choi et al. |
| 2009/0070168 A1 | 3/2009 | Thompson et al. |
| 2009/0070447 A1 | 3/2009 | Jubinville et al. |
| 2009/0082879 A1 | 3/2009 | Dooley et al. |
| 2009/0082980 A1 | 3/2009 | Thurmond et al. |
| 2009/0094317 A1 | 4/2009 | Venkitaraman |

(56) References Cited

U.S. PATENT DOCUMENTS

| | | |
|---|---|---|
| 2009/0096654 A1 | 4/2009 | Zhu et al. |
| 2009/0115626 A1* | 5/2009 | Vaswani .............. G01D 4/004 340/870.02 |
| 2009/0172519 A1 | 7/2009 | Xu et al. |
| 2009/0190486 A1* | 7/2009 | Lavigne .............. H04L 47/33 370/252 |
| 2009/0196206 A1 | 8/2009 | Weaver et al. |
| 2009/0228224 A1 | 9/2009 | Spanier et al. |
| 2009/0235075 A1 | 9/2009 | Cho et al. |
| 2009/0235090 A1 | 9/2009 | Chang |
| 2009/0276102 A1 | 11/2009 | Smith et al. |
| 2009/0292894 A1 | 11/2009 | Henry et al. |
| 2009/0300165 A1 | 12/2009 | Tuckey et al. |
| 2009/0307178 A1* | 12/2009 | Kuhns .............. G08C 19/00 706/54 |
| 2009/0327483 A1 | 12/2009 | Thompson et al. |
| 2010/0004350 A1 | 1/2010 | Zalich et al. |
| 2010/0031076 A1 | 2/2010 | Wan et al. |
| 2010/0054276 A1 | 3/2010 | Wang et al. |
| 2010/0057387 A1 | 3/2010 | Kagan et al. |
| 2010/0057628 A1 | 3/2010 | Trinidad et al. |
| 2010/0058355 A1 | 3/2010 | Gernaey |
| 2010/0073192 A1 | 3/2010 | Goldfisher et al. |
| 2010/0094851 A1 | 4/2010 | Bent et al. |
| 2010/0121996 A1 | 5/2010 | Schmidt et al. |
| 2010/0169709 A1 | 7/2010 | Chiu et al. |
| 2010/0169876 A1 | 7/2010 | Mann |
| 2010/0175062 A1 | 7/2010 | Kim |
| 2010/0217871 A1* | 8/2010 | Gammon .............. H04L 67/1097 709/227 |
| 2010/0238003 A1 | 9/2010 | Chan et al. |
| 2010/0278187 A1 | 11/2010 | Hart et al. |
| 2010/0299441 A1 | 11/2010 | Hughes et al. |
| 2010/0324845 A1 | 12/2010 | Spanier et al. |
| 2011/0004350 A1 | 1/2011 | Cheifetz et al. |
| 2011/0004426 A1 | 1/2011 | Wright et al. |
| 2011/0015961 A1 | 1/2011 | Chan |
| 2011/0016021 A1 | 1/2011 | Manning |
| 2011/0029461 A1 | 2/2011 | Hardin, Jr. |
| 2011/0040809 A1 | 2/2011 | Spanier et al. |
| 2011/0069709 A1 | 3/2011 | Morris et al. |
| 2011/0072423 A1 | 3/2011 | Fukata |
| 2011/0078305 A1* | 3/2011 | Varela .............. H04N 21/4316 709/224 |
| 2011/0093843 A1 | 4/2011 | Endo et al. |
| 2011/0106589 A1 | 5/2011 | Blomberg et al. |
| 2011/0107357 A1 | 5/2011 | Cullimore |
| 2011/0178651 A1 | 7/2011 | Choi et al. |
| 2011/0184671 A1 | 7/2011 | Abiprojo et al. |
| 2011/0282508 A1 | 11/2011 | Goutard et al. |
| 2011/0296496 A1* | 12/2011 | O'Donnell .............. H04L 63/102 726/4 |
| 2012/0041696 A1 | 2/2012 | Sanderford et al. |
| 2012/0059932 A1 | 3/2012 | Messer et al. |
| 2012/0078547 A1 | 3/2012 | Murdoch |
| 2012/0079471 A1 | 3/2012 | Vidal et al. |
| 2012/0099478 A1 | 4/2012 | Fu et al. |
| 2012/0109999 A1* | 5/2012 | Futty .............. G06Q 30/06 707/769 |
| 2012/0126995 A1* | 5/2012 | Sobotka .............. H04B 3/546 340/870.03 |
| 2012/0173032 A1* | 7/2012 | Pamulaparthy ........ G01D 4/002 700/286 |
| 2012/0209057 A1 | 8/2012 | Siess et al. |
| 2012/0216244 A1 | 8/2012 | Kumar et al. |
| 2012/0245595 A1* | 9/2012 | Kesavadas .............. B25J 9/1689 606/130 |
| 2012/0265357 A1 | 10/2012 | Song et al. |
| 2012/0299744 A1 | 11/2012 | Sfaelos |
| 2013/0031201 A1 | 1/2013 | Kagan et al. |
| 2013/0055389 A1 | 2/2013 | Alvarez et al. |
| 2013/0066965 A1 | 3/2013 | Foti |
| 2013/0073059 A1 | 3/2013 | Brian et al. |
| 2013/0073374 A1* | 3/2013 | Heath .............. G06Q 30/02 705/14.39 |
| 2013/0084882 A1* | 4/2013 | Khorashadi .......... H04W 4/021 455/456.1 |
| 2013/0103657 A1 | 4/2013 | Ikawa et al. |
| 2013/0151849 A1 | 6/2013 | Graham et al. |
| 2013/0158918 A1 | 6/2013 | Spanier et al. |
| 2013/0198507 A1 | 8/2013 | Kasuya |
| 2013/0200702 A1* | 8/2013 | Schoppner .............. H02J 3/46 307/77 |
| 2013/0293390 A1* | 11/2013 | Le Buhan .............. G01D 4/004 340/870.02 |
| 2013/0318627 A1 | 11/2013 | Lundkvist et al. |
| 2014/0025321 A1 | 1/2014 | Spanier |
| 2014/0094194 A1 | 4/2014 | Schwent et al. |
| 2014/0149836 A1 | 5/2014 | Bedard et al. |
| 2014/0172885 A1 | 6/2014 | Sekharan |
| 2014/0236371 A1 | 8/2014 | Ishihara et al. |
| 2014/0277788 A1 | 9/2014 | Forbes, Jr. |
| 2014/0281620 A1 | 9/2014 | Rallo et al. |
| 2014/0325679 A1 | 10/2014 | Heo et al. |
| 2015/0089061 A1 | 3/2015 | Li et al. |
| 2015/0143108 A1 | 5/2015 | Demeter et al. |
| 2015/0178865 A1 | 6/2015 | Anderson et al. |
| 2015/0185748 A1 | 7/2015 | Ishchenko et al. |
| 2015/0286394 A1 | 10/2015 | Koval |
| 2015/0294013 A1 | 10/2015 | Ozer |
| 2015/0316907 A1 | 11/2015 | ElBsat et al. |
| 2015/0317151 A1 | 11/2015 | Falcy et al. |
| 2015/0317589 A1 | 11/2015 | Anderson et al. |
| 2015/0324896 A1 | 11/2015 | Marson et al. |
| 2015/0341969 A1 | 11/2015 | Brochu et al. |
| 2016/0011616 A1 | 1/2016 | Janous et al. |
| 2016/0034437 A1* | 2/2016 | Yong .............. G06Q 30/0267 715/202 |
| 2016/0283256 A1 | 9/2016 | Standley et al. |
| 2016/0294953 A1 | 10/2016 | Prabhakar et al. |
| 2016/0359684 A1 | 12/2016 | Rizqi et al. |
| 2016/0364648 A1 | 12/2016 | Du et al. |
| 2017/0039372 A1 | 2/2017 | Koval et al. |
| 2017/0063566 A1 | 3/2017 | Seminario et al. |
| 2017/0078455 A1 | 3/2017 | Fisher et al. |
| 2017/0140149 A1 | 5/2017 | Dumas et al. |
| 2017/0147329 A1 | 5/2017 | Shutt et al. |
| 2017/0162320 A1 | 6/2017 | Rumrill |
| 2017/0180137 A1 | 6/2017 | Spanier et al. |
| 2017/0185056 A1 | 6/2017 | Satou |
| 2017/0270414 A1 | 9/2017 | Ignatova et al. |
| 2017/0317495 A1 | 11/2017 | Pavlovski et al. |
| 2017/0373500 A1 | 12/2017 | Shafi et al. |
| 2018/0025423 A1 | 1/2018 | Utsumi et al. |
| 2018/0066860 A1 | 3/2018 | Carlson et al. |
| 2018/0260695 A1 | 9/2018 | Majumdar et al. |
| 2018/0260920 A1 | 9/2018 | Saratsis et al. |
| 2018/0275898 A1 | 9/2018 | Bhansali et al. |
| 2019/0086891 A1 | 3/2019 | Kawamoto et al. |
| 2019/0102411 A1 | 4/2019 | Hung et al. |
| 2019/0138964 A1 | 5/2019 | Morita et al. |
| 2019/0205116 A1 | 7/2019 | Chen et al. |
| 2019/0340545 A1 | 11/2019 | Minegishi et al. |
| 2019/0349733 A1 | 11/2019 | Nolan et al. |
| 2020/0143522 A1 | 5/2020 | Vogels et al. |
| 2020/0266628 A1 | 8/2020 | Kato et al. |

FOREIGN PATENT DOCUMENTS

| | | |
|---|---|---|
| JP | 2009225629 A | 10/2009 |
| KR | 101522175 B1 | 5/2015 |
| WO | 2008099035 A1 | 8/2008 |
| WO | 2009044369 A2 | 4/2009 |
| WO | 2009044369 A3 | 5/2009 |

OTHER PUBLICATIONS

Microsoft TechNet, Using DNS Servers with DHCP, Jan. 21, 2005; Accessed from https://technet.microsoft.com/en-us/library/cc787034 on Jun. 9, 2015; pp. 1-4.

(56) References Cited

OTHER PUBLICATIONS

"The Debian New Maintainer's Guide", Debian.org, 2011, Chapters 1, 6, and B. retrieved from https://lweb.archive.org/web/2011 051401193B/http://www.debian.org/doc/manuals/maint-guide/start. en.html (April 2B, 2021). (Year: 2011).

"Use Excel As A Web Browser" at https://www.youtube.com/watch?v=A7LukCXev78 (Year: 2010).

Allard, Jeremie, et al., "Jini meets UPnP: an architecture for Jini/UPnP interoperability.", Proceedings of the 2003 Symposium on Applications and the Internet, 2003. IEEE, 2003, 8 pages.

Andersen, M.P. and Culler, D.E., 2016. Btrdb: Optimizing storage system design for timeseries processing. In 14th {USENIX}Conference on File and Storage Technologies ({FAST} 16) (pp. 39-52). (Year: 2016).

Braden, R (editor), "Requirements for Internet Hosts-Application and Support", RFC 1123, pp. 1-97, Oct. 1989.

Chima, Chikodi, "How Social Media Will Make the smart Energy Grid More Efficient", mashable.com, Feb. 8, 2011, pp. 1-4.

Codingfreak, "https://web.archive.org/web/201 00426123449/http://codingfreak.blogspot.com/201 0/01 /iptables-rate-limitincoming. htm", Apr. 26, 2010.

Communicator EXT 3.0 User Manual Revision 1.32, Electro Industries/Gauge Tech, 558 pages, Aug. 27, 2007.

Crockford, Douglas, "https://web.archive.org/web/20030621 080211 /http://www.crockford.com/javascript/jsmin.html", Oct. 28, 2002.

Deutsch, P., Emtage, A., and Marine, A., "How to Use Anonymous FTP", RFC1635, pp. 1-13, May 1994.

Dong Yu, Wayne Xiong, Jasha Droppo, Andreas Stolcke, Guoli Ye, Jinyu Li, Geoffrey Zweig, 2016. Proc. Interspeech: Deep Convolutional Neural Networks with Layer-wise Context Expansion and Attention, 5 pages, Sep. 2016.

Duncan, Brent K et al., "Protection, metering, monitoring, and control of medium-voltage power systems.", IEEE Transactions on Industry Applications, vol. 40, No. 1, Jan./Feb. 2004; pp. 33-40.

Futura+Series, "Advanced Power Monitoring and Analysis for the 21st Century", Electro Industries/Gauge Tech, specification, 8 pages, Apr. 13, 2000.

Gonzales, Jesus and Papa, Mauricio, "Passive Scanning in Modbus Networks;" 2008, in IFIP International Federation for Information Processing, vol. 253, Critical Infrastructure Protection; 2008; pp. 175-187.

Hubbert, "What is flat file?", Whatis.com, http://searchsqlserver. techtarget.com/definition/flat-file, Jul. 2006, 1 pp.

HW Virtual Serial Port, "HW Virtual Serial Port" Jul. 2003, http://www.trcontrolsolutions.com/pdfs/hw_vsp_v104_en.pdf; pp. 1-4.

iEC 61000-4-15: Electromagnetic compatibility (EMC) Part 4: Testing and measuring techniques, Section 15: Flickermeter-Functional and design specifications; CENELEC-European Committee for Electrotechnical Standardization; pp. 1-25; Apr. 1998.

ION Technology 7700 ION 3-Phase Power Meter, Analyzer and Controller, Power Measurement, specification, pp. 1-10, revision date Dec. 8, 1998.

ION Technology, 7500 ION High Visibility 3-Phase Energy & Power Quality Meter, Power Measurement, specification, pp. 1-8, revision date Mar. 21, 2000.

ION7550/ion7650 PowerLogic power-monitoring units, Technical data sheets, pp. 1-12, Copyright 2006 Schneider Electric.

Janetzko, H., Stoffel, F., Mittelstadt, S. and Keim, DA, 2014. Anomaly detection for visual analytics of power consumption data. Computers & Graphics, 38, pp. 27-37. (Year: 2014).

Kezunovic, M., 2011. Smart fault location for smart grids. IEEE transactions on smart grid, 2(1), pp. 11-22. (Year: 2011).

Microsoft, Computer Dictionary, 2002, 5th Ed. (Year: 2002) Definition of Javascript.

Microsoft, Microsoft Computer Dictionary, 5th Ed. 2002; pp. 174, 215, and 276 (excerpt includes table of contents and frontmatter). (Year: 2002).

Natarajan "4 Easy Steps to Upgrade Linksys Wireless Router" thegeekstuff.com, 2009, 3 pages. retreived from https://www.thegeekstuff.com/2009/06/how-to-upgrade-linksys-wireless-router-firmware on Jun. 7, 2019 (Year: 2009).

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Paladion, https://www.paladion.net/blogs/introduction-to-code-obfuscation, 2004 (Year: 2004).

Pan, J., Zi, Y., Chen, J., Zhou, Z. and Wang, B., 2017. LiftingNet: A novel deep learning network with layerwise feature learningfrom noisy mechanical data for fault classification. I EEE Transactions on Industrial Electronics, 65(6), pp.4973-4982. (Year: 2017).

Performance Power Meter & Data Acquisition Node, Electro Industries/Gauge Tech, Nexus 1250 specification, 8 pages, Dec. 14, 2000.

Postel, J.B., and Reynolds, J.K. "File Transfer Protocol (FTP)", RFC959, pp. 1-66, Oct. 1985.

PowerLogic Series 4000 Circuit Monitors, pp. 1-4; Document #3020HO0601; Jan. 2006.

RFC2228 FTP Security Extensions; Network Working Group, Internet Society, 1997; Retrieved from https://tools.ietf.org/html/rfc2228 Apr. 18, 2019; (Year: 1997); pp. 1-28.

Speirs, "What is binary file?", Whatls.com, http://whatis.techtarget. com/definition/binary-file, Apr. 2005, 1 pp.

Trunov, A.S., Voronova, L.I., Voronov, V.I., Sukhachev, D.I. and Strelnikov, V.G., Mar. 2018. Legacy applications modelintegration to support scientific experiment. In 2018 Systems of Signals Generating and Processing in the Field of on BoardCommunications (pp. 1-7). IEEE. (Year: 2018).

Tufekci, P., 2014. Prediction of full load electrical power output of a base load operated combined cycle power plant using machinelearning methods. International Journal of Electrical Power & Energy Systems, 60, pp. 126-140. (Year: 2014).

UPnP Forum, "UPnP Device Architecture 1.0", Rev. Apr. 24, 2008, pp. 1-80.

User's Installation & Operation and User's Programming Manual. The Futura Series, Electro Industries, pp. 1-64, Copyright 1995.

WhatIs.com, "What is a Network Interface Card?", hUps://www. techtarget.com/searchnetworking/definition/network-Interface-card?_gl=1*13qjdky*_ga*NzA 1 MzE3NjAyLjE2Mzl3NzU5NjA.*_ga_TQKE4GS5P9*MTYzMjk1 MDkzNC4yLj EuMTYzMjk1 MTY3Ny4w&_ga=2.164813883.525309060.1632950935-705317602. 1632775960, Sep. 27, 2021; 5 pp. (Year: 2021).

White, Russ, "Working with IP addresses"; http://web.archive.org/web/20060508172602/http://www.cisco.com/web/about/ac123/ac147/archived_issues/ipj_9-1/ip_addresses.tml, May 8, 2006; Copyright 1992-2006 Cisco Systems, Inc., pp. 1-8.

Wikipedia, Burst mode (computing), https://web.archive.org/web/20081018044345/http://en.wikipedia.org/wiki/Burst_mode_(computing), Oct. 18, 2008, 1 pp.

Wikipedia, File Transfer Protocol, https://web.archive.org/web/20051216071210/http:en.wikipedia.org/wiki/File_Transfer_Protocol, Dec. 16, 2005, 9 pp.

Wikipedia, Universal Plug and Play, https://web.archive.org/web/2001014015536/http://en.wikipedia.org/wiki/Universal_Plug_and_Play, Oct. 14, 2007, 14 pp.

Wikipedia, User Datagram Protocol, https://web.archive.org/web/20050823032448/https://en. wikipedia .org/wiki/User_Datagram_Protocol, Aug. 23, 2005, 2 pp. (Year: 2005).

Wils, Andrew, et al., "Device discovery via residential gateways.", IEEE Transactions on Consumer Electronics, vol. 48, No. 3; Aug. 2002; pp. 478-483.

Yum, Secured Remote Data, Manual Page. 2012; Retrieved from yum.baseurl.org/wiki/securedRemoteData on Apr. 18, 2019. (Dated Reference from Archive.org attached) (Year: 2012) pp. 1-2.

Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

Zhang, Chun, et al., "On supporting containment queries in relational database management systems.", ACM SIGMOD Record. vol. 30. No. 2. ACM, 2001; pp. 425-436.

(56) References Cited

OTHER PUBLICATIONS

Milanovic, J.V., Aung, M.T. and Gupta, C.P., 2005. The influence of fault distribution on stochastic prediction of voltage sags. IEEE Transactions on Power Delivery, 20(1), pp. 278-285. (Year:2005).
Xia et al. 2018 IEEE Access, "Secure Session Key Management Scheme for Meter-Reading System Based on LoRa Technology", pp. 75015-75024 (Year: 2018).

* cited by examiner

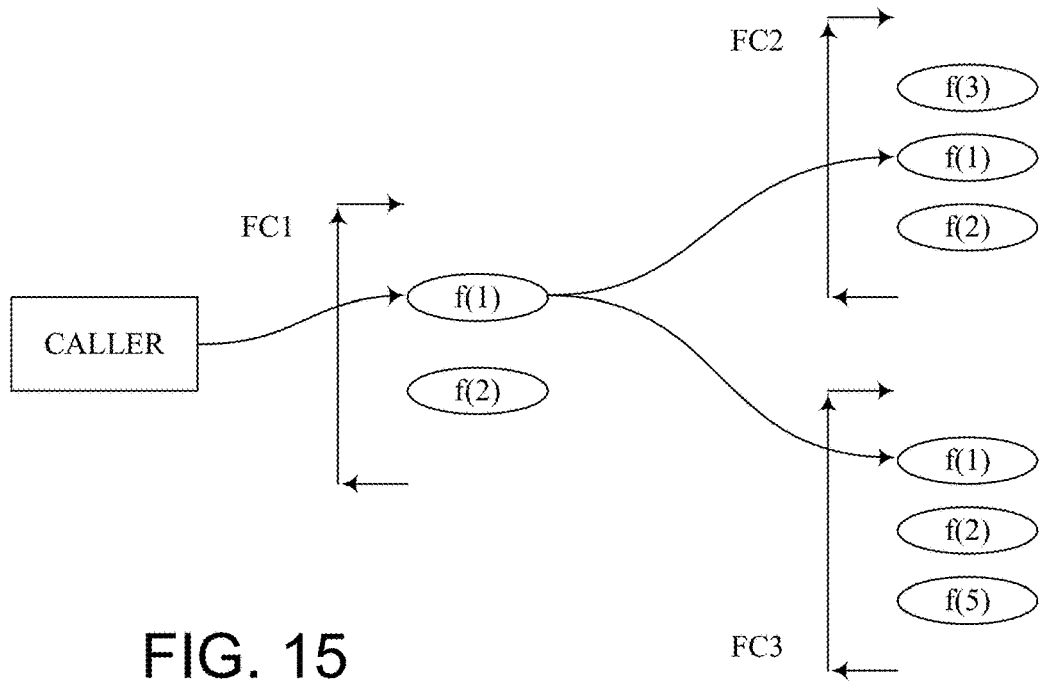
FIG. 15
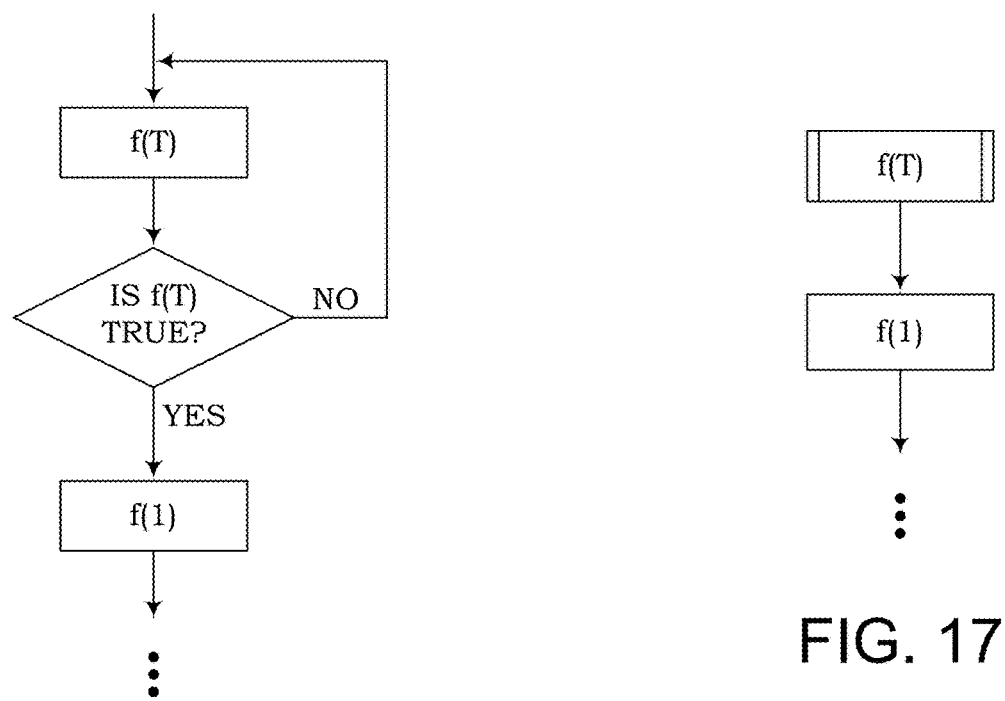
FIG. 16
FIG. 17

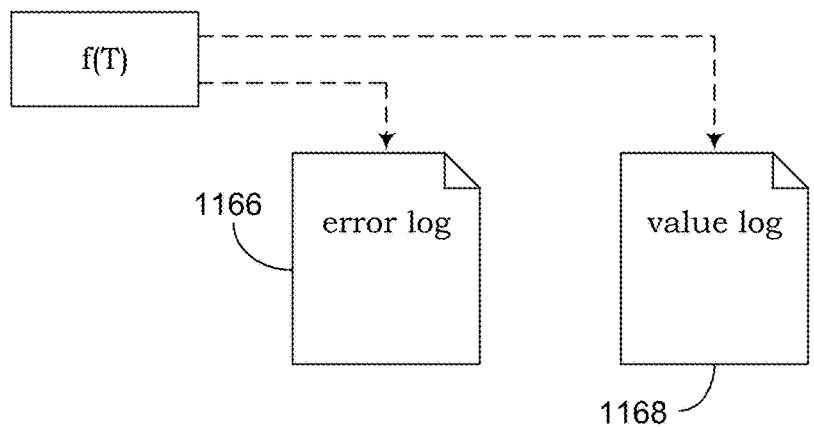
FIG. 33A
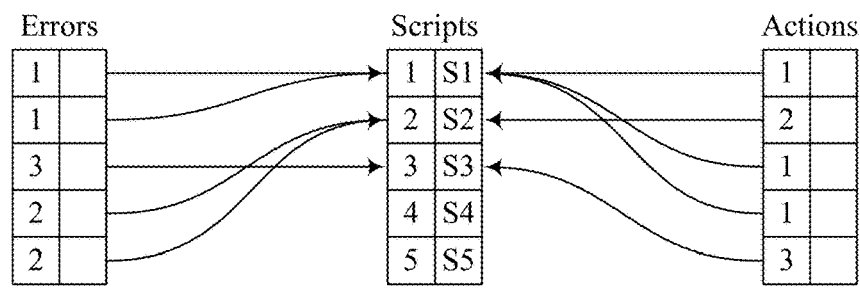
FIG. 33B
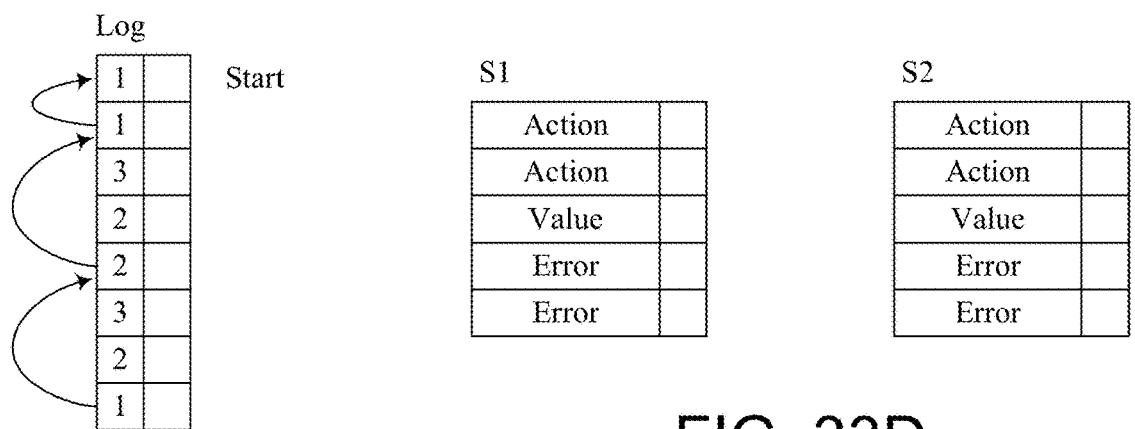
FIG. 33C
FIG. 33D

1190

ACTIONS TO BE TAKEN
- ○ Retrieve meter log data
- ○ Create a group of meters
- ○ Check for firmware updates
- ○ Monitor for reset condition
- ○ Enable/Disable actions
- ○ Modify an action

WHICH METERS?
- ○ Pre-assigned meter or group
- ○ Select from map
- ○ Modify a group
- ○ Group A (downtown)
- ○ Group B (South Bend)
- ○ Location 1 (123 Main St.)

WHEN?
- ○ Now
- ○ Daily
- ○ Weekly
- ○ Monthly
- ○ in response to condition

CONDITIONS
- ○ No conditions
- ○ when threshold is exceeded
- ○ when error(s) occur
- ○ when a meter resets
- ○ when last reset time changes

WHAT TO DO WITH OUTPUTS
- ○ Write to log file
- ○ Receive email
- ○ Display on computer screen
- ○ No output ( CONTINUE )

FIG. 36

SYSTEMS AND METHODS FOR PROCESSING METER INFORMATION IN A NETWORK OF INTELLIGENT ELECTRONIC DEVICES

PRIORITY

This application is a continuation application of U.S. patent application Ser. No. 13/836,671, filed on Mar. 15, 2013, which is a continuation-in-part application of U.S. patent application Ser. No. 13/644,877 filed on Oct. 4, 2012, entitled "INTELLIGENT ELECTRONIC DEVICE COMMUNICATION SOLUTIONS FOR NETWORK TOPOLOGIES", which claims priority to expired U.S. Provisional Patent Application No. 61/542,935, filed Oct. 4, 2011, the contents of both of which are hereby incorporated by reference in their entireties.

This application is related to U.S. patent application Ser. No. 13/799,832, filed Mar. 13, 2013, entitled "SYSTEMS AND METHODS FOR COLLECTING, ANALYZING, BILLING, AND REPORTING DATA FROM INTELLIGENT ELECTRONIC DEVICES" and to U.S. patent application Ser. No. 13/831,708, filed Mar. 15, 2013, entitled "SYSTEMS AND METHODS FOR COLLECTING, ANALYZING, BILLING, AND REPORTING DATA FROM INTELLIGENT ELECTRONIC DEVICES", now U.S. Pat. No. 10,275,849, the contents of both of which are hereby incorporated by reference in their entireties.

BACKGROUND

Field

The present disclosure relates generally to intelligent electronic devices (IEDs) and, in particular, to a system and method for sending/receiving data to/from intelligent electronic devices (IEDs) at high speeds over a network. Additionally, the present disclosure relates to an enterprise-wide energy management reporting, analysis, and billing system.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

Conventional IEDs include the ability to communicate with remote computing systems. Traditionally, IEDs would transfer data using serial based download commands. These commands would be accessed via an RS232, and RS485 or an Ethernet port encapsulating the serial request with an Ethernet message using any Ethernet protocol such as HTTP or TCP/IP. For instance, host software or a "master" would make a request for a set of data from one or more memory registers in an IED slave. At that point, the IED slave would then communicate the data stored in the memory registers back to the host software utilizing a serial transfer. This technology is inherently limited because host software traditionally is limited by the amount of memory registers that it would be able to accept at any one time. For example, if the serial based protocol is Modbus, a recognized industry standard protocol, most software master systems are limited by the protocol definition to 256 bytes of data that can be transferred at any one time. Thus, to pull large amount of data, many such requests would have to be sent to the IED or meter repeatedly. This would create many delays due to processing and data traffic.

SUMMARY

In accordance with embodiments of the present disclosure, there are provided herein methods and systems for handling various types of meter information related to intelligent electronic devices (IEDs). Different external devices, such as servers, PC clients, etc., may access this meter information via a network interface.

According to one embodiment, a system for managing scripts (e.g., software scripts) is provided, the system comprising one or more meters, each of the one or more meters configured to measure parameters of a commodity consumed at a customer location. The system also comprises a server in communication with the one or more meters by way of a communication network. The server may be configured to receive the measured parameters from the one or more meters and store the parameters as log data. The system further includes a plurality of client devices in communication with the server by way of the communication network and a base device in communication with the plurality of client devices by way of the communication network. The base device may be configured to store one or more functional chains, each of the one or more functional chains comprising software code defining a plurality of functional actions to be performed in a specific sequence. The base device comprises an interface that allows the plurality of client devices to reference the functional chain. At least one of the plurality of client devices is a calling device that references the functional chain from the base device and executes the functional chain.

The present disclosure further defines systems for providing meter information. One embodiment includes a system that comprises a plurality of meters, wherein each of the plurality of meters configured to measure parameters of a commodity consumed at a customer location. The system also comprises a server in communication with the plurality of meters by way of a network, wherein the server is configured to store the measured parameters from the meters. The system also includes a plurality of client devices in communication with the server by way of the network, wherein the plurality of client devices include one or more calling devices. The system further includes a storage device in communication with the plurality of client devices by way of the network, wherein the storage device is configured to store meter information related to the meters. The meter information includes at least connection information to be used to enable the one or more calling devices to access the meters. In addition, the one or more calling devices are configured to reference the storage device to inquire about one or more meters and receive meter information related to the one or more meters.

Also described in the present disclosure are systems and methods for managing meter connection parameters. In one embodiment, a system comprising a plurality of meters, a server, and a storage device. Each meter is configured to measure commodity data representing at least one commodity being consumed at a location. The server is in communication with the plurality of meters via a network and is configured to store the measured commodity data. The server is further configured to obtain meter connection parameters related to the meters. The storage device is in communication with the server via the network and is configured to receive the meter connection parameters from the server and store the meter connection parameters. The meter connection parameters enable a client device connected to the network to identify at least one meter and communicate with the at least one meter.

The present disclosure further describes embodiments of a system that comprises a plurality of meters, a server, one or more client devices, and a "launchpad" device. Each meter is configured to measure commodity data representing at least one commodity being consumed at a location. The server is in communication with the plurality of meters via a network and is configured to store the measured commodity data. The one or more client devices are in communication with the server via the network. The launchpad device is also in communication with the one or more client devices via the network. In particular, the launchpad device executes a consolidated application that is configured to combine the functionality of a plurality of meter processing applications stored on the one or more client devices.

In another embodiment, the IEDs, systems, network topologies and methods thereof may be employed to implement an enterprise-wide energy management reporting, analysis and billing system. The system and method of the present disclosure imports historical log energy usage data from meters, IEDs and other sources and generates detailed and useful energy reports for analyzing energy use, planning and load curtailment. In one embodiment, the system operates on a client/server architecture (although other architectures may be employed), where a server/settings editor imports data from various sources enabling at least one client to access the data and generate reports therefrom. The system and method enables multiple users to generate customized energy reports to study energy usage and demand enterprise-wide. For example, a user may be enabled to display Peak Energy Usage for the day, week, and month, or compare usage between meters, locations, and customers. The system's automated billing module allows a user to generate sub-metering bills based on customized rate structures for energy and other commodities such as water and gas.

BRIEF DESCRIPTION OF THE DRAWINGS

These and other objects, features and advantages of the present disclosure will be apparent from a consideration of the following Detailed Description considered in conjunction with the drawing Figures, in which:

FIG. 15 illustrates a functional chain with interchangeable components in accordance with an embodiment of the present disclosure.

FIGS. 16-18 illustrate triggers in accordance with an embodiment of the present disclosure.

FIGS. 33A-33D illustrate storing error information in a log in accordance with an embodiment of the present disclosure.

FIG. 36 illustrates a portion of a frontend user interface for enabling a user to create a functional chain.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") sense electrical parameters and compute data and can be any device including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
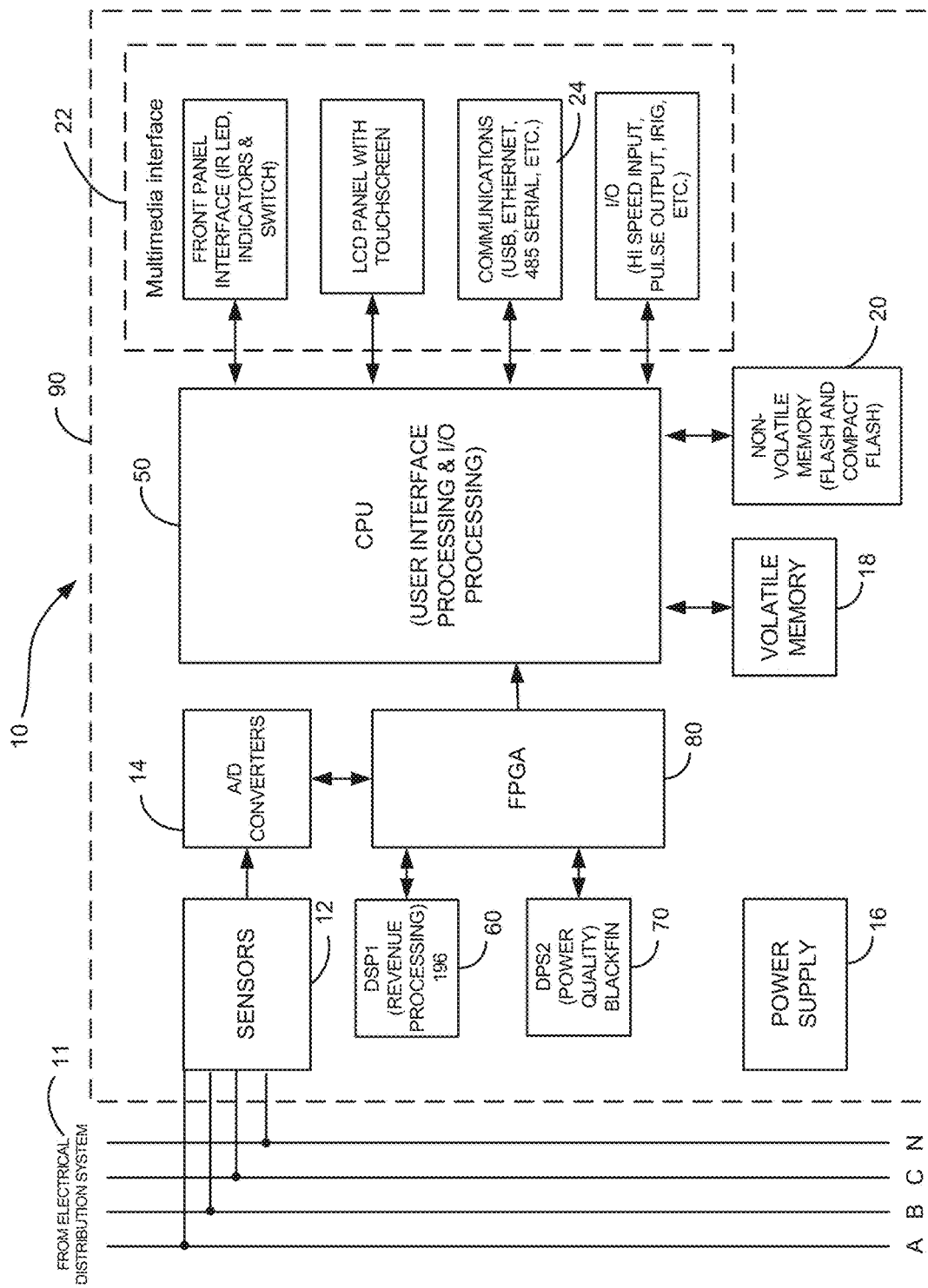
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A-2H.

The plurality of sensors 12 sense electrical parameters, e.g., voltage and current, on incoming lines, (i.e., phase A, phase B, phase C, neutral N), from an electrical power distribution system 11 e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14, are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines and having windings to provide a nominal voltage, e.g., 5VDC, +12VDC and −12VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 18 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
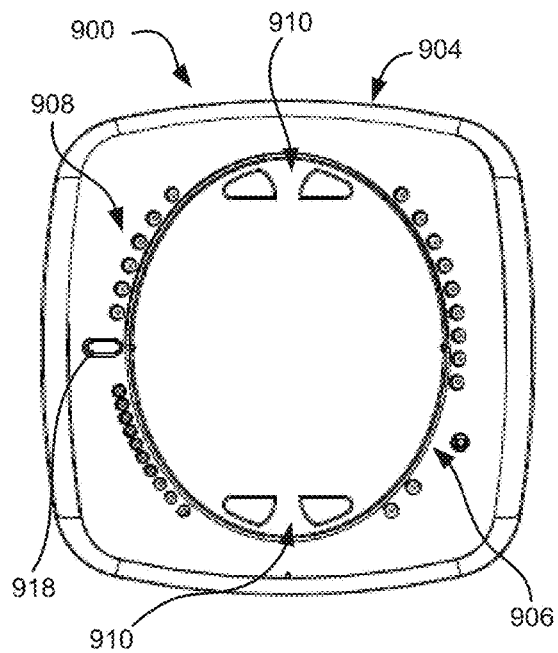
FIGS. 2A-2H illustrate exemplary form factors for an intelligent electronic device (IED) in accordance with an embodiment of the present disclosure.
Figure 2B:
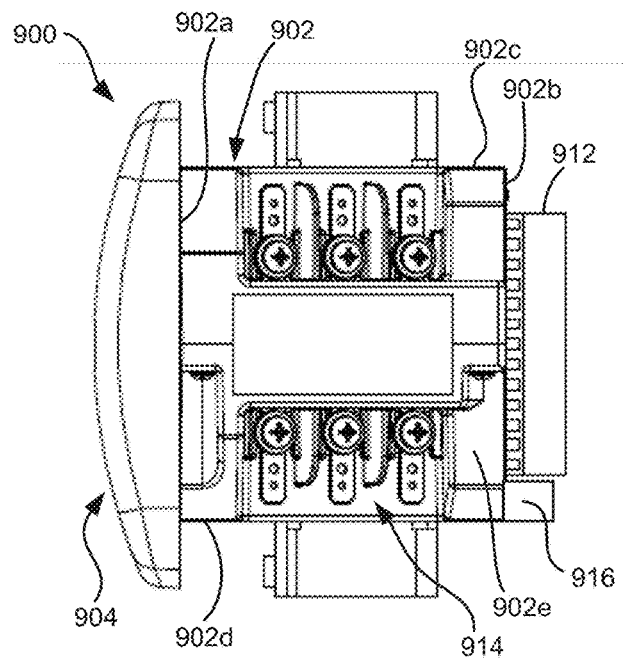

Furthermore, it is to be appreciated that the components and devices of the IED 10 of FIG. 1 may be disposed in various housings depending on the application or environment. For example, the IED 10 may be configured as a panel meter 900 as shown in FIGS. 2A and 2B. The panel meter 900 of FIGS. 2A and 2B is described in more detail in commonly owned U.S. Pat. No. 7,271,996, the contents of which are hereby incorporated by reference. As seen in FIGS. 2A and 2B, the IED 900 includes a housing 902 defining a front surface 902*a*, a rear surface 902*b*, a top surface 902*c*, a bottom surface 902*d*, a right side surface 902*e*, and a left side surface (not shown). Electrical device 900 includes a face plate 904 operatively connected to front surface 902*a* of housing 902. Face plate 904 includes displays 906, indicators 908 (e.g., LEDs and the like), buttons 910, and the like providing a user with an interface for visualization and operation of electrical device 100. For example, as seen in FIG. 2A, face plate 904 of electrical device 900 includes analog and/or digital displays 906 capable of producing alphanumeric characters. Face plate 904 includes a plurality of indicators 908 which, when illuminated, indicate to the user the "type of reading", the "% of load bar", the "parameter designation" which indicates the reading which is being displayed on displays 906, a "scale selector" (e.g., Kilo or Mega multiplier of Displayed Readings), etc. Face plate 904 includes a plurality of buttons 910 (e.g., a "menu" button, an "enter" button, a "down" button, a "right" button, etc.) for performing a plurality of functions, including but not limited to: viewing of meter information; entering display modes; configuring parameters; performing re-sets; performing LED checks; changing settings; viewing parameter values; scrolling parameter values; and viewing limit states. The housing 902 includes voltage connections or inputs 912 provided on rear surface 902*b* thereof, and current inputs 914 provided along right side surface 902*e* thereof. The IED 900 may include a first interface or communication port 916 for connection to a master and/or slave device. Desirably, first communication port 916 is situated in rear surface 902*b* of housing 902. IED 900 may also include a second interface or communication port 918 situated on face plate 904.

Figure 2C:
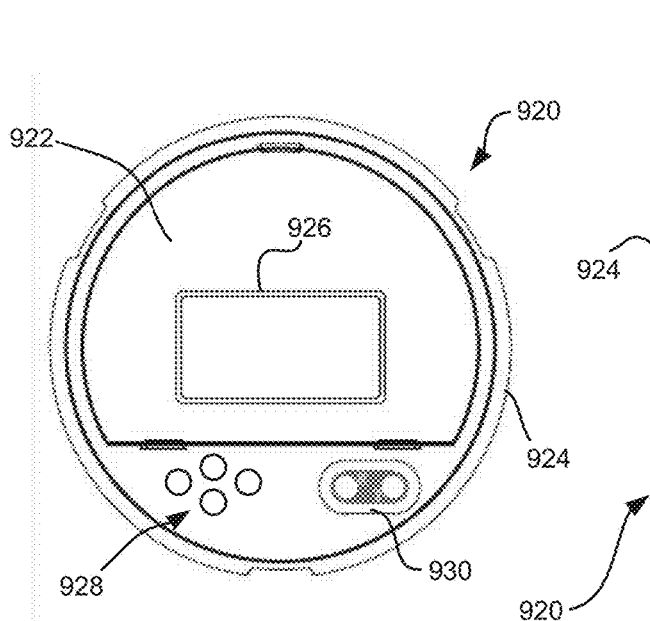
Figure 2D:
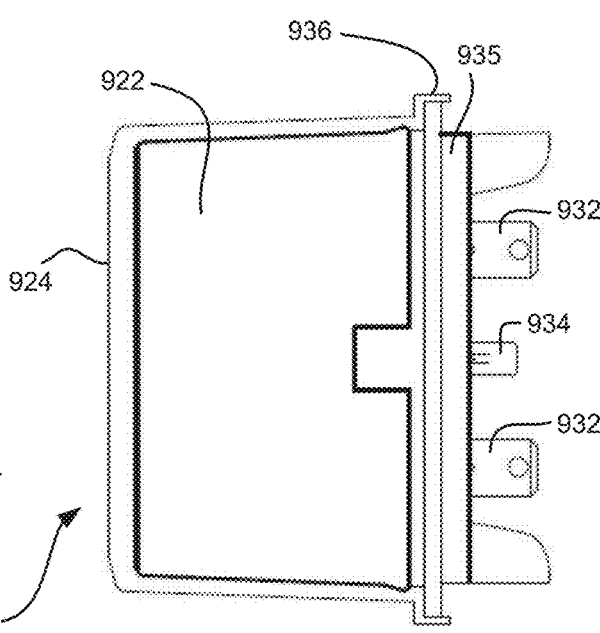

In other embodiment, the IED 10 may be configured as a socket meter 920, also known as a S-base type meter or type S meter, as shown in FIG. 2C an 2D. The socket meter 920 of FIGS. 2C and 2D is described in more detail in commonly owned application Ser. No. 12/578,062 (U.S. Publication No. 2010/0090680), the contents of which are hereby incorporated by reference. Referring to FIGS. 2C and 2D, the meter 920 includes a main housing 922 surrounded by a cover 924. The cover 924 is preferably made of a clear material to expose a display 926 disposed on the main body 922. An interface 928 to access the display and a communication port 930 is also provided and accessible through the cover 924. The meter 920 further includes a plurality of current terminals 932 and voltage terminals 934 disposed on backside of the meter extending through a base 935. The terminals 932, 934 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 936 is used as a seal between the meter 920 and/or cover 924 and the meter socket to prevent removal of the meter and to indicate tampering with the meter.

Figure 2E:
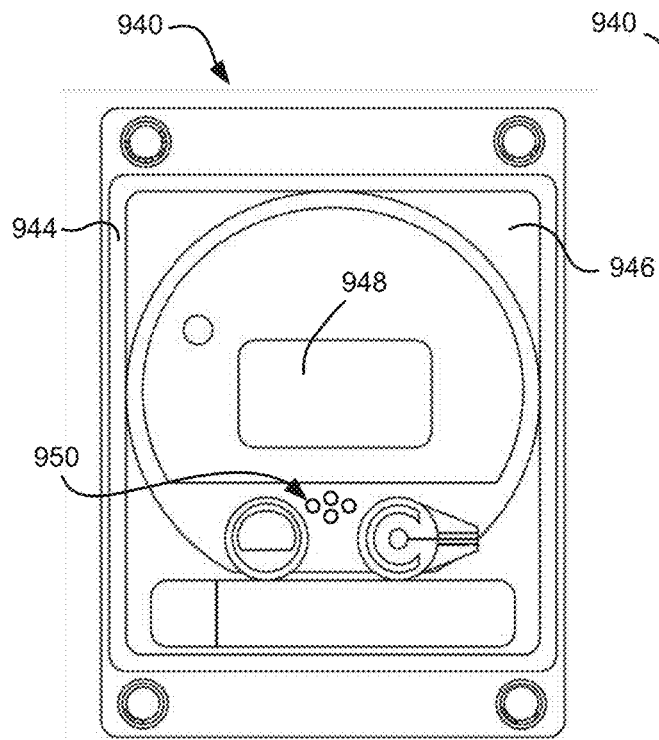
Figure 2F:
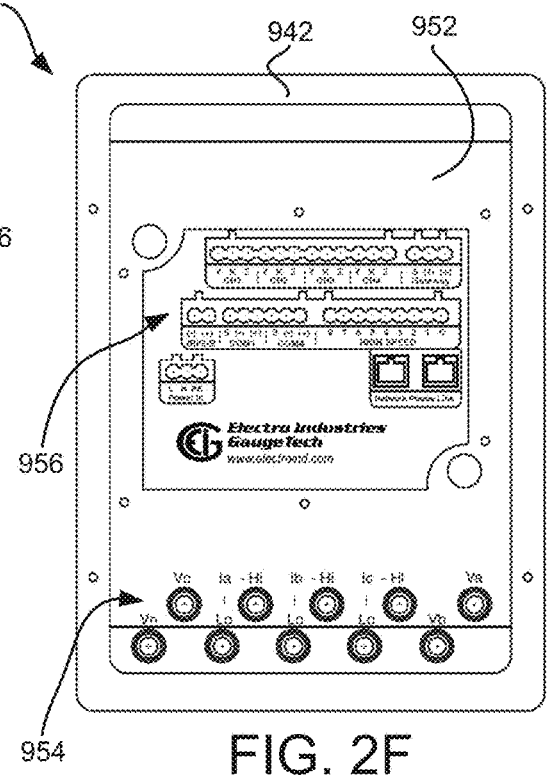

In a further embodiment, the IED 10 of FIG. 1 may be disposed in a switchboard or draw-out type housing 940 as shown in FIGS. 2E and 2F, where FIG. 2E is a front view and FIG. 2F is a rear view. The switchboard enclosure 942 usually features a cover 944 with a transparent face 946 to allow the meter display 948 to be read and the user interface 950 to be interacted with by the user. The cover 944 also has a sealing mechanism (not shown) to prevent unauthorized access to the meter. A rear surface 952 of the switchboard enclosure 942 provides connections for voltage and current inputs 954 and for various communication interfaces 956. Although not shown, the meter disposed in the switchboard enclosure 942 may be mounted on a draw-out chassis which is removable from the switchboard enclosure 942. The draw-out chassis interconnects the meter electronics with the electrical circuit. The draw-out chassis contains electrical connections which mate with matching connectors 954, 956 disposed on the rear surface 952 of the enclosure 942 when the chassis is slid into place.

Figure 2G:
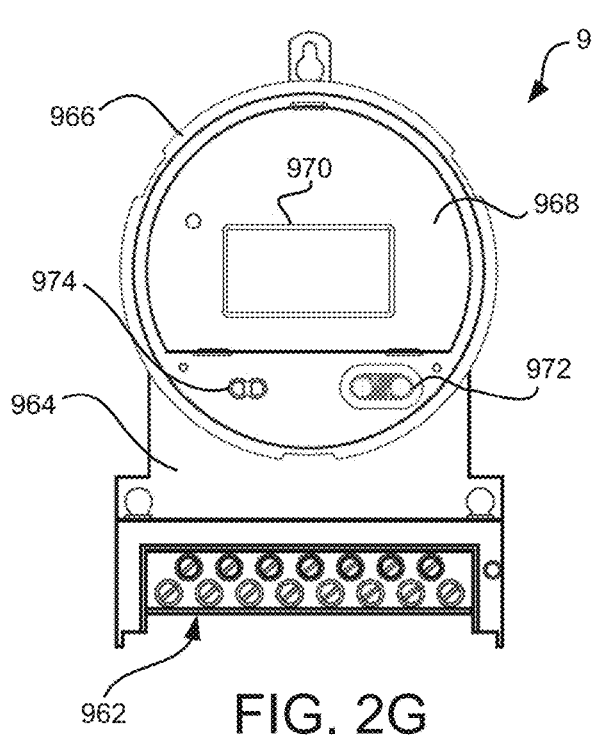
Figure 2H:
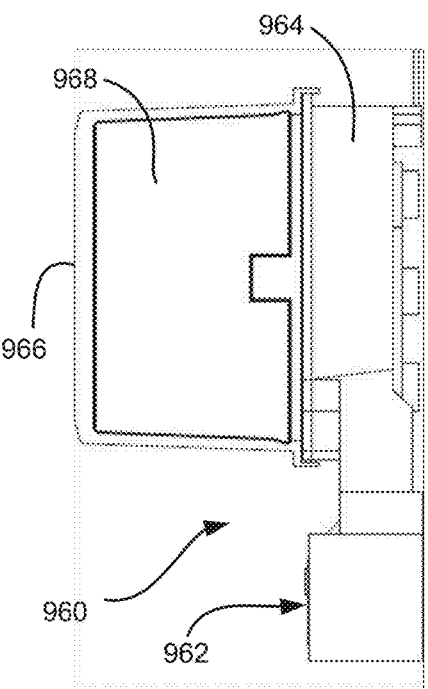

In yet another embodiment, the IED 10 of FIG. 1 may be disposed in an A-base or type A housing as shown in FIGS. 2G and 2H. A-base meters 960 feature bottom connected terminals 962 on the bottom side of the meter housing 964. These terminals 962 are typically screw terminals for receiving the conductors of the electric circuit (not shown). A-base meters 960 further include a meter cover 966, meter body 968, a display 970 and input/output means 972. Further, the meter cover 966 includes an input/output interface 974. The cover 966 encloses the meter electronics 968 and the display 970. The cover 966 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
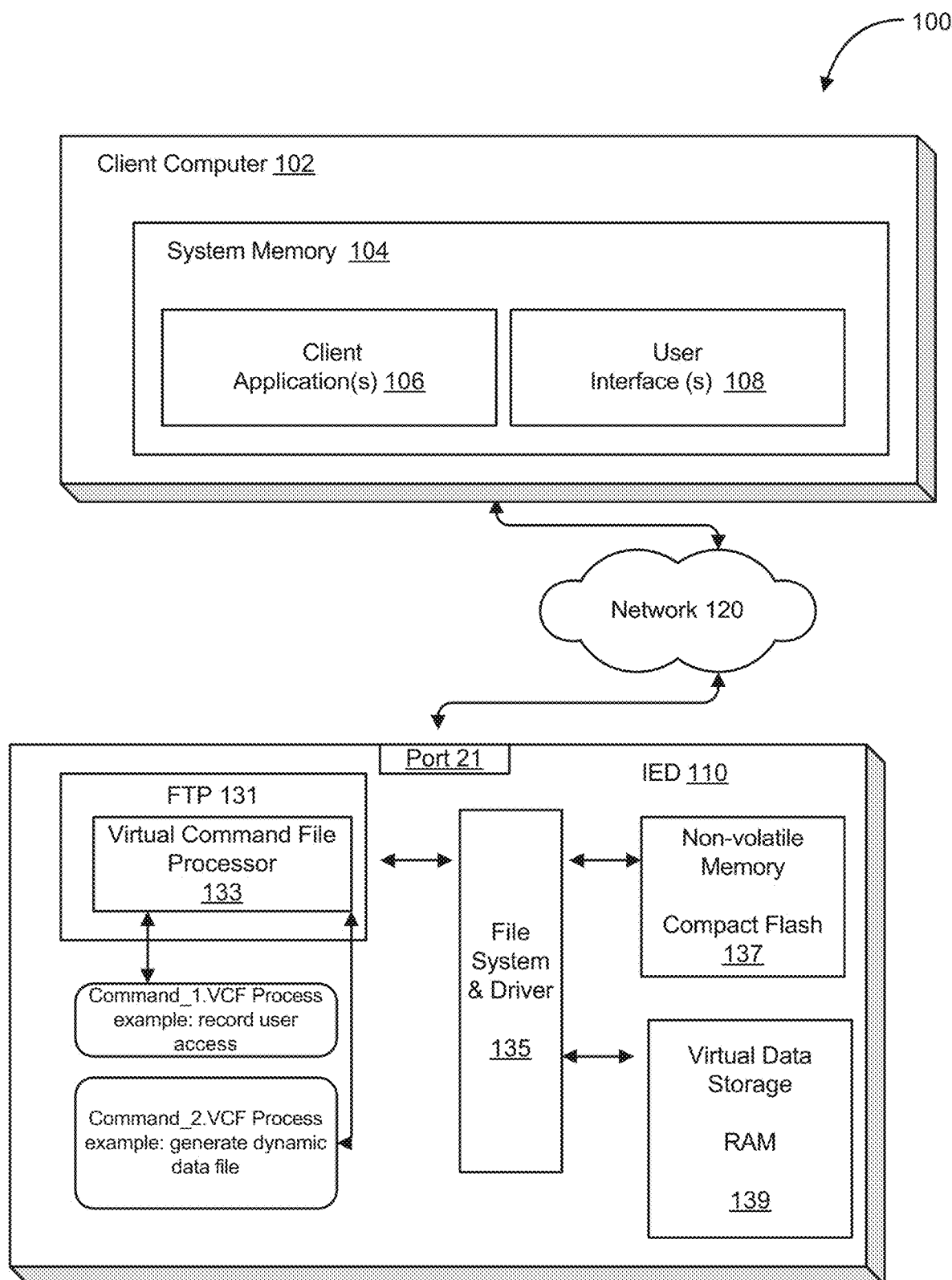
FIG. 3 illustrates an environment in which the present disclosure may be utilized.

FIG. 3 illustrates an exemplary environment 100 in which the present disclosure may be practiced. The network 120 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite; however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 110 may communicate using the network 120 as will be hereinafter discussed.

It is to be appreciated that there are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (which does not include multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX—that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system is a standard PC that is running an OS such as Windows. Current operating systems contain client software that enables the client computers to access the resources that servers share. Older operating systems, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in both client/server networks and peer-to-peer networks. Only the logical organization, management, and control of the networks vary.

The PC client 102 may comprise any computing device, such as a server, mainframe, workstation, personal computer, hand held computer, laptop telephony device, network appliance, other IED, Programmable Logic Controller, Power Meter, Protective Relay etc. The PC client 102 includes system memory 104, which may be implemented in volatile and/or non-volatile devices. One or more client applications 106, which may execute in the system memory 104, are provided. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". Additionally, user interfaces 108 may be included for displaying system configuration, retrieved data and diagnostics associated with the IED 110.

The intelligent electronic device (IED) 110, in one embodiment, is comprised of at least an FTP Server 131 including a Virtual Command File Processor 133, a File System and Driver 135, a non-volatile memory 137 and a virtual data store 139. Of course, the IED 110 may contain other hardware/software for performing functions associated with the IED; however, many of these functions have been described above with respect to FIG. 1 and will therefore not be further discussed.

IED 110 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as a Modbus TCP handler, can run on IED 110 concurrently with the FTP Server 131. This also means that multiple FTP connections can be made with the only limitation being the system's available resources.

The FTP Server 131 provides access to the file system 135 of the IED 110 on the standard FTP port (port 21). When a connection is made, PC client 102 sends an FTP logon sequence, which includes a USER command and a PASS command. The PC client 102 then interacts with the IED 110, requesting information and writing files, ending in a logout.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, logs, settings, and configurations, more suitably stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (49152-65535), sends the FTP server the dynamic port number on which it is listening over the control stream and waits for a connection from the FTP server. When the FTP server initiates the data connection to the FTP client it binds the source port to port 20 on the FTP server.

To use active mode, the client sends a PORT command, with the IP and port as argument. The format for the IP and port is "h1,h2,h3,h4,p1,p2". Each field is a decimal representation of 8 bits of the host IP, followed by the chosen data port. For example, a client with an IP of 192.168.0.1, listening on port 49154 for the data connection will send the command "PORT 192,168,0,1,192,2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case the FTP client binds the source port of the connection to a dynamic port between 49152 and 65535.

To use passive mode, the client sends the PASV command to which the server would reply with something similar to "227 Entering Passive Mode (127,0,0,1,192,52)". The syntax of the IP address and port are the same as for the argument to the PORT command.

In extended passive mode, the FTP server operates exactly the same as passive mode, except that it only transmits the port number (not broken into high and low bytes) and the client is to assume that it connects to the same IP address that it was originally connected to.

The objectives of FTP are to promote sharing of files (computer programs and/or data), to encourage indirect or implicit use of remote computers, to shield a user from variations in file storage systems among different hosts and to transfer data reliably, and efficiently.

In one embodiment of the present disclosure, the IED 110 has the ability to provide an external PC client 102 with an improved data transfer rate when making data download requests of data stored within an IED. This is achieved by configuring the IED 110 to include an FTP server 131 including a Virtual Command File Processor 133. An improved data transfer rate from the IED 110 may be realized by the external PC client 102 issuing virtual commands to the IED 110. In response, the IED 110 processes the received virtual commands in the Virtual Command File processor 133 to construct FTP commands therefrom to be applied to a novel file system 135 of the IED 110, coupled to the FTP server 131, wherein the novel file system 135 is configured as a PC file structure amenable to receiving and responding to the constructed FTP commands. The Virtual command files and the novel file system 135 are discussed in greater detail in co-pending application Ser. No. 12/061, 979.

While FTP file transfer comprises one embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

Figure 4:
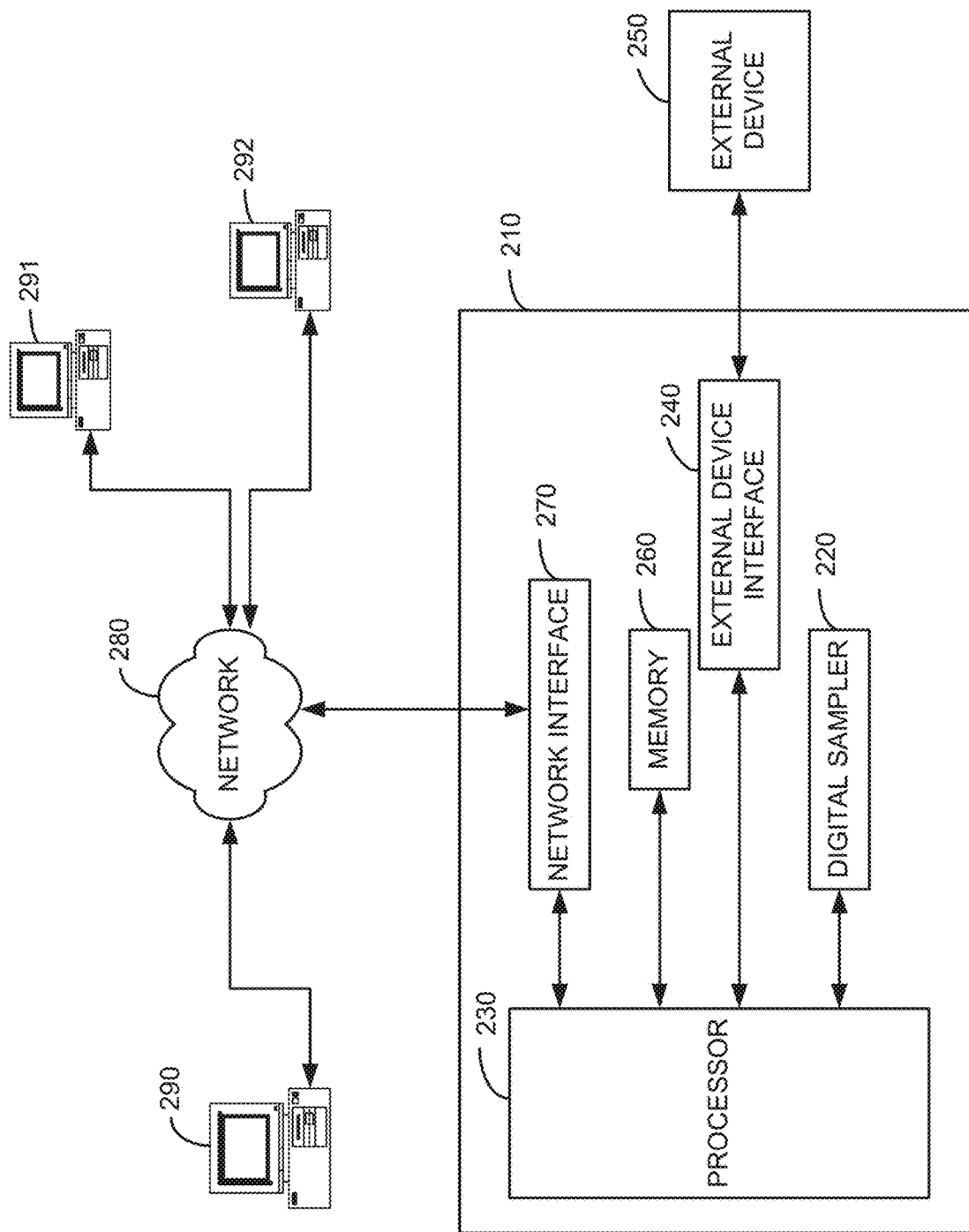
FIG. 4 is a block diagram of a web server power quality and revenue meter, according to an embodiment of the present disclosure.

With reference to U.S. Pat. No. 6,751,563, FIG. 4 is a block diagram of a web server power quality and revenue meter 210. The meter is connected to monitor electric distribution power lines (not shown), to monitor voltage and current at the point of connection. Included therein is digital sampler 220 for digitally sampling the voltage and current of the power being supplied to a customer or monitored at the point of the series connection in the power grid. Digital sampler 220 digitally samples the voltage and current and performs substantially similarly to the A/D converters 14 described above in relation to FIG. 1. The digital samples are then forwarded to processor 230 for processing. It is to be appreciated that the processor 230 may be a single processing unit or a processing assembly including at least one CPU 50, DSP1 60, DSP2 70 and FPGA 80, or any combination thereof. Also connected to processor 230 is external device interface 240 for providing an interface for external devices 250 to connect to meter 210. These external devices might include other power meters, sub-station control circuitry, on/off switches, etc. Processor 230 receives data packets from digital sampler 220 and external devices 250, and processes the data packets according to user defined or predefined requirements. A memory 260 is connected to processor 230 for storing data packets and program algorithms, and to assist in processing functions of processor 230. These processing functions include the power quality data and revenue calculations, as well as formatting data into different protocols which will be described later in detail. Processor 230 provides processed data to network 280 through network interface 270. Network 280 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter 210 simultaneously. In a like fashion, network interface 270 might be comprised of a modem, cable connection, or other devices that provide formatting functions. Computers 290-292 are shown connected to network 280.

A web server program (web server) is contained in memory 260, and accessed through network interface 270. The web server 210 provides real time data through any known web server interface format. For example, popular web server interface formats consist of HTML and XML formats. The actual format of the programming language used is not essential to the present disclosure, in that any web server format can be incorporated herein. The web server provides a user friendly interface for the user to interact with the meter 210. The user can have various access levels to enter limits for e-mail alarms. Additionally, the user can be provided the data in multiple formats including raw data, bar graph, charts, etc. The currently used HTML or XML programming languages provide for easy programming and user friendly user interfaces.

The processor 230 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data may then be available to users at computers 290-292 through network 280, which connects to meter 210 at the network interface 270. In one embodiment, network interface 270 is an Ethernet interface that supports, for example, 100 base-T or 10 base-T communications. This type of network interface can send and receive data packets between WAN connections and/or LAN connections and the meter 210. This type of network interface allows for situations, for example, where the web server 210 may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 5:
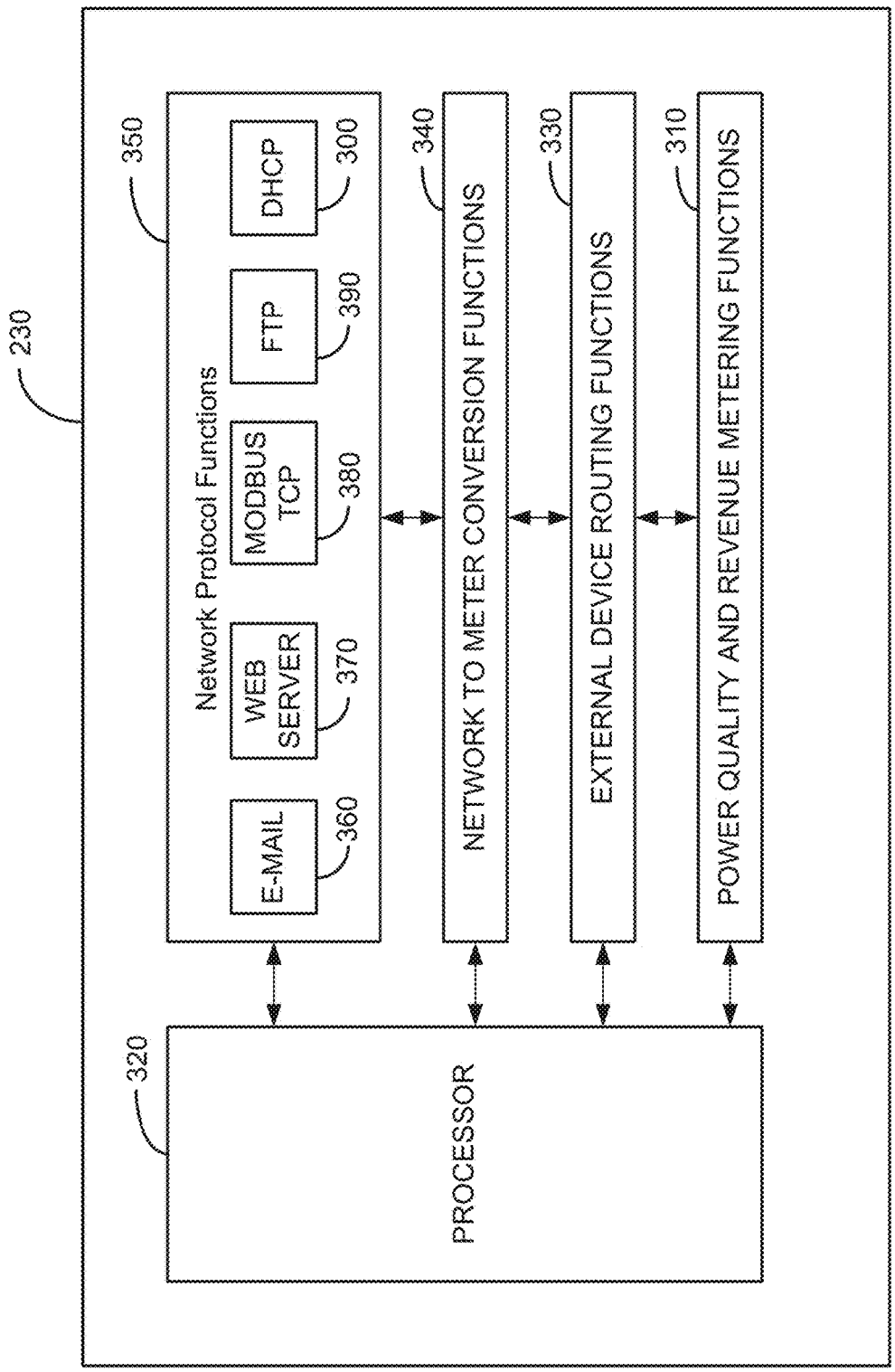
FIG. 5 is a functional block diagram of the processor of the web server power quality and revenue meter system shown in FIG. 4, according to the embodiment of the present invention.

FIG. 5 is a functional block diagram of processor 230 of the web server power quality and revenue meter system according to some embodiments of the present invention. Processor 230 is shown containing four main processing functions. The functions shown are illustrative and not meant to be inclusive of all possible functions performed by processor 230. Power Quality and Revenue Metering functions (metering functions) 310 consist of a complete set of functions which are needed for power quality and revenue metering. Packet data collected by digital sampler 220 is transmitted to processor 230. Processor 230 calculates, for example, power reactive power, apparent power, and power factor. The metering function 310 responds to commands via the network or other interfaces supported by the meter. External Device Routing Functions 330 handle the interfacing between the external device 250 and meter 210. Raw data from external device 250 is fed into meter 210. The external device 250 is assigned a particular address. If more than one external device is connected to meter 210, each device will be assigned a unique particular address. The Network Protocol Functions 350 of meter 210 are executed by processor 230 which executes multiple networking tasks that are running concurrently. As shown in FIG. 5, these include, but are not limited to, the following network tasks included in network protocol functions 350: e-mail 360, web server 370, Modbus TCP 380, FTP 390, and DHCP 300. The e-mail 360 network protocol function can be utilized to send e-mail messages via the network 280 to a user to, for example, notify the user of an emergency situation or if the power consumption reaches a user-set or pre-set high level threshold. As the processor receives packets of data it identifies the network processing necessary for the packet by the port number associated with the packet. The processor 230 allocates the packet to a task as a function of the port number. Since each task is running independently, the meter 210 can accept different types of requests concurrently and process them transparently from each other. For example, the web server may be accessed by one user while another user is communicating via Modbus TCP and at the same time a third user may download a log file via FTP. The Network to Meter Protocol Conversion Functions 340 are used to format and protocol convert the different network protocol messages to a common format understood by the other functional sections of meter 210. After the basic network processing of the packet of data, any "commands" or data which are to be passed to other functional sections of meter 210 are formatted and protocol converted to a common format for processing by the Network to Meter Protocol Conversion Functions 340. Similarly, commands or data coming from the meter for transfer over the network are pre-processed by this function into the proper format before being sent to the appropriate network task for transmission over the network. In addition, this function first protocol converts and then routes data and commands between the meter and external devices.

Although the above described embodiments enable users outside of the network the IED or meter is residing on to access the internal memory or server of the IED or meter, IT departments commonly block this access through a firewall to avoid access by dangerous threats into corporate networks. A firewall is a system designed to prevent unauthorized access to or from a private network, e.g., an internal network of a building, a corporate network, etc. Firewalls can be implemented in both hardware and software, or a combination of both. Firewalls are frequently used to prevent unauthorized Internet users from accessing private networks connected to the Internet, especially intranets. All messages entering or leaving the intranet pass through the firewall, which examines each message and blocks those that do not meet the specified security criteria. A firewall may employ one or more of the following techniques to control the flow of traffic in and of the network it is protecting: 1) packet filtering: looks at each packet entering or leaving the network and accepts or rejects it based on user-defined rules; 2) Application gateway: applies security mechanisms to specific applications, such as FTP and Telnet servers; 3) Circuit-level gateway: applies security mechanisms when a TCP or UDP connection is established; once the connection has been made, packets can flow between the hosts without further checking; 4) Proxy server: intercepts all messages entering and leaving the network, effectively hides the true network addresses; and 5) Stateful inspection: does not examine the contents of each packet but instead compares certain key parts of the packet to a database of trusted information; if the comparison yields a reasonable match, the information is allowed through; otherwise it is discarded. Other techniques and to be developed techniques are contemplated to be within the scope of the present disclosure.

In one embodiment, the present disclosure provides for overcoming the problem of not being allowed firewall access to an IED or meter installed within a facility, i.e., the meter is residing on a private network, by enabling an IED to initiate one way communication through the firewall. In this embodiment, the IED or meter posts the monitored and generated data on an Internet site external to the corporate or private network, i.e., on the other side of a firewall. The benefit is that any user would be able to view the data on any computer or web enabled smart device without having to pierce or bypass the firewall. Additionally, there is a business opportunity to host this data on a web server and charge a user a monthly fee for hosting the data. The features of this embodiment can be incorporated into any telemetry application including vending, energy metering, telephone systems, medical devices and any application that requires remotely collecting data and posting it on to a public Internet web site.

Figure 6:
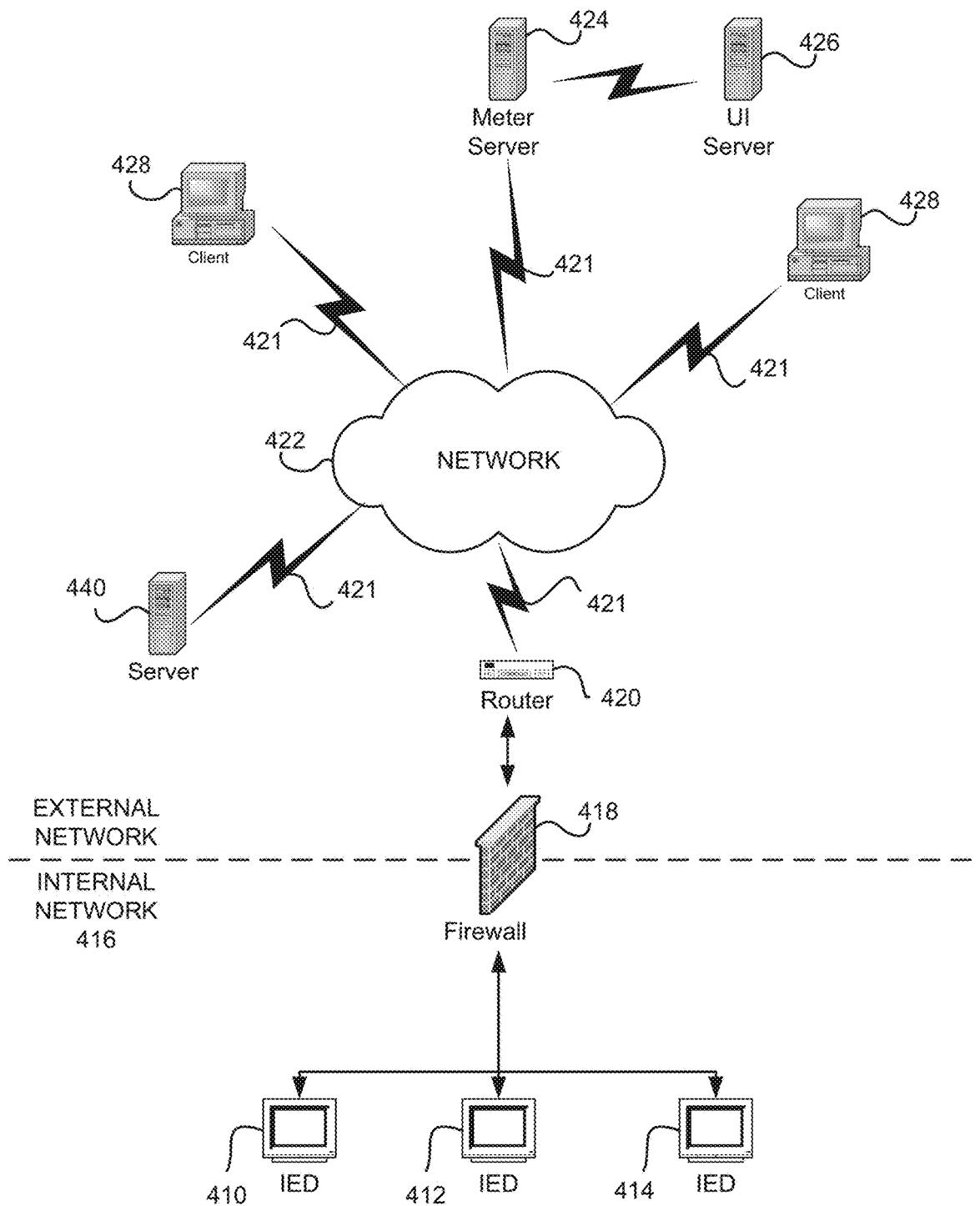
FIG. 6 illustrates another environment in which the present disclosure may be utilized.

In one embodiment, the IED or metering device will communicate through the firewall using a protocol such as HTTP via a port that is open through the firewall. Referring to FIG. 6, IEDs or meters 410, 412 414 reside on an internal network 416, e.g., an intranet, private network, corporate network, etc. The internal network 416 is coupled to an external network 422, e.g., the Internet, via a router 420 or similar device over any known hardwire or wireless connection 421. A firewall 418 is disposed between the internal network 416 and external network 422 to prevent unauthorized access from outside the internal network 416 to the IEDs or meters 410, 412, 414. Although the firewall 418 is shown between the internal network 416 and the router 420 it is to be appreciated that other configurations are possible, for example, the firewall 418 being disposed between the router 420 and external network 422. In other embodiments, the firewall 418 and router 420 may be configured as a single device. It is further to be appreciated that firewall 418 can be implemented in both hardware and software, or a combination of both.

The communication device or network interface of the meter (as described above in relation to FIG. 1) will communicate through the firewall 418 and read a web site server 424. It is to be appreciated that the one way communication from the IED through the firewall may be enabled by various techniques, for example, by enabling outbound traffic to the IP address or domain name of the server 424 or by using a protocol that has been configured, via the firewall settings, to pass through the firewall such as HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol), Telnet, etc. Alternatively, the IED may have exclusive access to a particular port on the firewall, which is unknown to other users on either the internal or external network. Other methods or techniques are contemplated, for example, e-mail, HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

The server 424 will provide instructions in computer and/or human readable format to the IED or meter. For instance, the web server 424 might have XML tags that state in computer readable format to provide data for the last hour on energy consumption by 15 minute intervals. The meter 410, 412, 414 will then read those instructions on that web server 424 and then post that data up on the server 424. In this manner, the IED or meter initiates communication in one direction, e.g., an outbound direction, to the server 424.

Another server (or possibly the same server) will read the data that the meter 410, 412, 414 posts and will format the meter data into data that can be viewed for humans on a web site or a software application, i.e., UI Server 426. Servers 424, 426 can also store the data in a database or perform or execute various control commands on the data. Clients 428 may access the IED data stored or posted on servers 424, 426 via a connection to the network 422.

Since the meters are only communicating in an outbound direction only, the meters 410, 412, 414 can read data or instructions from an external network application (e.g., server 424), but the external network application cannot request information directly from the meter. The server 424 posts the data or instructions on the web site and waits for the meter to check the site to see if there has been a new post, i.e., new instructions for the meter. The meter can be programmed at the user's discretion as to frequency for which the meter 410, 412, 414 exits out to the external network to view the postings.

The meter instruction server 424 will post instructions in a directory programmed/located on the server or into XML or in any fashion that the meter is configured to understand and then the meter will post whatever data it is instructed to do. The meter can also be configured to accomplish control commands. In addition to the meter instruction server 424, a user interface (UI) server 426 is provided that can be used to enable a user interface to the user. The user can provide input on the UI server 426 that might trigger the meter instruction server 424 to produce a message to control the energy next time the meter reads that server.

Figure 7:
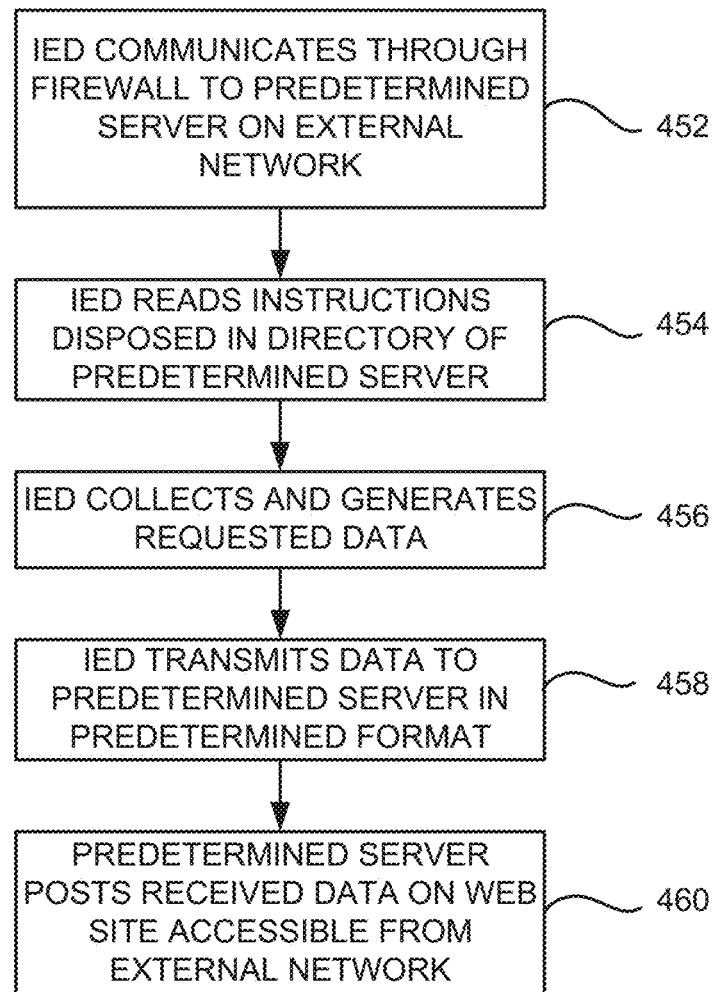
FIG. 7 is a flow chart illustrating a method for communicating data from an IED on an internal network to a server on an external network through a firewall.

Referring to FIG. 7, a method for communicating data from an IED on an internal network to a server on an external network through a firewall is illustrated. In step 452, the IED 410 communicates through the firewall 418 to a predetermined server 424 on an external network 422. The IED 410 may be programmed to periodically communicate to the server at predefined intervals. During this communication session, the IED 410 reads instructions disposed in a directory or folder on the predetermined server 424, step 454. Next, in step 456, the IED 410 collects data from its internal memory or generates data based on the read instructions. The IED 410 then transmits the data to the server 424 in a predetermined format, e.g., extensible markup language (XML), comma-separated value (CSV), etc., step 458. In step 460, the predetermined server 424 posts the received data on a web site accessible from the external network 422. The data may be posted on the server 424 or a UI (user interface) server 426 configured to provide data for end users, e.g., clients 428. It is to be appreciated that the UI server 426 may be configured to post data from several locations in one convenient interface for, for example, an organization managing the several locations. A provider of the servers 424, 426 may charge a fee to the end user for the hosting of the web site and providing the data in a convenient and accessible format.

Figure 8:
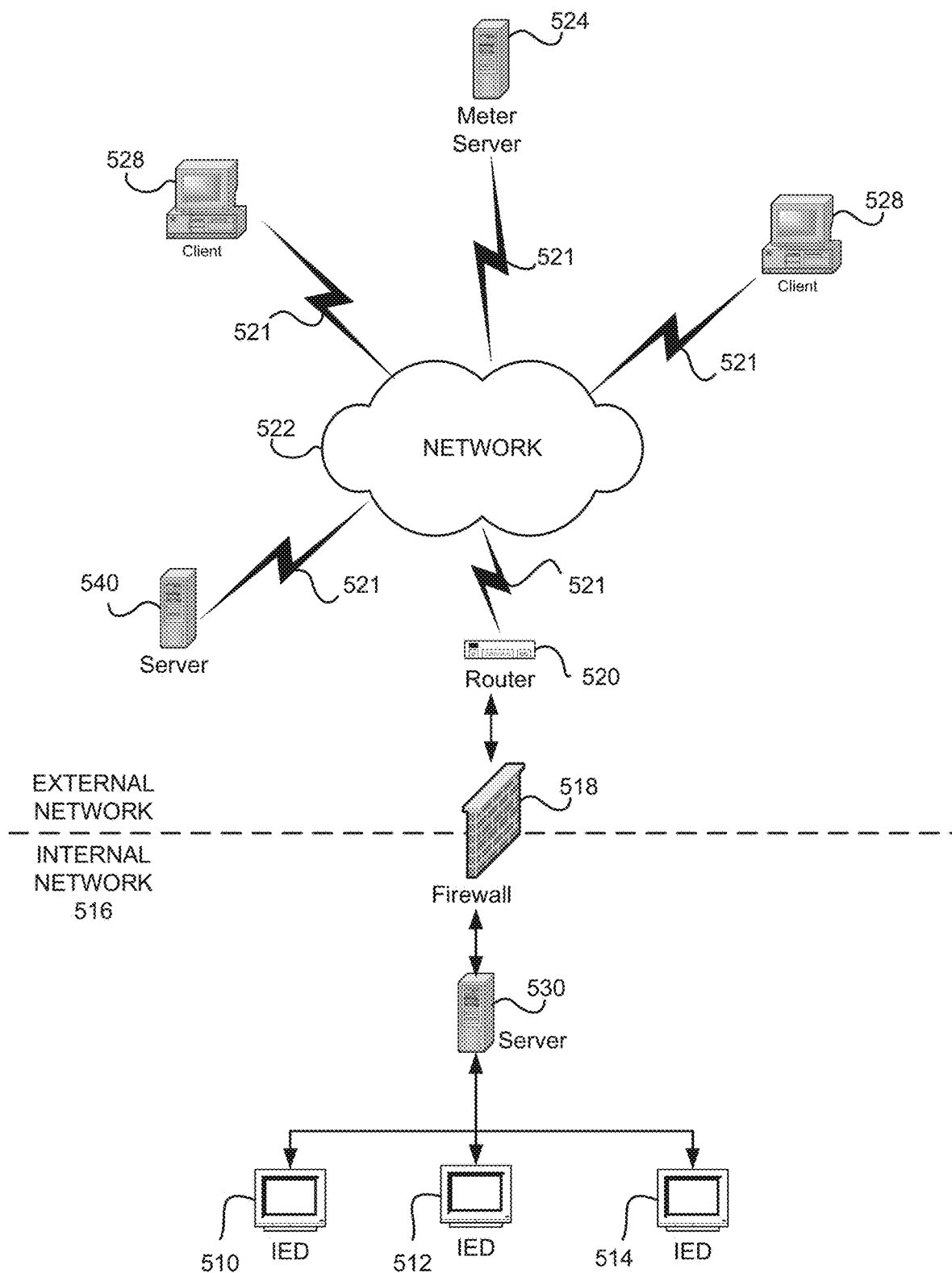
FIG. 8 illustrates yet another environment in which the present disclosure may be utilized.

In another embodiment, the IED or metering device will communicate through the firewall using a server 530 disposed on an internal network protected by a firewall. Referring to FIG. 8, IEDs or meters 510, 512, 514 reside on an internal network 516, e.g., an intranet, private network, corporate network, etc. The internal network 516 is coupled to an external network 522, e.g., the Internet, via a router 520 or similar device over any known hardwire or wireless connection 521. A firewall 518 is disposed between the internal network 516 and external network 522 to prevent unauthorized access from outside the internal network 516 to the IEDs or meters 510, 512, 514. Although the firewall 518 is shown between the internal network 516 and the router 520 it is to be appreciated that other configurations are possible, for example, the firewall 518 being disposed between the router 520 and external network 522. In other embodiments, the firewall 518 and router 520 may be configured as a single device. It is further to be appreciated that firewall 518 can be implemented in both hardware and software, or a combination of both.

In this embodiment, server 530 aggregates data from the various IEDs 510, 512, 514 coupled to the internal or private network 516. Since the server 530 and the IEDs 510, 512, 514 are all on the same side of the firewall 518, generally communications and data transfers among the server 530 and the IEDs 510, 512, 514 is unrestricted. Server 530 then communicates or transfers the data from the IEDs to server 524 on the external network on the other side of the firewall 518. The communication between servers 530 and 524 may be accomplished by any one of the communication means or protocols described in the present disclosure. The server 524 then posts the data from the IEDs 510, 512, 514 making the data accessible to clients 528 on external networks, as described above.

Figure 9:
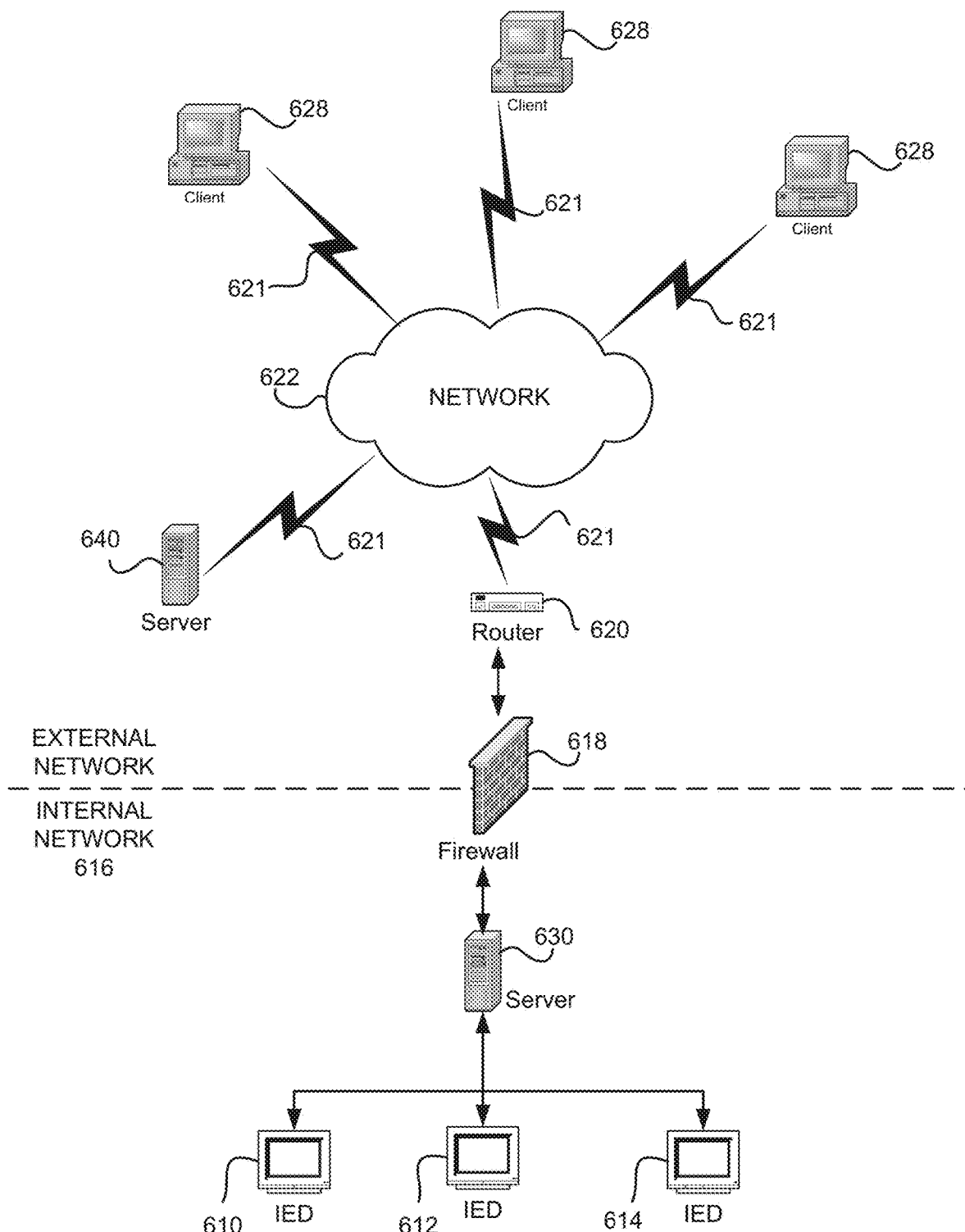
FIG. 9 illustrates a further environment in which the present disclosure may be utilized.

In a further embodiment, the IED or metering device will communicate through the firewall using a server 630 disposed on an internal network protected by a firewall. Referring to FIG. 9, IEDs or meters 610, 612, 614 reside on an internal network 616, e.g., an intranet, private network, corporate network, etc. The internal network 616 is coupled to an external network 622, e.g., the Internet, via a router 620 or similar device over any known hardwire or wireless connection 621. A firewall 618 is disposed between the internal network 616 and external network 622 to prevent unauthorized access from outside the internal network 616 to the IEDs or meters 610, 612, 614. Although the firewall 618 is shown between the internal network 616 and the router 620 it is to be appreciated that other configurations are possible, for example, the firewall 618 being disposed between the router 620 and external network 622. In other embodiments, the firewall 618 and router 620 may be configured as a single device. It is further to be appreciated that firewall 618 can be implemented in both hardware and software, or a combination of both.

In this embodiment, server 630 aggregates data from the various IEDs 610, 612, 614 coupled to the internal or private network 616. Since the server 630 and the IEDs 610, 612, 614 are all on the same side of the firewall 618, generally communications and data transfers among the server 630 and the IEDs 610, 612, 614 is unrestricted. Server 630 then communicates or transfers the data from the IEDs to clients 628 on the external network on the other side of the firewall 618. The communication between server 630 and clients 628 may be accomplished by any one of the communication means or protocols described in the present disclosure.

In another embodiment, each IED 610, 612, 614 may be configured to act as a server to perform the functionality described above obviating the need for server 630.

Furthermore in another embodiment, each IED 610, 612, 614 and each client device 628 may be configured as a server to create a peer-to-peer network, token ring or a combination of any such topology.

The systems and methods of the present disclosure may utilize one or more protocols and/or communication techniques including, but not limited to, e-mail, File Transfer Protocol (FTP), HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

In one non-limiting embodiment, each IED sends data to a recipient via electronic mail, also known as email or e-mail. An Internet email message consists of three components, the message envelope, the message header, and the message body. The message header contains control information, including, minimally, an originator's email address and one or more recipient addresses. Usually descriptive information is also added, such as a subject header field and a message submission date/time stamp. Network-based email was initially exchanged on the ARPANET in extensions to the File Transfer Protocol (FTP), but is now carried by the Simple Mail Transfer Protocol (SMTP), first published as Internet standard 10 (RFC 821) in 1982. In the process of transporting email messages between systems, SMTP communicates delivery parameters using a message envelope separate from the message (header and body) itself. Messages are exchanged between hosts using the Simple Mail Transfer Protocol with software programs called mail transfer agents (MTAs); and delivered to a mail store by programs called mail delivery agents (MDAs, also sometimes called local delivery agents, LDAs). Users can retrieve their messages from servers using standard protocols such as POP or IMAP, or, as is more likely in a large corporate environment, with a proprietary protocol specific to Novell Groupwise, Lotus Notes or Microsoft Exchange Servers. Webmail interfaces allow users to access their mail with any standard web browser, from any computer, rather than relying on an email client. Programs used by users for retrieving, reading, and managing email are called mail user agents (MUAs). Mail can be stored on the client, on the server side, or in both places. Standard formats for mailboxes include Maildir and mbox. Several prominent email clients use their own proprietary format and require conversion software to transfer email between them. Server-side storage is often in a proprietary format but since access is through a standard protocol such as IMAP, moving email from one server to another can be done with any MUA supporting the protocol.

In one embodiment, the IED composes a message using a mail user agent (MUA). The IED enters the email address of a recipient and sends the message. The MUA formats the message in email format and uses the Submission Protocol (a profile of the Simple Mail Transfer Protocol (SMTP), see RFC 6409) to send the message to the local mail submission agent (MSA), for example, run by the IED's internet service provider (ISP). The MSA looks at the destination address provided in the SMTP protocol (not from the message header). An Internet email address is a string of the form "recipient@meter." The part before the "@" symbol is the local part of the address, often the username of the recipient, and the part after the "@" symbol is a domain name or a fully qualified domain name. The MSA resolves a domain name to determine the fully qualified domain name of the mail exchange server in the Domain Name System (DNS). The DNS server for the domain responds with any MX records listing the mail exchange servers for that domain, for example, a message transfer agent (MTA) server run by the recipient's ISP. The MSA sends the message to MTA using SMTP. This server may need to forward the message to other MTAs before the message reaches the final message delivery agent (MDA). The MDA delivers it to the mailbox of the recipient. The recipient retrieves the message using either the Post Office Protocol (POP3) or the Internet Message Access Protocol (IMAP4).

Other types of e-mail systems may also be employed, for example, web-based email, POP3 (Post Office Protocol 3) email services, IMAP (Internet Message Protocol) e-mail servers, and MAPI (Messaging Application Programming Interface) email servers to name a few.

In a further embodiment, File Transfer Protocol (FTP) may be employed. Techniques for transferring data from an IED to a device is described in commonly owned pending U.S. patent application Ser. No. 12/061,979, the contents of which are incorporated by reference.

In one embodiment, IEDs employ Universal Plug and Play (UPnP) protocol, which is a set of networking protocols that permits networked devices to discover each other's presence, and notify clients of services available on these devices. UPnP takes the form of UDP broadcast messages, which are sent across a local network, to notify other devices of available services, and http requests to query the details of those devices and services.

In one embodiment, UPnP is employed to allow the network addresses of devices, such as meters, to automatically be discovered by a client. This enables the client software to display a list of all devices which are available. In addition, this could also allow the client software to enable the user to connect to these devices, without having to configure the network address of that device. In addition, the UPnP notify may be used to indicate the health status of the device, including starting up, running, errors in configuration, and resetting.

In another embodiment, UPnP is employed to allow devices, such as meters, to notify the clients of what services they support, such as Modbus, dnp, web, ftp, log download, and data streaming. This could be extended by including information particular to that service or protocol, such as to allow the client to interface with that service with no user input. This could enable the client software to display the device such that the user can focus on the details of the device, rather then worrying about the minutiae of connection information.

In another embodiment, an automated server is configured to perform actions related to these automatically discovered services, such as retrieving real time information, downloading logs, or registering for notification of events. For example, as shown in FIG. 8, a server 530 could be on a network 516 to collect log information from meters 510, 512, 514, and whenever a meter broadcast that it provided log data, the server 530 could automatically collect that data from the meter. As another example, the server 530 could automatically poll and log the real-time readings of all meters on the network, automatically including them as they become available on the network. As described above, the server 530 may then post the data to server 524.

In one embodiment, HTTP tunneling is employed to send a message (including the IED's or meter's data) to a server, which listens for such messages, and parses out the IED's or meter's data. This could be performed by embedding the meter's data in a HTTP message, which could be sent to the server, for example, server 424 as shown in FIG. 6. The HTTP wrapper would allow this data to pass through firewalls which only allow web traffic. For example, in the architecture of FIG. 6, IED 410 may send a HTTP message containing measured or calculated data through firewall 418 to server 424 or server 430. In another example as shown in FIG. 8, server 530 may collect data from the various IEDs 510, 512, 514 and forward the collected data in a HTTP message through firewall 518 to server 524.

It is to be appreciated that HTTP tunneling applies to system architectures where a server is provided as the receiver of the IED or meter data, as the clients would be unable to process such information. Referring to FIG. 9, server 630 is the destination (and collects) the messages generated from the various IEDs 610, 612, 614, but device 628 is a client, and without server software, would be unable to receive the messages. However, by programming device 628 with server software, the client device 628 becomes a server and can receive the messages.

It is further to be appreciated that the HTTP message can be sent based on various triggers including, but not limited to, time-based trigger, event-based trigger, storage capacity based trigger, etc.

In another embodiment, the IEDs can communicate through to devices using a Simple Network Management Protocol (SNMP) trap. SNMP traps enable an agent, e.g., an agent running on an IED, to notify a management station, e.g., a server, of significant events by way of an unsolicited SNMP message. Upon occurrence of an event, an agent that sends an unsolicited or asynchronous trap to the network management system (NMS), also known as a manager. After the manager receives the event, the manager displays it and can choose to take an action based on the event. For instance, the manager can poll the agent or IED directly, or poll other associated device agents to get a better understanding of the event. For the management system to understand a trap sent to it by an agent, the management system must know what the object identifier (OID) of the trap or message defines. Therefore, the management system or server must have the Management Information Base (MIB) for that trap loaded. This provides the correct OID information so that the network management system can understand the traps sent to it. Additionally, a device does not send a trap to a network management system unless it is configured to do so. A device must know that it should send a trap. The trap destination is usually defined by an IP address, but can be a host name, if the device is set up to query a Domain Name System (DNS) server.

Common chat protocols, such as MSN, AIM, IRQ, IRC, and Skype, could be used to send a message, containing the meter's data, to a public chat server, e.g., server 440, 540, 640, which could then route that message to any desired client. Another possible implementation could be to have a special client that listens for these messages, parses the data contents, and presents them as another manner. In one embodiment, the messages are proprietary format Ethernet messages, typically sent over TCP. It is to be appreciated that the actual format depends on the specific chat protocol.

A public social server that supports a common web interface for posting information, such as Twitter™, Facebook™, BBS's, could be used to post a status, containing the meter's data, to a user on the public social server for that service, e.g., server 440, 540, 640. This post could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push). Some of these servers also provide a proprietary format Ethernet message, typically sent over TCP.

In one non-limiting example, a public social server such as the system employed by Facebook may be utilized to post the IEDs data so the data is accessible on the external network outside of the firewall. Facebook uses a variety of services, tools and programming languages to make up its infrastructure which may be employed in the systems and methods of the present disclosure to implement the technique described herein. In the front end, the servers run a LAMP (Linux, Apache, MySQL and PHP) stack with Memcache. Linux is a Unix-like operating system kernel. It is open source, highly customizable, and good for security. Facebook's server runs the Linux operating system Apache HTTP server. For the database, Facebook uses MySQL for its speed and reliability. MySQL is used primarily as a key store of value when the data are randomly distributed among a large number of cases logical. These logical instances extend across physical nodes and load balancing is done at physical node. Facebook uses PHP, since it is a good web programming language and is good for rapid iteration. PHP is a dynamically typed language/interpreter. Memcache is a caching system that is used to accelerate dynamic web sites with databases (like Facebook) by caching data and objects in RAM to reduce reading time. Memcache is the main form of caching on Facebook and helps relieve the burden of database. Having a caching system allows Facebook to be as fast as it is to remember information. Furthermore, Facebook backend services are written in a variety of different programming languages like C++, Java, Python, and Erlang. Additionally, it employs the following services: 1.) Thrift—a lightweight remote procedure call framework for scalable cross-language services development, which supports C++, PHP, Python, Perl, Java, Ruby, Erlang, and others; 2.) Escribano (server logs)—a server for aggregating log data streamed in real time on many other servers, it is a scalable framework useful for recording a wide range of data; 3.) Cassandra (database)—a database designed to handle large amounts of data spread out across many servers; 4.) HipHop for PHP—a transformer of source code for PHP script code and was created to save server resources, HipHop transforms PHP source code in C++ optimized, among others. It is to be appreciated that any of the above systems, devices and/or services may be implemented in the various architectures disclosed in the present disclosure to achieve the teaching and techniques described herein.

A public web site, e.g., hosting on server 440, 540, 640, which allows the posting of information, such as a Forum, could be used to post a message, containing the meter's data, to a group, thread, or other location. This post would take place by a HTTP POST to the web site's server, where by the server would store that information, and present it on the web site. This message could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as users updating it from their browser (HTTP push).

User Datagram Protocol (UDP) messages could be used to send a message from the IEDs or meters to a server, which listens for such messages, and parses out the meter's data. When employing UDP broadcasts, messages could be sent from the IEDs or meters to a server, e.g., servers 530, 630, since UDP broadcasts do not work across networks. The messages containing the IED's or meter's data can then be sent to external networks via any of the described (or to be developed) communication methods. Alternatively, a UDP unicast could support sending to any server, e.g., server 424, 524.

A Virtual Private Network (VPN) could be created such that each meter on the internal network is part of the same virtual private network as each of the clients. A Virtual Private Network (VPN) is a technology for using the Internet or another intermediate network to connect computers to isolated remote computer networks that would otherwise be inaccessible. A VPN provides security so that traffic sent through the VPN connection stays isolated from other computers on the intermediate network. VPNs can connect individual IEDs or meters to a remote network or connect multiple networks together. Through VPNs, users are able to access resources on remote networks, such as files, printers, databases, or internal websites. VPN remote users get the impression of being directly connected to the central network via a point-to-point link. Any of the other described (or to be developed) protocols could then be used to push data to another server or clients on the VPN.

Hosted data services, such as a hosted database, cloud data storage, Drop-Box, or web service hosting, could be used as an external server to store the meter's data. Hosted data services can be referred to as Hosting. Each of these Hosts, e.g., servers 440, 540, 640, could then be accessed by the clients to query the Hosted Data. Many of these hosted data services support HTTP Push messages to upload the data, or direct SQL messages. As many web service and cloud hosts allow their users to use their own software, a hosted data service could be further extended by placing proprietary software on them, thus allowing them to act as the external meter server for any of the previously mentioned methods (e.g., servers 424, 524).

In another embodiment, the IEDs can communicate to devices using Generic Object Oriented Substation Event (GOOSE) messages, as defined by the IEC-61850 standard, the content of which are herein incorporated by reference. A GOOSE message is a user-defined set of data that is "published" on detection of a change in any of the contained data items sensed or calculated by the IED. Any IED or device on the LAN or network that is interested in the published data can "subscribe" to the publisher's GOOSE message and subsequently use any of the data items in the message as desired. As such, GOOSE is known as a Publish-Subscribe message. With binary values, change detect is a False-to-True or True-to-False transition. With analog measurements, IEC61850 defines a "deadband" whereby if the analog value changes greater than the deadband value, a GOOSE message with the changed analog value is sent. In situation where changes of state are infrequent, a "keep alive" message is periodically sent by the publisher to detect a potential failure. In the keep-alive message, there is a data item that indicates "The NEXT GOOSE will be sent in XX Seconds" (where XX is a user definable time). If the subscriber fails to receive a message in the specified time frame, it can set an alarm to indicate either a failure of the publisher or the communication network.

The GOOSE message obtains high-performance by creating a mapping of the transmitted information directly onto an Ethernet data frame. There is no Internet Protocol (IP) address and no Transmission Control Protocol (TCP). For delivery of the GOOSE message, an Ethernet address known as a Multicast address is used. A Multicast address is normally delivered to all devices on a Local Area Network (LAN). Many times, the message is only meant for a few devices and doesn't need to be delivered to all devices on the LAN. To minimize Ethernet traffic, the concept of a "Virtual" LAN or VLAN is employed. To meet the reliability criteria of the IEC-61850, the GOOSE protocol automatically repeats messages several times without being asked. As such, if the first GOOSE message gets lost (corrupted), there is a very high probability that the next message or the next or the next will be properly received.

It is to be appreciated that the above-described one-way communication embodiments may apply to systems other than for energy metering. For example, the present disclosure may be applied to a vending machine or system, wherein the vending machine located in a building or structure having a private or corporate network. The vending machine will include, among other data collecting components, at least a communication device or network interface as described above. The communication device or network interface will coupled the vending machine to the internal network which may be further coupled to the Internet via a firewall. The vending machine may vend or dispense a plurality of items, such as soda cans, candy bars, etc., similar to the vending machine described in U.S. Pat. No. 3,178,055, the contents of which are incorporated by reference. In accordance with the present disclosure, the vending machine will monitor and collect data related to the items sold. Such data may include quantities of items sold, a re-stock limit that has been reached, total revenue generated by the vending machine, etc. In one embodiment, the vending machine will post to a web site, residing on a server outside of the internal network such as the Internet, quantities of specific items sold by the vending machine that are required to fill the vending machine. In this manner, an operator that maintains the vending machine can check the web site before going to the location of the vending machine and know exactly how many items are required to fill the vending machine before going to the location to refill the vending machine.

In another embodiment, the teachings of the present disclosure may be applied to a medical device, for example, a medical monitoring device configured to be worn on a patient. In this embodiment, the medical monitoring device will include at least a communication device or network interface as described above and monitor a certain parameter relating to a patient, e.g., a heartbeat. In one embodiment, the at least a communication device or network interface operates on a wireless connection and coupled the medical monitoring device to internal network (e.g., a home network) which may be further coupled to the Internet via a firewall, e.g., a router provided by the Internet Service Provider. At predetermined intervals, the medical monitoring device will communicate to and post the monitored data on a remote website. A user such as a doctor may then view the data of the patient by accessing the web site and not directly connecting to the medical monitoring device.

Other embodiments may include security systems such as fire alarm systems, security alarm systems, etc., which need to report data. Also envisioned are manufacturing sensing equipment, traffic sensing equipment, scientific instrumentation or other types of reporting instrumentation.

Based on the sensitivity of the data being communicated and posted through the firewall to various external networks, various data security techniques are employed by the IEDs (e.g., meters, vending machines, medical monitoring device, etc.) contemplated by the present disclosure, some of which are described below.

The original FTP specification is an inherently insecure method of transferring files because there is no method specified for transferring data in an encrypted fashion. This means that under most network configurations, user names, passwords, FTP commands and transferred files can be "sniffed" or viewed by anyone on the same network using a packet sniffer. This is a problem common to many Internet protocol specifications written prior to the creation of SSL such as HTTP, SMTP and Telnet. The common solution to this problem is to use simple password protection or simple encryption schemes, or more sophisticated approaches using either SFTP (SSH File Transfer Protocol), or FTPS (FTP over SSL), which adds SSL or TLS encryption to FTP as specified in RFC 4217. The inventors have contemplated the use of each of these schemes in the IEDs described above.

In one embodiment, the FTP server 131 in the IED 110 shown in FIG. 3 uses a set of username and passwords which are programmed through Modbus. These username and passwords can only be programmed when a user performs a logon with administrative rights. Each programmed user account can be given differing permissions, which grant or restrict access to different roles within the file system. Each role controls read and write access to specific files and directories within the file system through FTP. These roles can be combined to customize the access a specific user is given. When passwords are disabled by the user, a default user account is used, with full permissions, and a username and password of "anonymous".

Password protection schemes are measured in terms of their password strength which may be defined as the amount of resiliency a password provides against password attacks. Password strength can be measured in bits of entropy. Password strength is an important component of an overall security posture, but as with any component of security, it is not sufficient in itself. Strong passwords can still be exploited by insider attacks, phishing, keystroke login, social engineering, dumpster diving, or systems with vulnerabilities that allow attackers in without passwords. To overcome these drawbacks it is contemplated to use some form of password encryption scheme (e.g., 8-bit, 10-bit, 16-bit) in concert with the password protection system to facilitate secure communication between an external device, such as PC client 102 and the FTP server 131. However, there are drawbacks associated even with these schemes. For example, a username and password may be encoded as a sequence of base-64 characters. For example, the user name Aladdin and password open sesame would be combined as Aladdin:open sesame, which is equivalent to QWxhZGRpbjpvcGVuIHN1c2FtZQ, when encoded in base-64. Little effort is required to translate the encoded string back into the user name and password, and many popular security tools will decode the strings "on the fly", so an encrypted connection should always be used to prevent interception.

In another embodiment, an encrypted connection scheme is used. In particular, the FTP server 131 in the IED 110 uses some form of FTP security encryption, such as, for example, FTPS (FTP over SSL), Secure FTP (sometimes referred to as FTP over SSH, i.e., FTP over Secure Shell encryption (SSH)), Simple File Transfer Protocol (SFTP), or SSH file transfer protocol (SFTP). These FTP security encryption protocols provide a level of security unattainable with the previously described password encryption schemes.

FTP over SSH refers to the practice of tunneling a normal FTP session over an SSH connection. Because FTP uses multiple TCP connections, it is particularly difficult to tunnel over SSH. With many SSH clients, attempting to set up a tunnel for the control channel (the initial client-to-server connection on port 21) will protect only that channel; when data is transferred, the FTP software at either end will set up new TCP connections (data channels) which will bypass the SSH connection, and thus have no confidentiality, integrity protection, etc. If the FTP client, e.g., PC client 102, is configured to use passive mode and to connect to a SOCKS server interface that many SSH clients can present for tunneling, it is possible to run all the FTP channels over the SSH connection. Otherwise, it is necessary for the SSH client software to have specific knowledge of the FTP protocol, and monitor and rewrite FTP control channel messages and autonomously open new forwardings for FTP data channels.

In further embodiments, the networks may be configured to adhere to various cyber security standards to minimize the number of successful cyber security attacks. The cyber security standards apply to devices, IEDs, computers and computer networks. The objective of cyber security standards includes protection of information and property from theft, corruption, or natural disaster, while allowing the information and property to remain accessible and productive to its intended users. The term cyber security standards means the collective processes and mechanisms by which sensitive and valuable information and services are protected from publication, tampering or collapse by unauthorized activities or untrustworthy individuals and unplanned events respectively. In the various embodiments and implementations of the present disclosure, the systems, devices and methods may be configured to be in accordance with, for example, the Standard of Good Practice (SoGP) as defined by the Information Security Forum, Critical Infrastructure Protection (CIP) standards as defined by the North American Electric Reliability Corporation (NERC), and the ISA-99 standard as defined by the International Society for Automation (ISA), the contents of each being incorporated by reference herein. It is to be appreciated that this lists of cyber security standards is merely an exemplary list and is not meant to be exhaustive.

Figure 10:
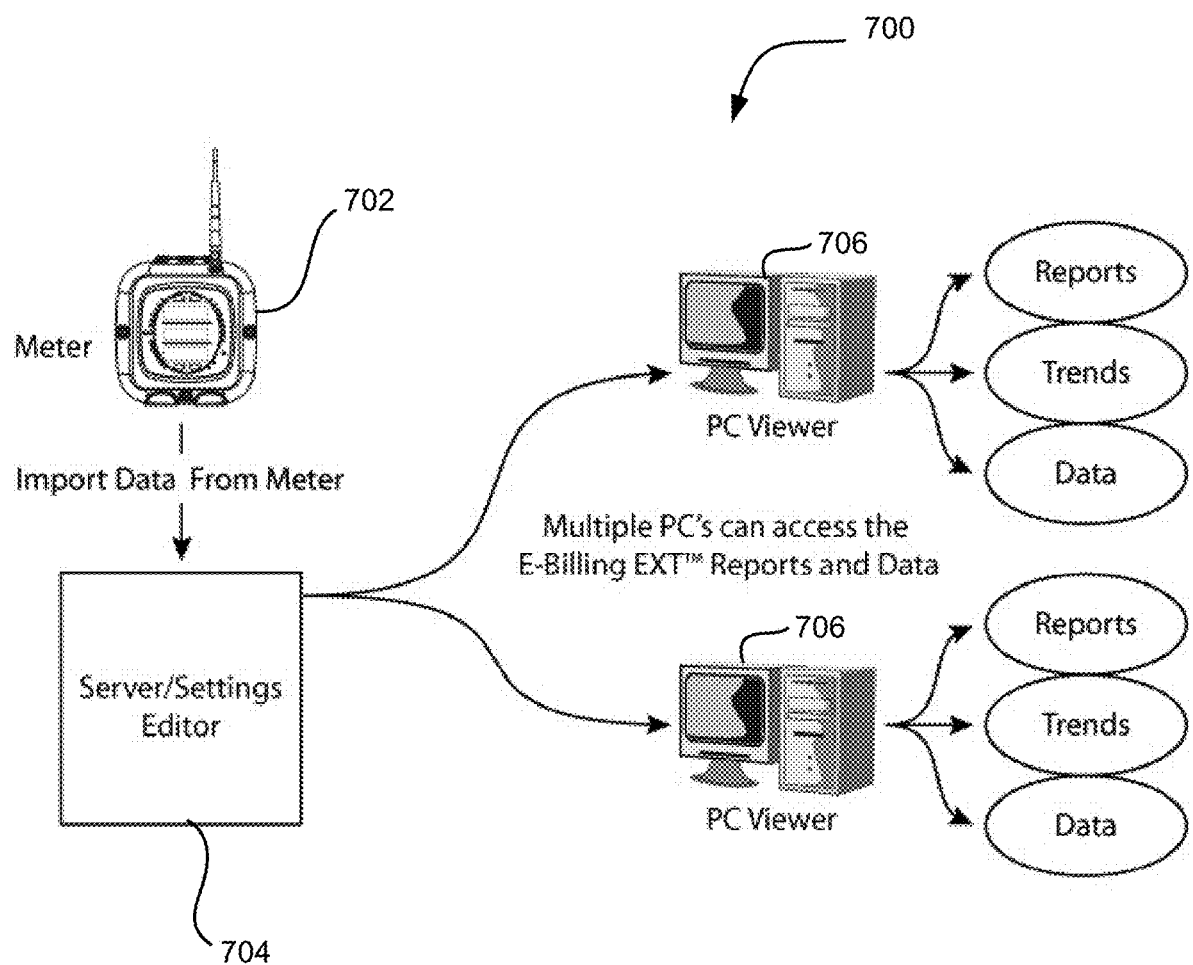
FIG. 10 illustrates an energy management reporting, analysis and billing system in accordance with an embodiment of the present disclosure.

In another embodiment, the IEDs, systems, network topologies and methods thereof may be employed to implement an enterprise-wide energy management reporting, analysis and billing system. As shown in FIG. 10, the system 700 and method of the present disclosure imports historical log energy usage data from meters, IEDs and other sources 702 and generates detailed and useful energy reports for analyzing energy use, planning and load curtailment. In one embodiment, the system 700 operates on a client/server architecture, where a server/settings editor 704 imports data from various sources 702 enabling at least one client 706 to access the data and generate reports therefrom. The system 700 and associated methods enable multiple users to generate customized energy reports to study energy usage and demand enterprise-wide. For example, a user may display Peak Energy Usage for the day, week, and month, or compare usage between meters, locations, and customers. An automated billing module of the system 700 allows a user to generate sub-metering bills based on customized rate structures for energy and other commodities such as water and gas.

It is to be appreciated that the enterprise-wide energy management reporting, analysis and billing system of the present disclosure may be implemented on any of the various network topologies described above, in addition to other developed or to be developed network topologies.

The system 700 and method (also known as E-Billing EXT system or meter billing system) integrates three components, with the goal of providing data collection, analysis, and reporting on metered locations. To achieve this, it brings in data from data sources, such as meters, analyzes it through the billing software, and stores it in an internal database. The meter billing system and method then also provides the ability to retrieve the analyzed data at a later time, and generate reports off that data. From this information, users can then view the larger picture of the location that meters are recording.

Data is collected and stored in a single place, such as a database. Since the data may include private information and billable data such as energy usage, it is important that the software provides accountability for any deviation from the original values. Additionally, the configuration that affects these values should only be able to be modified by users which are given the proper permission for those changes.

Figure 11:
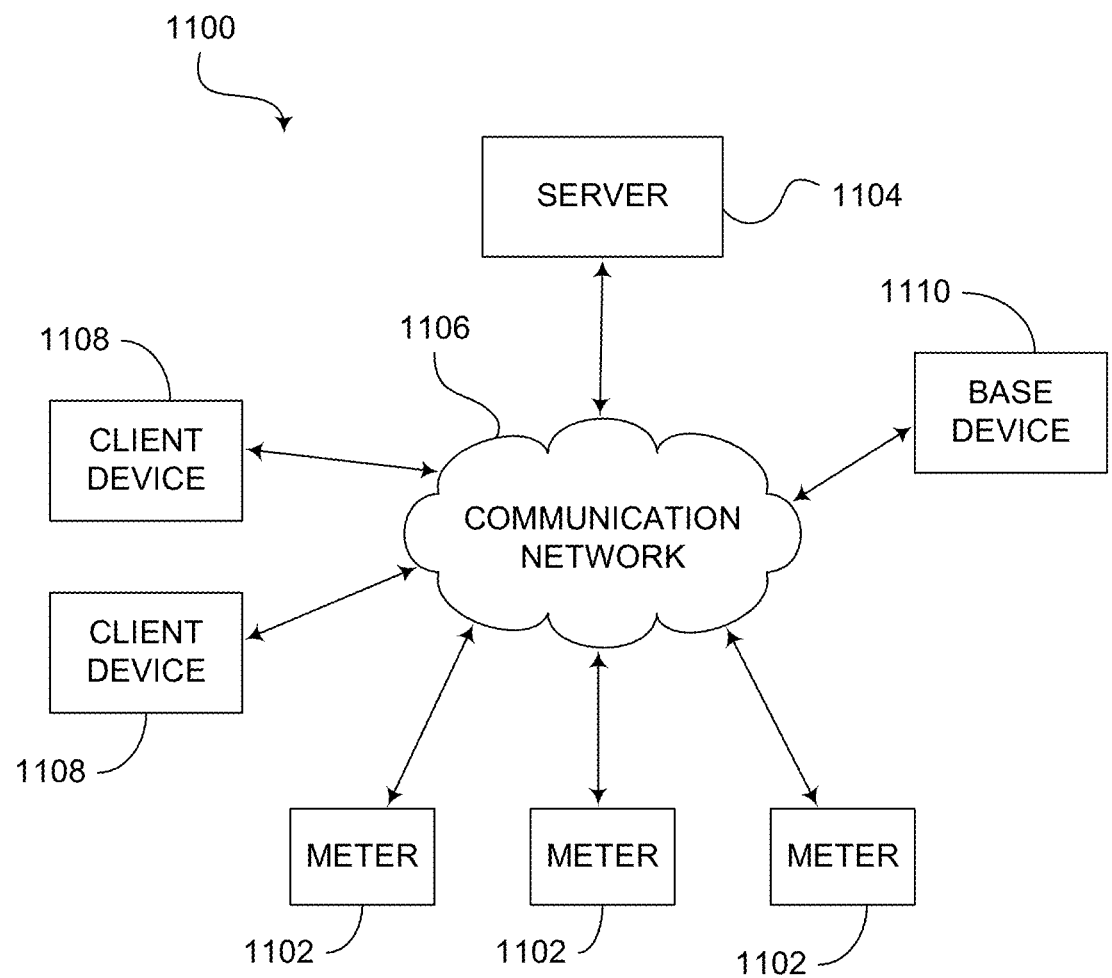
FIG. 11 illustrates another environment in which the present disclosure may be utilized.

FIG. 11 illustrates a system 1100 for managing scripts, according to various implementations of the present disclosure. The system 1100 as shown comprises meters 1102, where each meter is configured to measure parameters of a commodity consumed at a customer location. For example, the meters 1102 may be intelligent electronic devices for measuring electrical parameters of energy consumption. In other embodiments, the meters 1102 may include any combination of sensing devices for measuring one or more commodities, such as electricity, steam, gas, etc.

The system 1100 further comprises a server 1104 in communication with the meters 1102 by way of a communication network 1106. The server 1104, for example, may be configured to receive the measured parameters from the meters 1102 and store the parameters as log data. The log data may be stored in a database in direct communication with the server 1104 or located remotely in the system 1100 and accessible via the communication network 1106.

The system 1100 of FIG. 11 also includes a plurality of client devices 1108 in communication with the server 1104 by way of the communication network 1106. The system 1100 also includes a base device 1110 in communication with the plurality of client devices 1108 by way of the communication network 1106. In some embodiments, the base device 1110 may be omitted, particularly if the functionality of this device is already incorporated in the server 1104, one or more of the client devices 1108, or other device. The base device 1110 may be a second server or another client device. The base device 1110 may be configured to store one or more scripts or functional chains. Each of the functional chains, for example, may comprise software code defining a plurality of functional actions to be performed in a specific sequence. The base device 1110 comprises an interface, such as a network interface or user interface, which allows the client devices 1108 to reference the functional chain.

According to some embodiments, the base device 1110 may also be a client device, but, in addition to the regular functions of the client devices, may also be configured to enable the other client devices 1108 to call upon the base device 1110 to reference the functional chains stored on the base device 1110. In other embodiments, the base device 1110 may be configured as a second server that supplements the server 1104.

The base device 1110 may supply or execute functional chains for the client devices 1108 as needed by the client devices 1108. For example, the needs of the client devices 1108 may be based on what the particular client devices 1108 already store in their memories and what the particular client devices 1108 need in order to execute various functions related to processing meter information. Any one or more of the client devices 1108 that references the base device 1110 for such needs may be referred to herein as a "calling device." Therefore, the calling device can reference the functional chain from the base device 1110 and execute the functional chain.

Many of the embodiments of the present disclosure describe the use of software applications running on the various devices. For example, the server 1104, client devices 1108, and base device 1110 may include software applications for executing various functions. However, instead of the functionality being implemented in software, it should be noted that the functionality may alternatively be implemented in any suitable combinations of software, firmware, and/or hardware.

Figure 12:
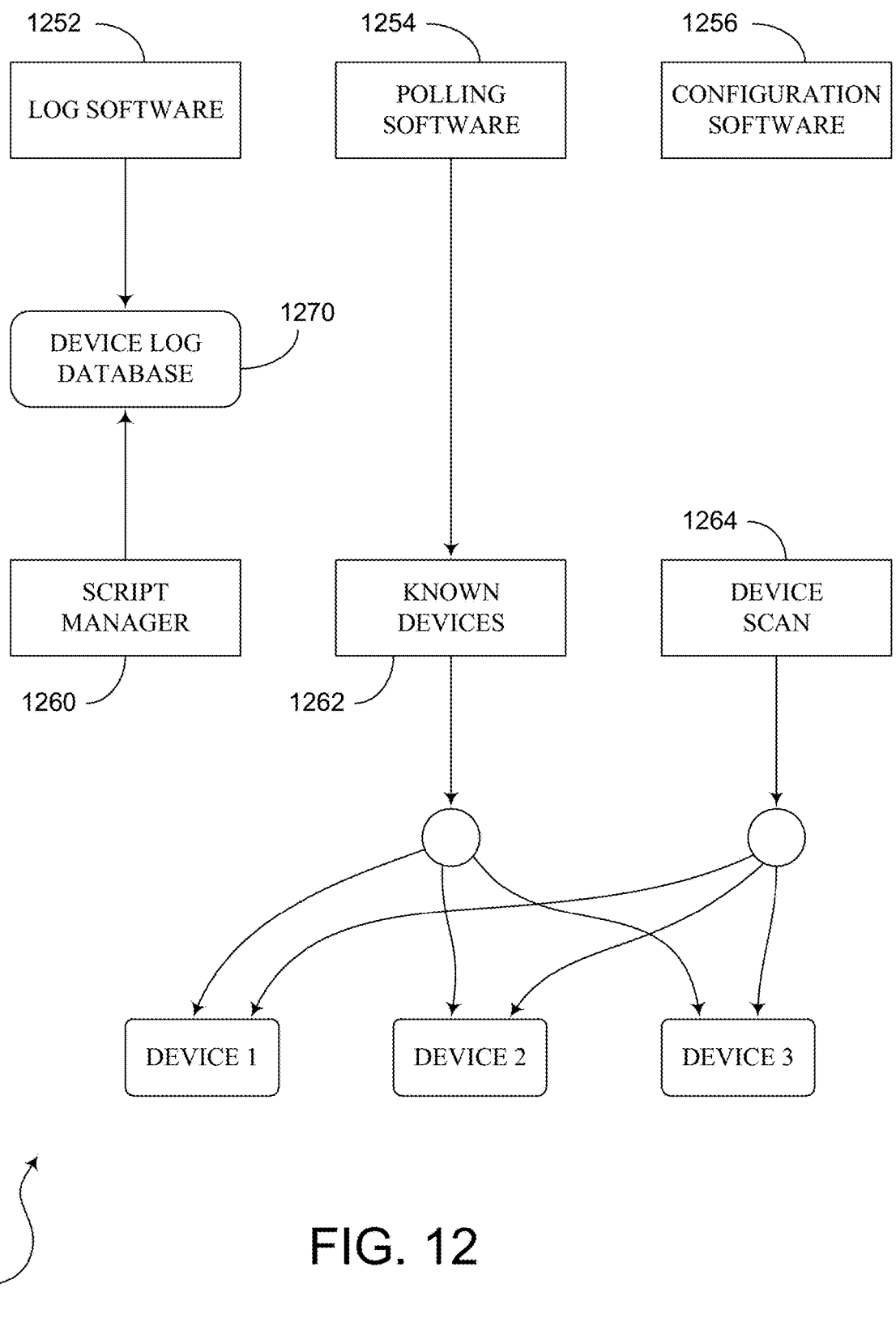
FIG. 12 illustrates a software layout in accordance with an embodiment of the present disclosure.

FIG. 12 illustrates an embodiment of a software layout 1250. The software layout 1250 may be distributed as discussed above with respect to FIG. 11. In other embodiments, the software layout may be contained in one computer system. The software layout 1250 allows multiple software applications to communicate with each other on the same computer. As illustrated, the software layout 1250 may include various software applications, such as log software 1252 (e.g., for logging meter data), polling software 1254 (e.g., for polling meters), and configuration software 1256 (e.g., for managing configuration information of meters).

Additional software applications may include a Script-Manager application 1260, a KnownDevices application 1262, and a DeviceScan application 1264. The details of these applications are described in more detail below. The log software 1252 and ScriptManager application 1260 can store log information in a device log database 1270. The DeviceScan application 1264 is capable of scanning a network, such as network 1106 shown in FIG. 11, to execute a discovery process for finding and identifying meters on the network. As shown as an example, the DeviceScan application 1264 may be able to find at least device 1, device 2, and device 3. The KnownDevices application 1262 is able to use the information about the discovered meters to supply other applications with information about those meters.

Typically, an existing software suite might perform each of a number of functions of the devices using separate software applications, each of which might be configured separately. Additionally, many of the configurations may include manually repeating information which is common between them. This may result in a feel of many disjointed software applications, rather than one common tool. Additionally, many of the tasks that are configured manually may be common ones that are repeated for every device, such as retrieving logs and configuring the connections. Repeating these tasks for every device can be time consuming, can result in errors, and can be confusing to some users.

The base device 1110 is configured to store a collection of software application tools which ease the processing and use of meters and meter data by automating many of the features of the client devices 1108. Some features may include determining the communications parameters of the meters 1102, logging and retrieving data from the meters 1102, and monitoring the status of those devices.

Additionally, the software application tools may process the meters 1102 in a group, rather than as individual devices, which allows for more complex concepts to be applied to those devices. For example, some of the meters 1102, such as a group of meters at a certain physical location, may use the same logging settings. Thus, by gathering these devices together in a group, a user could apply those settings to that group of devices with a single action.

One of the features of the collection of software application tools is the automation of common tasks, such as log retrieval, the generation of reports, and the detection of meters. One goal of this automation may be to require minimal configuration on the part of the user, so as to simplify the use of the devices. A second goal of the automation may be to provide a way to perform these actions on a regular basis. It should be noted that other goals may be achieved by the present systems as will be understood by one of ordinary skill in the art.

Another feature of the suite of software tools includes the ability to bring common components and features of the tools together into a single location (e.g., at the base device 1110). From this location, the client devices 1108 may reference the tools as needed. For example, by providing a common list of devices (e.g., meters 1102) and their connection information, the user no longer needs to manually maintain such list, but can interface with the device independently.

The system 1100 provides a scripting service or script management service, which performs configured actions on triggers. These actions can include retrieving data from meters, the generation of reports, as well as performing a common action, such as firmware upgrade, on a collection of devices.

The system 1100 also provides a way to define various parameters of the meters 1102 and stores a collection of device parameters related to the meters in a storage device accessible through the network 1106. The device parameter collection may include, for example, communications parameters, device information, and stored data references. This information can then be used by the other software applications to interact with the devices in a way that is more meaningful to the user. Additionally, the device parameter collection allows a user on the client devices 1108 to group devices into "locations," which allows for actions to be performed upon the devices in the group as one. Additionally, other software applications could use this grouping information for various management and reporting purposes. The system 1100 also provides a service which scans the network for meters and then automatically populates the contents of the device parameter collection.

These three components work together to provide the goal of automation and common device listings. An additional fourth device, referred to as a Launchpad component, is described in more detail below. The Launchpad component provides a front end to the user to provide a common link to all the other components, as well as configuration and status monitoring of the system.

Figure 13A:
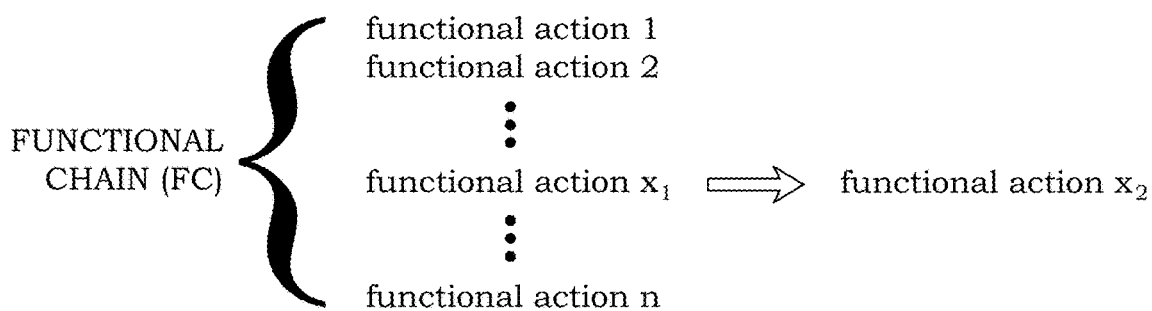
FIGS. 13A-13B illustrate functional chains in accordance with an embodiment of the present disclosure.

One problem which is often encountered when implementing software that is composed of multiple functional actions that are meant to work together is ensuring that these multiple actions are performed in the correct sequence, and at the correct times. In this case, functional actions are defined as a use of a software component which performs a unique action, distinct from the other uses of the software. Furthermore, a functional action may use or require other functional actions as input, and its output may be used by other functional actions. For example, software components may be composed of device log retrieval functional action, a log conversion functional action, and a log viewing functional action. Each of these components performs unique actions, but they are required to be used in concert, and in the correct order, for the user to ultimately view the devices data log. Let such a sequence of functional actions be called a Functional Chain, as shown in FIG. 13A. The Functional Chain (FC) in this example includes functional actions 1 through n.

The problem of coordinating functional actions might be solved by managing the interaction of these actions to ensure that each performs correctly with the other. The drawback of this is that it often requires code to be rewritten and perhaps redesigned when a new action is added, or existing actions modified in an existing functional chain. Another problem with this approach is that when new software is created that uses the same or similar functional actions and chains, it may need to be redesigned and the interaction of these actions may need to be analyzed and tested again.

One possible solution to the problem of using functional actions in multiple locations is to implement the actions as interchangeable components, which can be used from those multiple locations with minimum integration. In this case, an interchangeable component is defined as a set of code or software, which has a predefined interface that allows multiple other software applications to use that component without redesigning the component. For example, log retrieval could be implemented as a software component which performs the functional action of retrieving logs, and defines the interface of specifying the device to retrieve from, the logs to retrieve, as well as defining a specific output format for the retrieved log. This software component could then be used by multiple other software applications to perform the same functional action, without requiring the implemented log retrieval software to be changed. As shown in FIG. 13A, one functional action $x_1$ can replace or be replaced by another functional action $x_2$ in another software application.

Additionally, so long as the interface between the interchangeable component and the calling software does not change, the interchangeable component could be redesigned without affecting the calling software. For example, the calling software may refer to one or more software applications running on a separate device, such as the client device 1108 shown in FIG. 11. Furthermore, a new interchangeable component which performs a similar functional action could be implemented, and used by the calling software with minimum redesign. For example, in the case of a software component used to retrieve logs from a device, if another device existed which defined a different method of retrieving logs, a new software component could be implemented for this second device, and the calling software would only have to know which component to use. This interface for using them would stay the same.

This solution can also be configured to include functional chains. While the interfaces between the components are predefined and remain static, the viability of the sequence of actions that compose the chain remains reliable. Thus an individual component can be changed out in the chain, without requiring the rest of the components in the chain to be redesigned. Furthermore, if the modified component is thoroughly tested, the rest of the chain need not be retested. For example, in the chain of log retrieval, conversion, and viewing, if the retrieval component has been changed to support a new device, so long as the output of the retrieval is consistent with the previous retrieval component, the entire chain will still work.

Functional chains can be further implemented by applying the same rules of a functional action to the chain itself. In this case this means that the functional chain performs a unique action that can be used in multiple locations by defining a consistent interface. Then the functional chain can be used as an interchangeable component, which would allow software to become more modular. For example, a functional chain could be created that retrieves log data from a meter, and outputs it to a text file in comma separated value format. One software application could use this chain to retrieve and display a live trend graph of the historical data. Another software application could use this chain to retrieve and generate an analysis of the historical data. Another software application could use this chain to keep a local history of all the data the device has recorded.

Figure 13B:
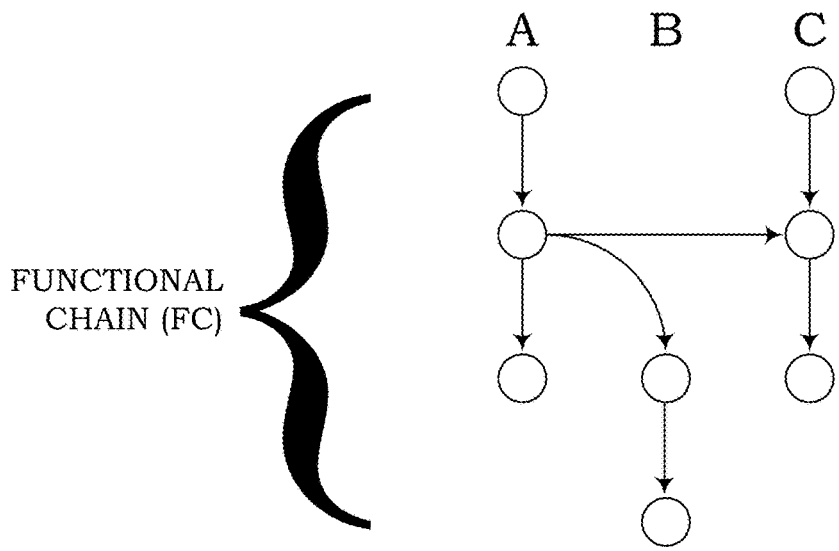

Another problem when implementing functional actions is coordinating the sequence of the actions. This problem is exacerbated when multiple actions are performed in parallel, and their timing is not consistent. An example of parallel actions is illustrated in FIG. 13B, where a number of sequences N are performed substantially simultaneously. A first sequence "A" includes multiple actions, a second sequence "B" include multiple actions, and a third sequence "C" include multiple actions. The first action of sequence B would not be started until the second action of sequence A had finished. Sequence C would also stop executing at its second action, until the second action of sequence A had finished. For example, a functional chain which retrieves and outputs the logged data from a device could be created, and used on three different devices, which may take different lengths of time to complete. A further action could be used at the end which combines the results of that retrieval into a single analysis. For that analysis to be useful, it would be required to wait for all the retrieval chains to complete, which would be non-trivial without hard-coding the knowledge of the completion of the actions.

Figure 14:
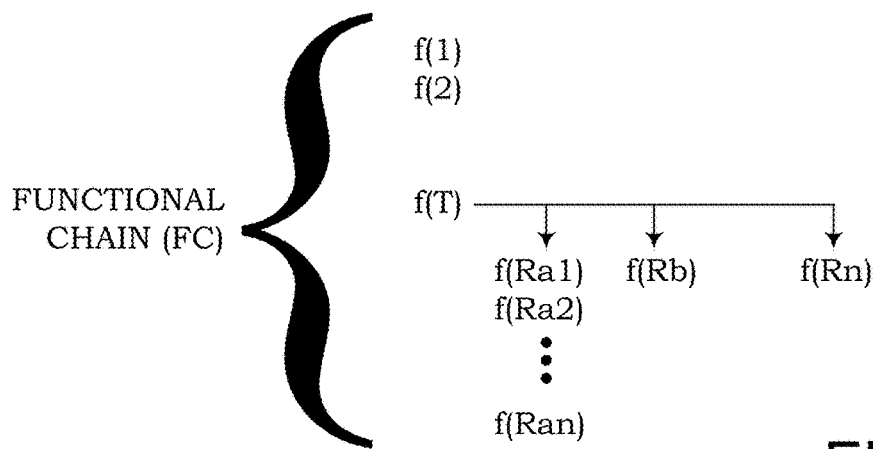
FIG. 14 illustrates another functional chain in accordance with an embodiment of the present disclosure.

One possible solution to coordinating actions is to create a special component which takes as input the functional chains it is to wait on, and has as output a special action which causes later actions to be performed. Let this special action be called a Completion Trigger. As shown in FIG. 14, the action "f(T)" is a trigger and is configured to initiate other actions upon completion. The trigger f(T) initiates the start of functional chain f(Ra) having n actions and also initiates functional actions f(Rb) and f(Rc). For example, such a special component could be created that waits for multiple retrievals and conversions to complete, and then executes the action to perform the analysis.

These completion triggers f(T) could be further implemented by allowing the calling software to wait for the completion trigger, rather than the completion trigger causing the next step in the chain. This would allow the completion trigger f(T) to be used without requiring any knowledge about the software that uses it. For example, in a chain that retrieves multiple logs that ends in a completion trigger, the calling software could wait for the trigger to raise a notification that it has completed, and then process the output files. One possible way to perform this notification could be a TCP message, a kernel semaphore, a Windows Message Event, or other such pushed event notification. Another possible way to perform this notification could be to output a special file that indicates that the completion trigger occurred, and the calling software could monitor for changes. Another possible way to perform this notification, if the completion trigger was contained in another software application or library call, would be to return from a blocking operation.

Another possible solution is to create a functional chain which contains the multiple functional chains within it, and performs the synchronization of them before returning a new output which references the individual outputs. For example, a special chain could be created for the purpose of retrieving multiple logs, which outputs a new comma-separated value (CSV) file that contains the data for all the logs. As another example, another similar chain could be created, which outputs a new file that contains a list of references to the individual retrieval outputs.

Often the use of a functional action does not require knowledge about the output of that action, which may instead be picked up at a later time. For example, a functional chain could exist which retrieves log data from a device and may store it in a log database for later viewing. In this case, the use of the chain, such as log retrieval, conversion, and storage, does not require knowing anything about the chain.

One possible implementation of interchangeable components is to abstract the part of the component that is used in a chain to only the interfaces that are required by the chain, as shown in FIG. 15. This would allow the calling software, or caller, to only require a minimum of knowledge about the action being performed. For example, for a retrieval and storage chain implemented as an external application, the usage of the component may only require that the retrieval parameters be passed in, and the success or failure of the action output.

Abstracting interchangeable components could be further implemented by defining a consistent interface that all components use, regardless of whether they encapsulate similar functional actions. This would allow functional actions to be used in many different sequences, without requiring refactoring on the part of the components to support dissimilar actions. In this example, functional chain FC1 includes functional actions f(1) and f(2). The actions may be abstracted as needed to create functional chains FC2 and FC3, where each of FC2 and FC3 would contain all the actions of FC1, such that they could be called by the same calling device as FC1. A component could exist that retrieves and stores log data, and another component that sends an email to a user that an event has occurred. These two components could be linked together, to notify a user when local log has been updated. Another component could exist that polls a device to determine if a state is set, for example if voltage is above a limit, or a new log record has been recorded. This component could be linked to the email component, to notify the user that a condition, such as the exceeding of a limit, has occurred. In both cases, the email component does not need to know about the previous action.

Many times in software an action is initiated by the user. For example, viewing a polling screen results in the data being retrieved from a device and presented to the user. As another example, log data is retrieved from a device when the user presses a button. However, there is often a need for that action to be performed automatically. For example, the data on the polling screen may need to be refreshed periodically. As another example, the log data may be desired to be retrieved whenever there is a new item. Such automation often requires that the caller of the action implement the logic for the automation for each such use.

One possible solution to automation is to create a special functional action which performs another action under a configured condition. Let this be called a Trigger. As illustrated in FIG. 16, trigger f(T) is executed to determine if the condition is true. If not, the trigger f(T) is repeated or delayed until the condition is true. When true, the functional actions f(1) (and following) are executed. For example, a trigger f(T) could be created which performs an action on an interval, say every 5 minutes. This trigger could be then used along with another component, which polls device data, and a completion trigger to indicate to a polling screen that fresh data is available to be displayed. As another example, a trigger could be created that polls a device, and compares the value read against a configured setting, such as checking if the voltage value is above a certain level.

This automation through triggers could be implemented by combining such triggers with the functional actions they call, into a single functional chain. Let such a component that combines both action and triggers be called a Script. For example, such a script could be created which performs a log retrieval process every 15 minutes. In such a case, as shown in FIG. 17, the trigger f(T) would be a timer that checks if the interval has passed, and the action f(1) would be the log retrieval. As another example, such a script could be created that uploads firmware to a device when it is notified that new firmware is available.

One possible implementation of such a script could be to have an explicit trigger component, and an explicit action component. Such a trigger could then be used to detect if the action should be performed, and if true, the action component executed. Another possible implementation of such a script could be to link the trigger to the action component such that the trigger is executed, and that the trigger executes the action component.

Figure 18:
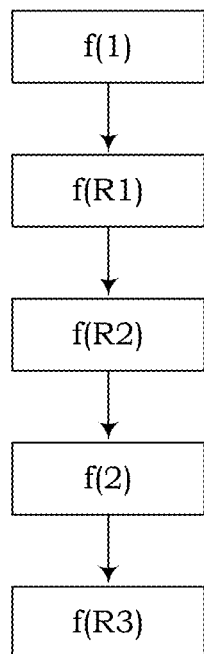

Another possible implementation of such a script could be that the trigger and the action to be executed are both just action components, as shown in FIG. 18. Only a single start point and exit point for the chain of actions would have to be defined. This would allow an arbitrary number of triggers f(R1), f(R2), f(R3), etc. and actions f(1), f(2), etc. to be used within the script. Additionally, this would allow for scripts which did not require a trigger, but instead were just used to perform an action.

Figure 19:
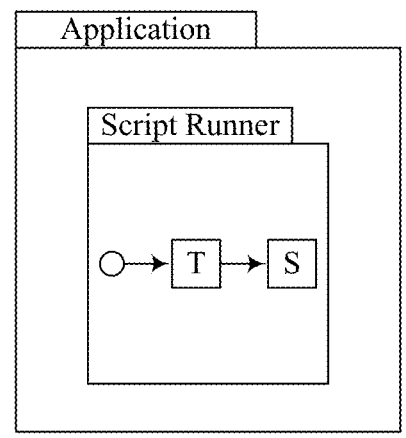
FIGS. 19-20 illustrate script runners in accordance with an embodiment of the present disclosure.

Automation through triggers could be further implemented by creating a component which has the functional action of running other scripts. Let such a component be called a Script Runner. In FIG. 19, a script runner, identified as R, is configured to run script "S". This script runner R could then be used by a software component to perform an arbitrary set of actions with only the requirement to setting up the scripts to run, and possibly processing the output. For example, a software component could be created that polls various data from a device, flags indications of device status changes to the user, and displays log events as they happen. Each of these actions could be implemented through a script, and run through the script runner. When any one of the actions completed, the software application would be notified, and the results presented to the user.

Figure 20:
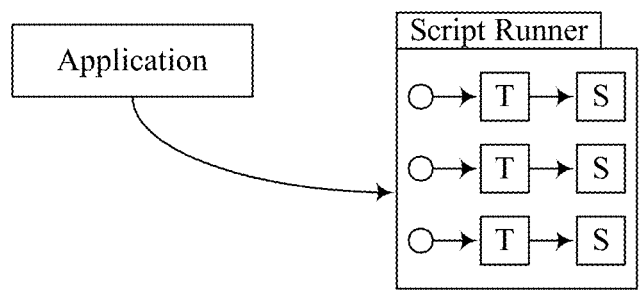

Often actions do not require a specific software component to be involved to perform their functionality. The script runner could be further implemented as a separate software component, as shown in FIG. 20, which could then be used to run any such independent scripts, regardless of their source. For example, a script could be used which retrieves and stores log data for a device on an interval. As another example, a script could be used which monitors the status of a device, and sends an email when the device is no longer accessible. As another example, a script could be used that generates a report at the end of each day, such as an analysis of the data from multiple devices. A single script runner could be used to run each of these scripts.

Using the script runner as a separate software component may be further configured to allow it to be run without being started by a user. One possible implementation of this could be to run it as a service. Another possible implementation of this could be to check if it is running when an external software application tries to use it, and automatically start it if it is not running.

Figure 21:
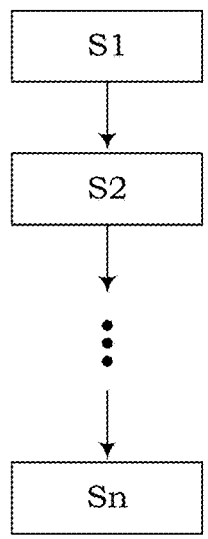
FIG. 21 illustrates a chain of scripts in accordance with an embodiment of the present disclosure.

Scripts could be further implemented by providing the ability to chain scripts and triggers together, as illustrated in FIG. 21. As such, the completion of one script leads to the execution of another. For example, an existing script which retrieves and stores logs could be linked to another script which resets those logs. As another example, an existing script which polls the status of a device could be linked to another script that sends that information to a server.

Figure 22A:
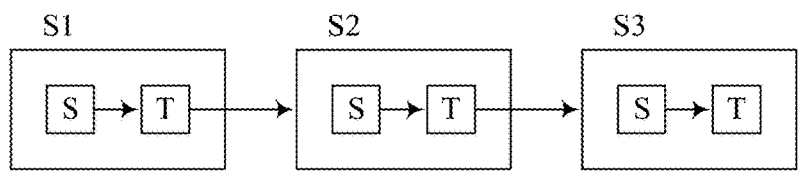
FIGS. 22A-22B illustrate scripts and triggers in accordance with an embodiment of the present disclosure.
Figure 22B:
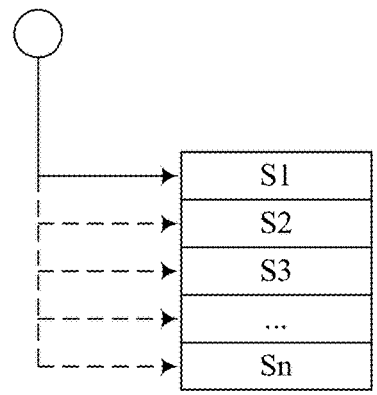

One possible implementation of this could be to link multiple scripts together with triggers, as shown in FIG. 22A, such that when one script (i.e., S1) completes, its completion trigger calls the next script (i.e., S2) in the chain. Another possible implementation of this could be to create a special list of scripts, such that when one is completed, the next is executed, as shown in FIG. 22B.

Figure 23:
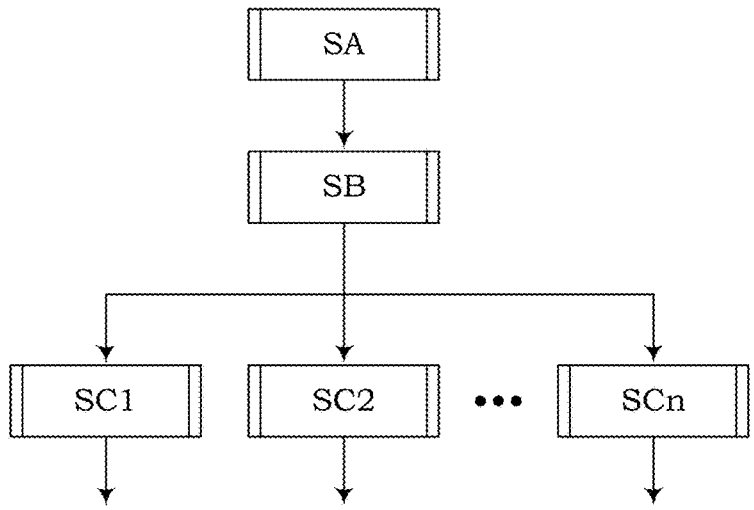
FIGS. 23 and 24 illustrate linking scripts with triggers in accordance with an embodiment of the present disclosure.

Linking scripts with triggers could be configured by allowing them to trigger multiple scripts upon completion, as shown in FIG. 23. As illustrated, the completion of script SB trigger scripts SC1, SC2, through SCn. For example, a script which polls device data could trigger a script that displays the value on a UI, as well as trigger a script that stores it in a local data log, as well as trigger a script that sends an email if the value exceeds some limit.

Figure 24:
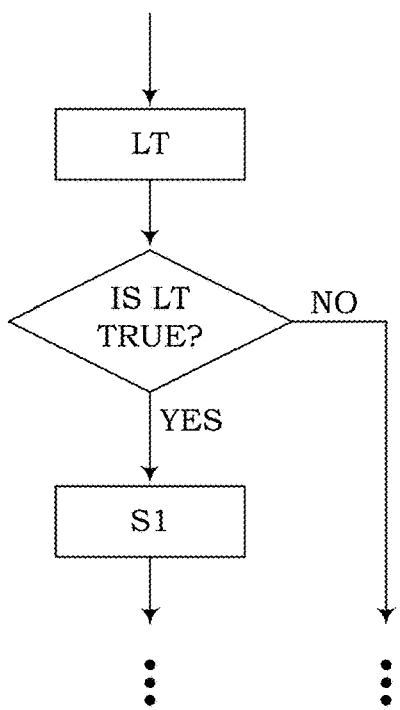

Linking scripts with triggers could be further implemented by creating a trigger that tests if a condition is true before allowing the script to be executed, as shown in FIG. 24. Let such a trigger be called a Logical Trigger (LT). For example, a script which retrieves log data could be linked to a script that generates a report. The report generating script could have a trigger that tests if the log data covers a sufficient period of time to generate the report, before doing so. As another example, a script which polls a device's configured time could be linked to a script that sets the device's configured time. The set time script could have a trigger that compares the device's time against an absolute reference, and only sets the time if it is sufficiently different.

Figure 25:
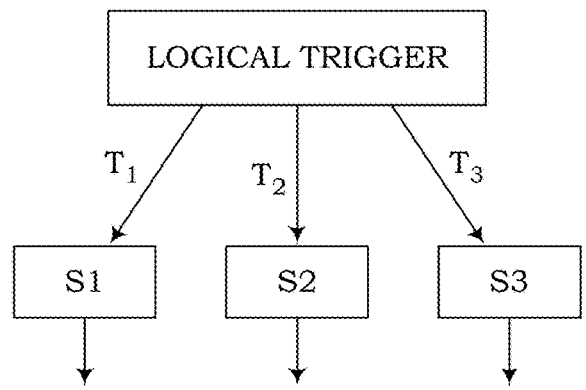
FIG. 25 illustrates logical triggers in accordance with an embodiment of the present disclosure.

Logical triggers could be configured to determine which of multiple scripts to trigger next, as shown in FIG. 25. This decision could include one script, no script, or a combination of multiple scripts. In the illustrated implementation, depending on various conditions, the logical trigger can trigger script S1 using trigger $T_1$, trigger script S2 using trigger $T_2$, and/or trigger script S3 using trigger $T_3$. For example, a trigger could be created which monitors multiple qualities of a device, including but not limited to, readings such as voltage, log statuses, and device statuses such as system events. If that same trigger detects new system events, it could execute a script that retrieves those events for analysis. If that same trigger detects a quality value, such as harmonics or phase angle, exceeding a limit, it could execute a script that initiates a manual waveform capture, as well as another script that stores device readings around the time of the event, as well as another script that retrieves related logs, such as power quality and waveform logs. If that same trigger detects that it is unable to communicate with the device, it could execute a script that sends an email to a configured user, to notify them of the problem.

Figure 26:
FIG. 26 illustrates a manual trigger in accordance with an embodiment of the present disclosure.

While automating the execution of the script runner supports standalone scripts, there is still a need for functional actions which are started directly by the user, as shown in FIG. 26. For example, the user may wish to see the log data for a device, and that data has not yet been retrieved from the device. As another example, the user may wish to update the firmware of a device. One possible solution to this could be to instantiate a script runner R each time an action is to be performed. Alternatively, just the script S to be executed could be instantiated each time an action is to be performed.

Another possible solution to this could be to create a trigger which executed its script when an external decision has been made. Let this be called a manual trigger. One possible implementation could be to use an internal flag that the trigger could periodically check. Another possible implementation could be for the script runner to execute the script directly when the condition has been triggered by the caller. For example, the script runner could be implemented such that it could be given a list of scripts to execute manually, which it then executes, either when it was given them, or on some sort of cycle.

Using manual triggers could be further configured in the case of an external script runner, such as the case where the script runner is contained within its own application, by providing an external mechanism to pass trigger information into the script runner from an external caller. Let such an external mechanism be called the Script Runner Interface.

One possible implementation of such a command mechanism could be to implement a communication server in the script runner application, which the external application could send commands to. For example, a TCP port could be listened on for commands in a special format, such as binary or text commands, to initiate the manual triggers. As another example, an http server could be used, such that POST messages could be used to send commands. As another example, a pipe or message queue could be listened on for commands.

Figure 27:
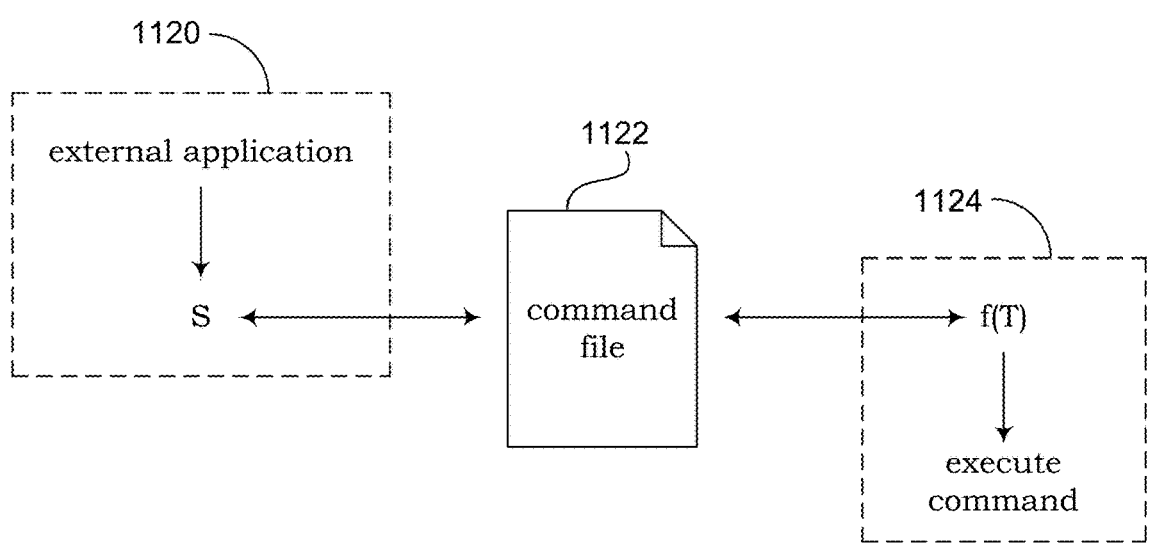
FIGS. 27-29 illustrate command mechanisms in accordance with an embodiment of the present disclosure.

Another possible implementation of such a command mechanism could be to use a command file, as shown in FIG. 27. For example, an external application 1120 could write a command to a command file 1122, which the script runner R 1124 would periodically check by reading the contents of the command file 1122. As another example, a directory could be used such that each entry in the directory is a command file to execute, and the script runner would periodically check for new files.

Another possible implementation of such a command mechanism could be to use a database to store a list of commands to execute. For example, the external application would insert an entry to the command table, which the script runner would periodically check for by reading from the database. Such a database mechanism could be further configured by using a database server, which would allow for the script runner application and the calling application to be on separate computers. For example, a setup could be created where multiple users need to initiate similar actions, such as polling device information, or generating a report, each from a unique remote terminal.

Using a database server as the command mechanism could be further implemented by storing user information from the caller, which the script runner could then use to verify that the caller is allowed to execute the script. One possible implementation of this could be to store a user id in the table along with the command, which could then be verified against a user list containing permissions. Another possible implementation could be to use individual command tables for each type of command, and only give the callers permission to read and write to tables that they have permission to execute commands for.

Manually triggered scripts could be further implemented by allowing any script to be manually triggered, not just ones which have been configured with a manual trigger. For example, a script could be used to retrieve the logs of a device every 4 hours. If the user wanted to see the update to date values that script could be manually triggered to initiate a retrieval and update.

Figure 28:
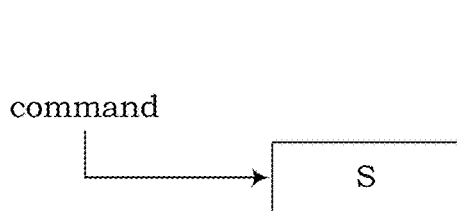

Such commands, as shown in FIG. 28, could be further configured by allowing them to be used for more than just manually triggering scripts. For example, a command could be used to stop a script that is running. As another example, a command could be used to start or stop the script runner itself. As another example, a command could be used to pause the triggering of all scripts, regardless of if the trigger condition occurs. As another example, a command could be used to enable or disable the triggering of a specific script.

Figure 29:
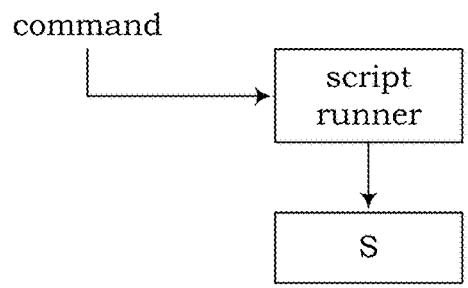

Such commands could be further configured, as shown in FIG. 29, by allowing them to pass additional information to the script runner along with the command. For example, a command could be used to add a script to be run, and the additional information could be used to describe the script. As another example, a command could be used to start a script, and the additional information could be used to specify the configuration used as input to the script.

Such commands could be further implemented by providing a mechanism to return information to the caller. One implementation could be to send a response to a command sent via a communications server. Another implementation could be to insert the response information in the original command, such as filling in a field in the database, or appending to the end of a file. The external application could then read that information out to process the response. Another implementation could be to store the response as a separate field, such as a separate database table, or a separate file. A unique key from the original command could then be used to link the two.

Using an external mechanism, such as a database, communications server, or file, to communicate between an external application and a script runner application could be further configured to read the current status of the script runner. For example, the startup time of the script runner could be queried. As another example, the list of running scripts could be queried. As another example, the details and configuration of a script could be queried.

Figure 30:
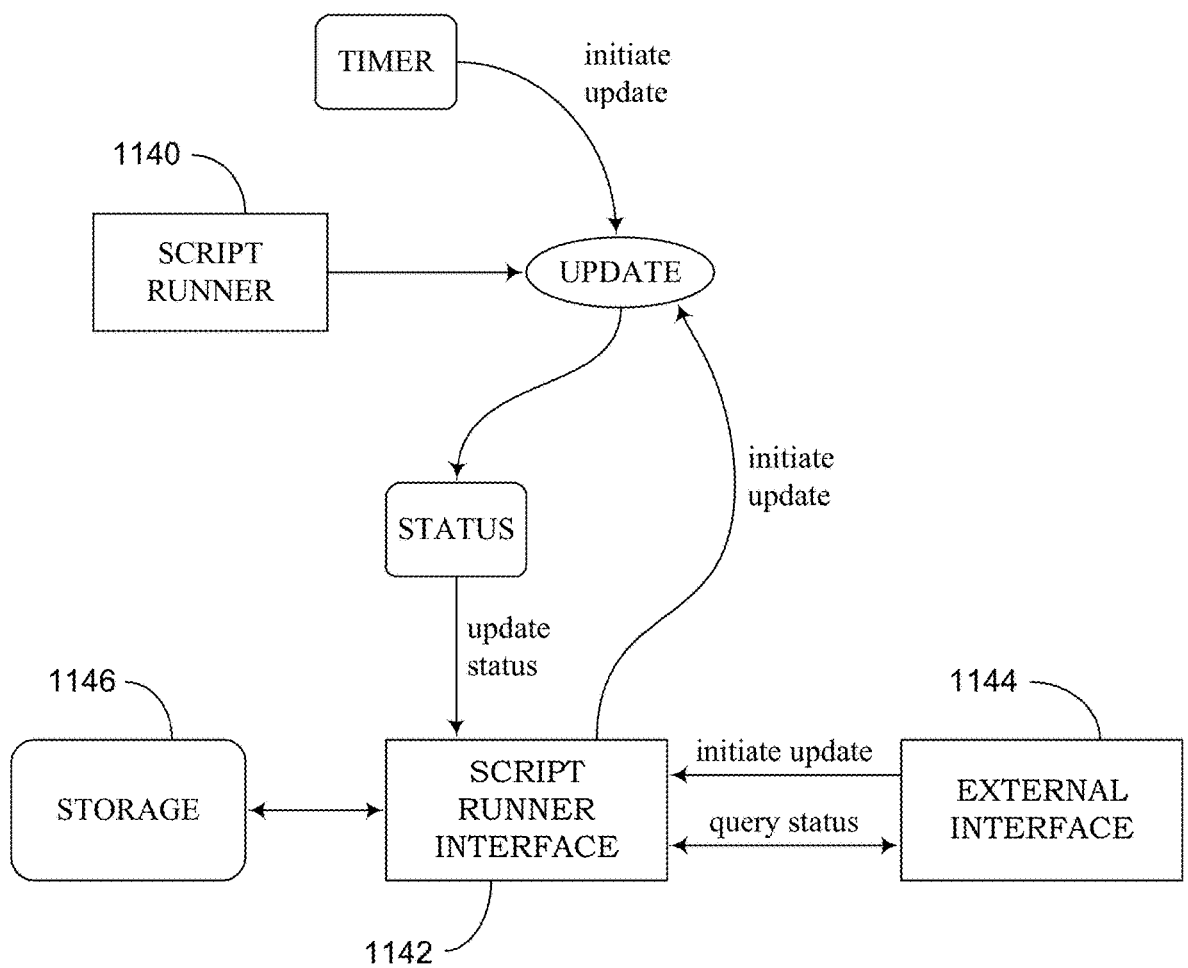
FIG. 30 illustrates another script runner in accordance with an embodiment of the present disclosure.

One possible implementation of this is shown in FIG. 30. In this case, the script runner 1140 writes or updates its current status to a script runner interface 1142 periodically, which the external interface 1144 could periodically read. Another possible implementation could be to provide a command (e.g., initiate update) that the external application 1144 could send that would cause the script runner 1140 to update its current status. The external application 1144 could then read that updated status from the script runner interface 1142, or it could be returned as the result of the command. Also, the script runner interface 1142 may store status information in storage device 1146.

Figure 31:
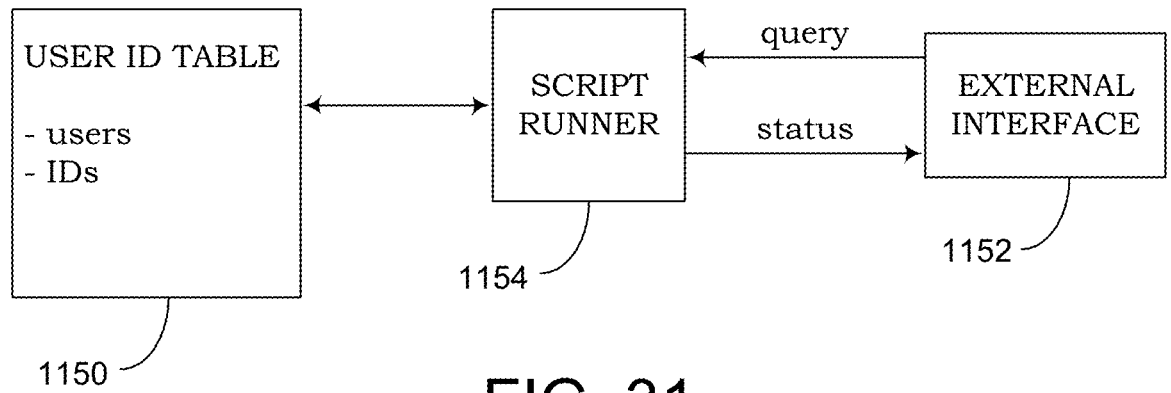
FIGS. 31-32 illustrate status mechanisms in accordance with an embodiment of the present disclosure.

Such a status mechanism could be further implemented by restricting what users were allowed to read which statuses. One possible implementation of this, as shown in FIG. 31, could be to provide a user ID table 1150 that stores users, IDs, along with status commands, which could then be verified against a user list containing permissions. In response to a query from an external interface 1152, the script runner 1154 can retrieve the status information from the user ID table 1150 and provide the status to the requesting external interface 1152. Another possible implementation could be to use individual status tables for each type of status, and only give the callers permission to read from tables that they have permission for.

Figure 32:
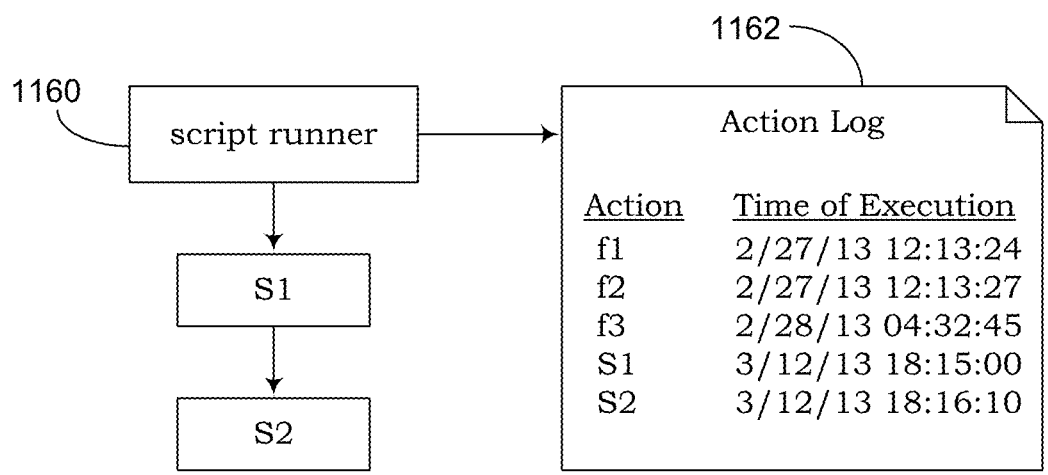

Such a status mechanism could be further implemented by also logging the actions that the script runner takes, as shown in FIG. 32. For example, the script runner 1160 while running scripts S1, S2, etc. can record the functional actions and the times that each script was run in an action log 1162. As another example, the input and output from a script could be recorded in the action log 1162. One possible implementation of such a log could be to store each action as an entry in a database table. Another possible implementation of such a log could be to store each entry in a log file. Such a log file could store each entry in many ways, including on a line as text, as html entries, as xml formatted nodes, or as binary records separated by a special character.

As shown in FIGS. 33A-33D, such a log could be further implemented by also storing error information. For example, an error may be identified if a script failed to start due to a bad configuration, as shown in FIG. 33C. As another example, if a script S1, S2 returned an error code indicating that it had a problem, as shown in FIG. 33D. As another example, if the script runner detected a problem with itself or its interface, such as corruption in the database or command file directories. As another example, if the script runner detected that an external application was trying to execute commands that it did not have permission for, as shown in FIG. 33B. The script runner R can store the errors in error log 1166, as shown in FIG. 33A.

Such a log, or another log, could be further implemented by also storing information from the scripts themselves, such as the actions they took (e.g., action log 1162 shown in FIG. 32), the errors they encountered (e.g., error log 1166), and the values they detected (e.g., value log 1168 shown in FIG. 33A). For example, a script which retrieves logs could report that it was querying the log header information, the values that were discovered, the actions performed to retrieve the log, and any errors which occurred during the retrieval.

So many log entries could quickly become confusing to anyone trying to understand what happened. One possible solution to this could be to link all the log entries which occurred during a single run of a chain of scripts with a key. One possible implementation of this could be to keep a list of each time a script was started, such that the key could then use the index of this list. Another possible implementation of this could be to use a similar list, but to generate a unique id, such as a GUID or hash, and store it in the list. This unique ID could then be used as the key. Another possible implementation could be to use a key generated from the first log entry, such as its unique index.

Another possible solution could be for each log entry for a chain of scripts to refer back to the previous entry, all the way to the beginning of the chain. Another possible solution could be to store each script chain individually. For example, all the entries for a single script chain could be logged to a single file. As another example, all the entries for a single script chain could be logged to a single table.

Such a command and query interface, as mentioned above with respect to FIGS. 26-31, could be further configured by providing a library or application programming interface (API) which callers could use to send and receive data from the interface. This would allow the software code to be written without requiring including details of the specific mechanism of the interface. This would also allow the interface code, which may be common among the software applications, to not have to be repeated in multiple locations, thus reducing complexity. For example, a software application could send a manual start command with the following code snippet: cmdapi.SendCmd("START", script_id). The software would not have to know if the interface was a database, a file, or a communications server. One possible implementation of such an API could be to provide a library code base, such as a dynamically loaded library (DLL), a statically linked library, a plug-in, or common source code.

Another possible implementation of such an API could be to provide another software component, which is called to perform the commands and queries. For example, a command-line application could be used to send a command by invoking the command-line application with the command as an argument. As another example, a command-line application could be used to perform a query by invoking the command-line application with the query parameters as arguments, and the results could be written to a file, or standard out, and read by the caller.

Script Chains could be further implemented by using an interpreted sequence of actions. Such an implementation would allow for easy creation of an arbitrary sequence of triggers and actions. For example, it could be implemented using an interpreted language, such as but not limited to Perl, Python, Lua, JavaScript, or one created for the purpose. As another example, it could also be implemented as a collection of action objects, which are then linked together through the interpreted sequence. Such an interpreted sequence could be a text file with each action or trigger to perform on a line, with each component configuration specified on that line.

Figure 34:
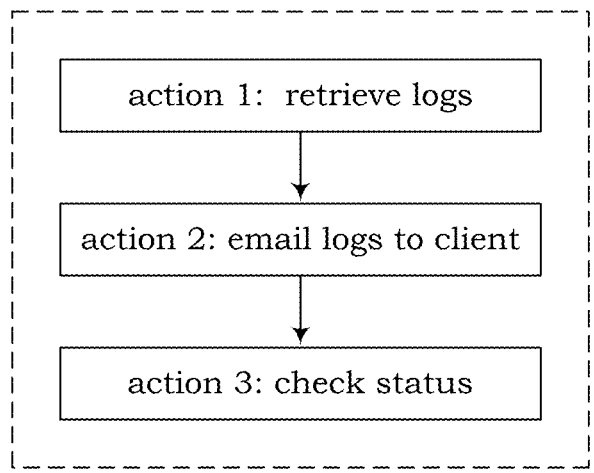
FIGS. 34 and 35 illustrate portions of a frontend user interface for displaying aspects of functional chains.
Figure 35:
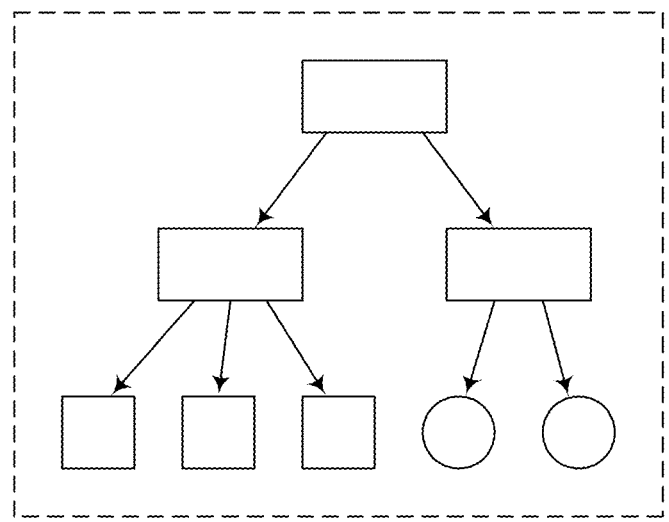

Such an interpreted sequence could be further configured for providing a graphical interface to represent such a sequence, as shown in FIGS. 34 and 35. One possible representation could be to show each action and trigger as a square or other such shape, and show how each component calls the next as an arrow or other such link, as shown in FIG. 34. Actions and triggers could also be represented by icons or images. Such a representation could also use different shapes or images to represent different types of actions and triggers. In such a representation, information about the component, such as configurations, could be represented as text inside the shape. Such a representation could also automatically arrange the actions and links to better represent the flow of actions. For example, the first action could be placed at the top or left, and each sequential action arranged below or to the right of the previous.

Another possible representation could be to display the sequence of actions and triggers as lines in a grid, where the sequence of actions is represented vertically. Another possible representation could be to display the actions and triggers as nodes in a tree, as shown in FIG. 35, where each called component is represented as a child of the calling component.

Such an interface could be further implemented by allowing the sequences to be designed on the interface. One possible implementation of such a designer could be to allow a shape representing a specific type of action to be placed on a field that contains the graphical representation of the script. This action could then be linked to other actions by dragging a link representation to another action. This action could also be linked to other actions by manually selecting the action it is to call from a list.

Another possible implementation of such a designer could be to allow an action or trigger to be inserted after another action or trigger by clicking a button. The relation between the calling action and the called action could be determined by the button pressed. Another button could be used to change the relation between actions, such as moving them up or down in a grid, or to a different level in a tree.

Such an interface could be further implemented by graphically representing the actual progress of the script as it executes. For example, the current component being executed could be represented by a color change. As another example, the current component being executed could be represented by a selection marker, such as a border or a halo. As another example, the current component being executed could be represented by a change in its shape, image, or location.

Representing an executing script graphically could be further configured for action chains by representing the history of the actions. For example, if one of multiple actions was taken, the actions not performed could be represented by a color change, such as dimming, graying them out, making them transparent or translucent, or temporarily hiding them. As another example, if one of multiple actions was taken, the link representation between the caller and called action could be highlighted, such as changing the color, size, style, or giving it a halo.

Representing an executing script graphically could be further implemented by displaying the input and output to each action or trigger. One possible representation could be to display the input and output as text. For example, a popup shape could be displayed near the action or trigger, in which the text could be displayed. Furthermore, a line could be used to denote the connection to the user. As another example, a section of the representation of the action or trigger, such as a field in a grid, a child node in a tree, or a section of the shape, could be used to display the input and output. Another possible representation could be to display the input and output using images to denote what kind of input they represent.

Representing an executing script graphically could be further implemented by displaying the action log along with the actions and triggers. For example, a scrolling list could be displayed that shows each log entry as it occurs. As another example, a text field could show the last log entry or the current state of the action or trigger.

Representing an executing script graphically could be further implemented by indicating when errors occur. For example, the representation of the action or trigger could change color, such as turn red, to indicate that it encountered an error. As another example, an error icon, such as an exclamation mark, could be displayed near the action or trigger. As another example, a popup shape could be displayed that contains the error message. As another example, a text field could show the last error message.

While a standalone Script Runner software component that was written for a specific set of actions can be used, a generic standalone script runner software component that allows for running arbitrary scripts would be more useful. However, since the script runner's knowledge of the scripts must be minimal, it is difficult to properly construct the script objects to be used by the script runner.

One possible solution to such generic scripts could be to provide a way for the calling software to define the scripts to be executed. One possible implementation of this could be to pass the script in through the script runners command interface, such as a command database or communications server. Such an interface would require that a transfer format for the script be defined, which allows the script to be transferred between two applications, and reconstructed at the other side. For example, scripts could be represented as an interpreted text file. As another example, scripts could be represented as XML nodes. As another example, scripts could be represented as a binary structure.

Such an interface could be used by the calling software to initialize the list of scripts that it requires. For example, when the calling software is being initialized, it could query the list of all scripts, and load the scripts that it needs. Finally, when the calling software shuts down, it could remove the scripts it no longer uses. As another example, the calling software could query if a script was loaded every time it wanted to use that script, and load it if necessary.

Another possible solution to such generic scripts could be to store the scripts to execute separately from the script runner, such that they could be configured while the script runner was not running, and independently of any particular calling software. One possible implementation of this could be to store each script as a file, which could be loaded when the script runner starts up. Such an implementation would require that a storage format for the script be defined, which allows the script to be configured, stored in a file, and reconstructed at a later date. For example, scripts could be represented as an interpreted text file. As another example, scripts could be represented as xml nodes. As another example, scripts could be represented as a binary structure.

Another possible implementation of storing the scripts could be to store them as entries in a database, which could be loaded when the script runner starts up. Such an implementation would require that a storage format for the script be defined, which allows the script to be configured, stored in a database field, and reconstructed at a later date. For example, scripts could be represented as an interpreted text entry. As another example, scripts could be represented as xml nodes. As another example, scripts could be represented as a binary structure. As another example, a database table could be defined which represents each action as an enumerator, and uses other fields for customization.

Storing scripts separate from a software application would require a way to store the configuration for those scripts. One possible implementation could be to store the configuration as part of the script description. Another possible implementation could be to store the configuration separate from the script, such as in a separate database field or table, or a separate file.

Storing scripts separate from a software application would require a way to configure those scripts. One possible solution could be to provide custom software whose purpose is to initialize those scripts. Another possible solution could be for the calling software to initialize the scripts they need the first time they are run. Another possible solution could be to provide a software component that could be used to configure the scripts.

Using a configuration software component could be configured by allowing the user to configure the associated scripts. For example, the user could decide that they want to be notified if a device resets. They could configure a script that triggers when the last reset time changes, and sends an email with a notification. Such a script could then be stored for the script runner to use. As another example, the user could configure a script to retrieve the devices logs every hour.

FIG. 36 illustrates an example of a configuration software component that allows a user to configured scripts. As shown in this embodiment, a portion of a front end user interface 1190 enables a user to select one or more "Actions to be Taken", select "Which Meters" the actions apply to, "When" the action is to take place, the "Conditions" of execution of the actions, and "What to do with Outputs." Therefore, the frontend 1190 enables the user to create a script using a simple format.

While generic scripts can be very flexible and useful, they can also require a significant amount of time and knowledge to properly configure. One possible solution to simplify configuration by the user is to provide specific configuration frontends to the user, such that they only need to enter information pertinent to the action they want performed. For example, log retrieval could be implemented as a script that calls an external tool with a set of command line parameters that indicate the details of what logs to retrieve, the time range, where to output the results, and the device to retrieve from. Constructing such a command line would probably be beyond the skill of most users. A script configuration interface could be created that is tailored specifically for log retrieval, where the user only has to pick the device to retrieve from, and the logs they want to retrieve. The software component could determine the rest of the values, and construct the script appropriately.

Another possible solution to simplifying configuration is to provide script templates, which are scripts that perform common actions, and require minimal configuration on the user. For example, a script which periodically checks if a devices firmware is up to date, and updates the firmware if not, could only require the user to specify the device to check.

Script templates could be implemented by creating such scripts that perform their actions on a collection, such as a list of devices, and thus the user need only enable or disable the script. For example, a script could be created that monitors a device for resets, and sends an email on its occurrence. Such a script could be modified to perform the check on every device in a list, which could be edited by the user, or filled from another source.

Simplifying configuration could be further implemented by providing a way to specify a configuration that is filled in when the script is run. For example, a script that was performed on a list of devices could get that list when the script is executed; the next time that script was run, the list may be different, and the script would use that new list. As another example, a script may write to a log file, where the name of the file is the time that the script was performed.

One possible implementation of such dynamic configurations could for each script to have unique configuration fields that describe how the configuration should be used. For example, a script which writes a file could have a configuration field that specifies how the filename is to be generated. This field could contain values such as, but not limited to, use a specific filename, to use a timestamp, to use a location name, or to use a device name. As another example, a script which retrieves logs from a device could have a configuration field that specifies where to get the device to use. This field could contain values such as, but not limited to, use a specific device, use a file that contains a list of devices, or query the list of devices from another software application.

Another possible implementation of such dynamic configurations could be for configurations represented as text to contain special replacement tags. Such a tag would then be replaced by the software component when the script runs to determine the specifics of the configuration at that time. For example, in a script that writes to a file could use a tag such as "<TIME.CURRENT>", which would insert the current time in a filename such as "logs\<TIME.CURRENT>.txt". As another example, a tag such as "<LOGS.DIR>" could be used to dynamically specify the location of the log directory. As another example, "<DEVICE.CONNSTR>" could be used to specify a connection string for the device that the script is using.

Dynamic configuration could be further implemented by providing a mechanism to enumerate a list, and to apply the configuration and scripts they describe, to each item in the list. For example, a list of devices could be provided such that the script is performed on each item in the list, but the configuration of the script only describes one device. As another example, a script which retrieves logs from a device could enumerate over a list of logs to be retrieved.

One possible implementation of this could be to provide a list of things for the script to enumerate over, and use replacement tags in the configuration to specify details to use from each item enumerated. The script would then be implemented to process this list specially, and perform its actions on each item. For example, in a script which enumerates over a list of devices, the tag "<DEVICE.NAME>" could be used to specify the name of the device currently being processed. As another example, in a script which enumerates over a list of logs, the tag "<LOG.ID>" could be used to specify the log currently being processed.

The list to enumerate could be implemented by allowing it to be specified using a filter. For example, in a list of devices, a filter could be used to specify that only devices which support log retrieval should be enumerated. As another example, in a list of log data, a filter could be used to specify that only channels which contain data in a specified time range should be enumerated. This filter could be implemented in many ways, including but not limited to wildcards and regular expressions.

Configuring scripts separate from the script runner could be further implemented by providing a way for the script runner to refresh when scripts have been added or changed. For example, if the script runner is currently running, and a new script is added, it could update the scripts it is executing. As another example, if a script is changed while it is being executed, it could defer the update of the script till it was completed, then perform the update.

One possible implementation of this refresh could be for the script runner to check the script configuration periodically, and if it sees differences, to load those changes. For example, when it finishes with an executing script. As another example, it could check to refresh on an interval. Another possible implementation of this refresh could be for the command interface to provide a refresh command, which would indicate to the script runner that it refresh its scripts.

Figure 37:
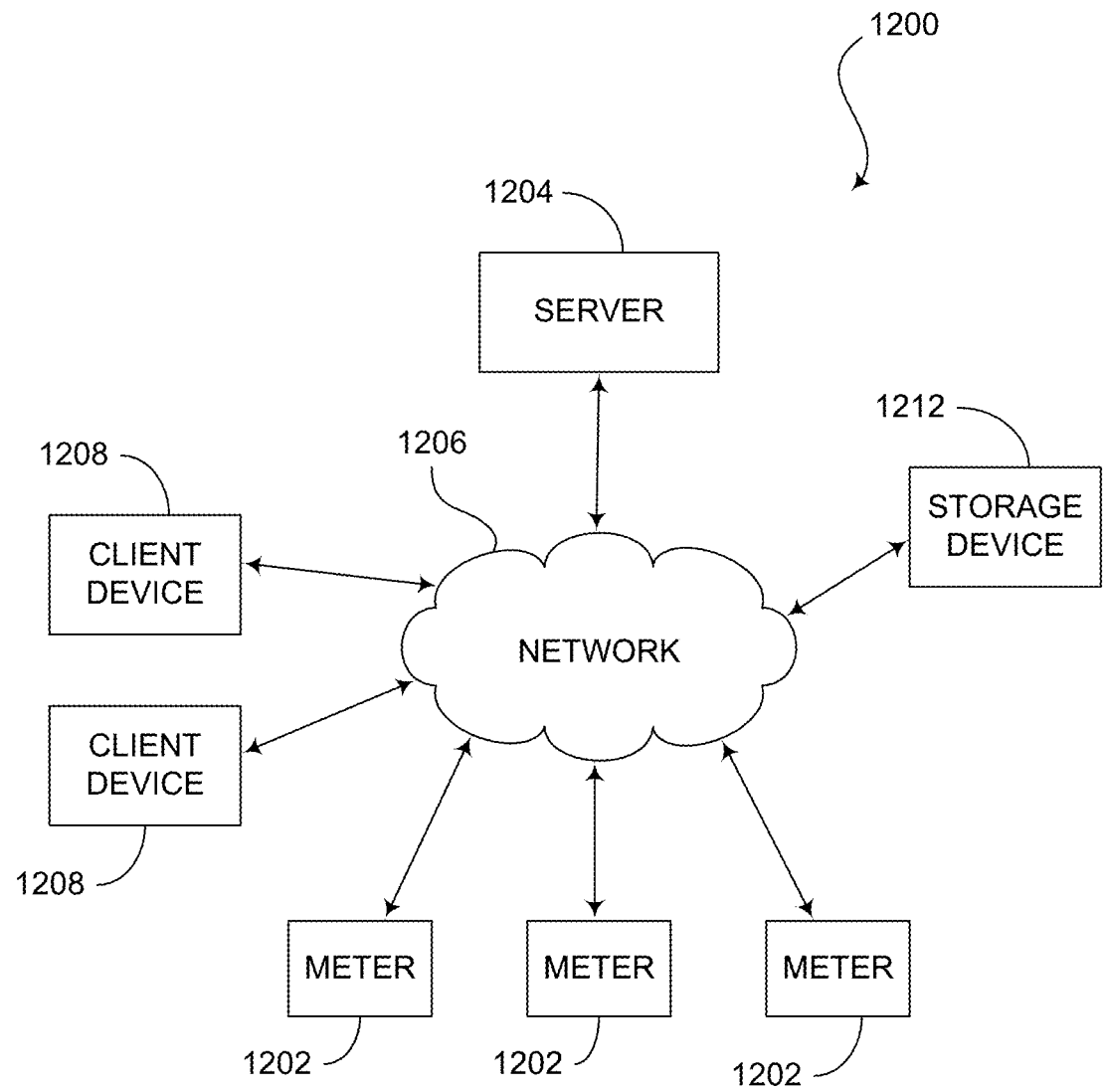
FIGS. 37 and 38 illustrate systems for managing meter information in accordance with several embodiments of the present disclosure.

Systems for providing meter information are further described in accordance with various embodiments disclosed in the present disclosure. For example, FIG. 37 illustrates a system 1200 that is configured to allow access to meter information and parameters. As shown, the system 1200 comprises a plurality of meters 1202, a server 1204, a plurality of client devices 1208, and a storage device 1212. Each of the meters 1202 is configured to measure parameters of a commodity consumed at a customer location. The server 1204 is configured to operate in communication with the meters 1204 by way of a network 1206. The server 1204 is configured to receive the measured parameters from the meters 1202 and store these parameters. For example, the measured parameter may be stored in the storage device 1212. The client devices 1208 are also configured in communication with the server 1204 by way of the network 1206. At least one of client devices may be considered to be a calling device. The storage device 1212 is able to communicate with the plurality of client devices 1208 by way of the network 1206. The storage device 1212 may be configured to store meter information related to the meters 1202. The meter information includes at least connection information to be used to enable the one or more calling devices to access the meters 1202 as needed. Furthermore, the one or more calling devices are configured to reference the storage device 1212 to inquire about one or more meters 1202 and to receive the meter information related to the one or more meters.

When dealing with communications oriented devices, such as meters, it is common to conceptually organize those devices by their connection, as that is typically the first parameter that must be dealt with to use the device. However, as this device is used, the relevance of that connection diminishes, which may lead to confusion on the user's part as to what device they are dealing with. Additionally, in today's connected environment, it is common for connections to frequently change, which often requires extensive reconfiguration of many software applications. For example, some USB devices change their connection information every time they are plugged into a different USB port. As another example, when devices are on a network and configured to get their address from DHCP, those addresses may change every time the devices start up.

Figure 39:
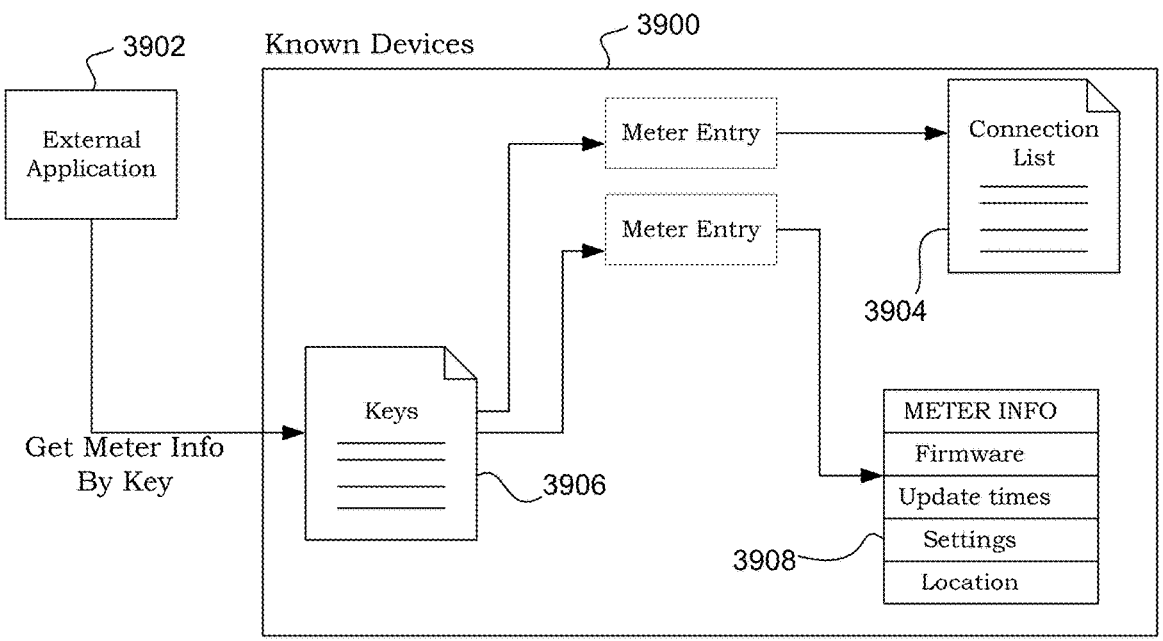
FIG. 39 illustrates an environment for storing connection information for known device in accordance with an embodiment of the present disclosure.

One possible solution to this could be to store connection information for a device in a single place, such as in the storage device 1212. A reference to that common device (e.g., storage device 1212) may be used in each of the software applications running on the client devices 1208. Let such a usage of a device reference be called a Known Device 3900, as shown in FIG. 39. When a software application 3902 wants to use the connection for that device, it can look up the current connection list 3904 using the device reference key 3906. This would allow software applications to always use the most up to date connection without extensive reconfiguration. Additionally, this would allow users to conceptualize devices by what they do, rather than how to connect to them.

For example, a software component which displays the current readings of a device could allow the user to select which device to view from a list of devices. Once selected, the software component would then perform all communications using the stored connection settings for that device. If the connection settings for that device changed, the polling software would not be required to know about that change; only the stored connection information would have to be changed.

As another example, a software component which retrieves logs from a device could be configured to use the device reference instead of the connection information. Alternatively, for such a software application that only accepted connection information, such as a URL in a web browser, a second software application could generate that connection information from the stored device information, and pass it to the first software application. As another example, if three such software applications were used, all referencing the same device, there would be no ambiguity as to whether they were all interacting with the same device, as there would be if connection information had to be entered in each one.

One possible implementation of storing known devices could be to configure the storage device 1212 as a database which stores a list of such known devices, along with their connection information. Another possible implementation could be to store such a list in the storage device 1212 as paired entries in a text file. Another possible implementation could be to store a file for each device in a directory in the storage device 1212, where the connection information is an entry in that file.

Storing the connections for known devices could be implemented by allowing multiple connections to be stored. For example, a device (i.e., meter 1202) may have multiple communications ports, such as a network connection, a serial connection, and a USB connection. The user on the client device 1208 (or calling device) could then be presented with a list of which connection to use. One possible implementation of this could be to store the device list separate from the connection list, and allow the connection in the connection list to reference back to the device it applies to. Another possible implementation could be to organize the stored known devices in a tree hierarchy, such as an XML file, or a file for each device, and store the list of connections there.

Storing multiple connections for a known device could be implemented by designating one connection as a primary connection, such that it would be the connection used when no other specific type of connection was specified. For example, in the case of a device having a serial connection and a network connection, the network connection could be specified as the primary connection, such that it is used unless another connection is explicitly specified.

Storing multiple connections for a known device could be further implemented by storing information about that connection, such that it can be used by the user or software application to determine the best connection to use. For example, a name could be assigned to each connection to indicate to the user which connection is which. As another example, a measured throughput or communications speed could be stored, and used to determine the fastest connection for log retrieval purposes. As another example, the type of the connection, such as serial or network, could be stored. This information could then be used to determine which connection to use if the network interface on the computer was down.

Storing multiple connections for a known device could be further implemented by automatically trying each connection if the previous one fails. For example, if a device has a wired network connection, a wireless network connection, and a cellular data connection, if the cellular data connection dropped, the wireless connection could then be tried. If that then failed, the wired connection could then be tried.

Storing multiple connections for a known device could be further implemented by using multiple such connections in parallel. For example, in a device which has two serial connections, one connection could be used for polling, while the other was used for log retrieval. As another example, as serial connections can only be used by one software component at a time, a second such connection could be used if the first has already been locked by another software component.

Storing connections for a known device could be further implemented by storing a "last used time" parameter. For example, this time could be used by the user to determine how active a connection is. As another example, with multiple connections, this time could be used to determine which should be tried first.

Storing known devices could be implemented by making the list accessible from multiple locations. For example, the known connections could be stored in a database server, which multiple computers could connect to. As another example, the known connections could be stored in a file or files accessible from a networked or shared drive. As another example, a software component could be created that propagates changes to the known device list between computers. As another example, the known device list could be stored on a portable device, such as a hard drive, compact flash disk, SD card, USB storage, CD, or other such media. It could then be used on multiple computers by moving the files around.

Making the known device list more accessible could be further implemented by allowing devices to be imported and exported from the list. For example, a portable list, such as on a CD, could be imported to a local known devices list. As another example, the devices from a list could be exported and then emailed to another user.

One possible implementation of exporting could be to create a second copy of the known device list by enumerating each entry in the source list, and writing it to the destination list. Another possible implementation of exporting could be to make a copy of the source file. Another possible implementation of exporting could be to convert each source entry to another format, such as text or XML, so that it would be easier to transfer.

One possible implementation of importing could be to enumerate each entry in the source list, and insert it to the destination. If a conflict was found, such as a device that already exists, or a connection that conflicts with other existing connections, the user could be notified and asked for a resolution.

Storing known devices could be further implemented by also storing information other than connections about each. This could be used by a software application to make decisions about the device without having to connect to it. This could also be displayed to the user, to better understand the devices they are looking at. For example, the firmware versions of the device could be stored 3908, as shown in FIG. 39. As another example, settings for the device, such as but not limited to hookup, serial number, calibration, and log settings, could be stored. As another example, a display name could be assigned to the device, which could then be shown on UI's when the device is being displayed. As another example, a unique identifying name could be assigned to the device, which could then be used to reference the device separate from other devices. As another example, the last time the device was known to have reset. As another example, the last time the device settings were changed. As another example, the last time the firmware was changed.

Storing information about a device could be implemented by storing a device type, which would uniquely identify it from other types of devices. For example, this could be used to group the device with other like devices. As another example, some devices of like type store information in similar locations. This could be used to determine which location to use to retrieve that information. As another example, the device type could be used as a filter to only show specific, or not show specific, types of devices.

Storing information about a device could be further implemented by storing features that are supported by the device. These could then be used by software to determine what features to display to the user. These could also be used by software to determine how to perform feature specific actions. For example, if multiple devices supported different methods of log retrieval, the supported features could be used to determine which method to use. As another example, if a device supported multiple communications protocols, the supported features could be used to determine which protocols to use, or to display as options to the user.

Storing information about a device could be further implemented by storing application information relevant to the device. For example, the location that the retrieved log data for a device could be stored. This location could then be used by the retrieval software, the analysis software, and the data view software.

Storing information about a device could be further implemented by storing extra information entered by the user. For example, the user could describe the physical location of the device. As another example, the user could enter notes such as but not limited to, installation time, last service date, or notes on wiring. As another example, the user could store an image to be shown in relation to that device, which could then be displayed by the software application.

Storing information about a device could be further implemented by storing security information for the device.

For example, a device may require login information to retrieve logs. The stored login information could be used by a log retrieval software component. As another example, a device may require login information to read certain values, such as energy. The stored login information could be used by a polling software component. As another example, the user could store login information so they do not need to enter it every time they perform a secure action, such as retrieving logs, updating firmware, or updating settings.

As much of the information stored about a device could be considered sensitive, such as security info, storing information about a device could be implemented by only allowing authorized software applications to access that information.

One possible implementation of securing sensitive entries could be to encrypt each field with an encryption algorithm, such as but not limited to AES or Blowfish encryption. For example, the login information could be encrypted so that only log retrieval software could use it. Another possible implementation could be to encrypt the entire contents of the known device entry.

Encrypting each field could be implemented by using a different key for each field, or groups of fields, such that a software application only has to be given permission for the entries it needs. For example, log retrieval software may have the key for connection information, device features, and login information, but not location information. As another example, a polling software component may not need access to login information.

Another possible implementation of securing sensitive entries could be to lock the contents such that only users with appropriate permissions could access the information. For example, a database or other such file, which supports user permissions, could lock access to the device information only to authorized users. As another example, read access to the physical file that holds that information could be restricted only to software running under certain users.

Storing information about a device could be further implemented by the information being updated by the software as they gather the information from the device. For example, when a user connects to a device without using the known devices, that connection could be added to the known devices. As another example, when a software application connects to a device, it could poll the device information such as serial number, description, device type, and firmware versions, and store them to the known devices. As another example, when the user enters login information to perform a secure action, such as retrieving logs, updating firmware, or updating settings, they could be given the option to store that login information for later use.

Storing information about a device could be further implemented by storing when that value was changed. For example, the time the firmware was updated could be stored, even if the firmware was not changed at that computer. As another example, the time a setting, such as device name, was changed could be stored.

Storing information about a device could be further implemented by keeping a history of the information, using the newest for the current value. For example, the history of firmware versions of a device could be used to track bugs and errors in the device. As another example, the history of settings in a device could be used to decide which settings to apply to log data that has been previously retrieved.

Storing information about a device could be further implemented by keeping a history of the actions that each software component takes on that device. For example, a software component could log each time it retrieves logs from the device. As another example, a software component could log each time it reset the energy, which could then be used by analysis software to determine if the logged energy values are increasing properly. As another example, a software component could log each time it changes the firmware of the device. As another example, a software component could log changes to the programmable settings. As another example, a software component could log each time it resets the logs.

Querying device information could be implemented by creating an identification library, which provides a common interface for querying the features of a device. For example, the library could contain a function QueryDeviceType( ), which would attempt to identify which device was being used, what features it supports, and how to interact with it. As another example, using the device type and features, a function QuerySerial( ) could be implemented, which handles getting the serial number, regardless of the device type. Such a library would simplify the implementation of both storing information about a device, and the software that performs the query of that information.

Such a device library could be implemented by using a configuration file, which allows devices to be defined without changing the library. For example, when a new device is defined, a descriptor entry could be added which defines the device identification string, what features it supports, and which of the known methods of retrieving device information it supports. Such a descriptor could then be referenced when determining the device type.

Many software applications are written with a single device at a time in mind. For example, a configuration software application may allow the user to configure the settings for a single device, but to configure another device requires switching to that other device, and performing the configuration again. As another example, a polling software application may display readings for a single device, but to compare against another device may require disconnecting and reconnecting to the second device, or opening a second copy of the software application.

However, in many instances a collection of such devices may be required to fully describe the role they play. For example, multiple electrical meters may be installed in a building, one for each room. To properly describe the electrical qualities of that building, such as voltage levels, power quality, and energy usage, it makes more sense to view all such devices together.

One possible solution to this is to group devices together into Locations, such that software applications could be aware of, and present, all such devices together. For example, a polling software application could display the readings of each meter in a building in parallel, and furthermore, display a summary of their values. As another example, a software application which resets a meter's energy values could perform the reset on all the devices at a location together, such that they remain in sync. As another example, the timestamps of all devices at a location could be updated together. As another example, an analysis software application could display the sequence of events between multiple meters during an event, such a surge moving along a power line, or the connection between toggling a relay and the voltage levels.

One possible implementation of this could be to store a list of each device at a location. For example, a file could be created for each location, listing each device to be included. As another example, the device list could be stored in a database, using a foreign key to reference the location they belong to. As another example, an XML file could be used to store each location, and to store the device list in each location.

Another possible implementation could be for each device to reference each of the other devices in its group. For example, the storage of the device in the known devices list could contain a reference, such as a foreign key or a key name, to the location it belongs to. As another example, each device could contain a list of the key for each of the other devices that belong to its group.

Storing devices in groups could be implemented by allowing locations to contain groups of other locations. For example, a multistory building may be considered location "A", and each floor a location within that group "A". Each floor location could then be broken into individual locations for each room, in which a group of devices for that room could be kept. In addition, each of those locations may have devices in addition to their sub locations. For example, each floor location may have a common meter used to measure the electrical usage of the entire floor. Such a device would be grouped with the floor location.

Storing devices in groups could be further implemented by allowing a device to be contained in multiple locations. For example, a meter may measure electrical usage, as well as count pulses from a steam counter. In such a case, the electrical usage may be desired to be grouped separately from the steam usage. As another example, a meter may have multiple current inputs, allowing it to be used to measure the electrical usage across multiple rooms on a floor. Each of these individual usages could be grouped separately.

Storing devices in groups could be further implemented by also storing information about each location, which could be further used by the software for analysis and reporting. For example, square footage of a location could be stored, and then used as a comparison metric when generating a usage report. As another example, the number of occupants of a location could be stored.

Storing information for a location could be implemented by allowing a log of such values to be stored. For example, a trend of the average temperature for each day at that location could be stored. This temperature trend could then be used to analyze the electrical usage for that location. As another example, the number of customers daily at a consumer location, such as a store, could be logged and later displayed as a trend.

Storing information for a location could be further implemented by allowing formulas to be stored, such that a new value could be specially defined for that location. For example, a location may have multiple sub-locations, all of which feed off a central electrical line. A formula could be defined to create a usage value which is the central usage, minus the sum of the sub-locations, describing the usage of just the common area.

One possible implementation for storing information about a location could be to store it as an entry in the location storage, such as a file or database. Another possible implementation could be to store it as a separate file, which is referenced by the location storage. Another possible implementation could be to create a special device which is used to describe and log data about the location. Such a special device would have all the qualities previously described for known devices.

Grouping devices into locations could be further implemented by providing a library or application programming interface (API) which callers could use to query or manipulate the contents of the list. This would allow the software to be written without requiring including details of the specific mechanism of storing the locations. This would also allow the query and manipulation code, which would be common between software applications, to not be repeated in multiple locations, which reduces complexity. For example, a software application could group three devices by just creating a list of those devices, and calling the following code snippet: locationapi.CreateGroup("locationname", devicelist). The software application would not have to know how the location group was stored.

One possible implementation of such an API could be to provide a library code base, such as a dynamically loaded library (DLL), a statically linked library, a plug-in, or common source code.

Another possible implementation of such an API could be to provide another software application, which is called to perform the queries and manipulations of the groups. For example, a command line application could be used to create a group by invoking the command line application with the location name, and list of devices to group, as arguments. As another example, a command line application could be used to perform a query by invoking the command line application with the query parameters as arguments, and the results could be written to a file, or standard out, and read by the caller.

Such an API could be further implemented by providing the ability to generate lists and reports of the locations and devices. For example, it could be used to generate a webpage which contained a list of each location, and links to connect to each of the devices at that location. As another example, it could be used to generate a report of the settings for each device at a specified location.

One problem commonly encountered when dealing with connection oriented devices is finding the parameters for that connection. For example, with a serial device, one must first figure out what communication port the device is attached to. Next, the baud rate, parity, protocol, address, and other configurations must be determined. As another example, with a network device, the IP address must be determined, which in the case of DHCP or dynamically assigned address rules, may not be a fixed address.

This problem is compounded when those parameters can change over time. For example, with USB to serial converters, often the com port changes each time they are plugged into a computer. As another example, with DHCP assigned network addresses, the IP address may change arbitrarily as the DHCP lease is renewed.

Figure 38:
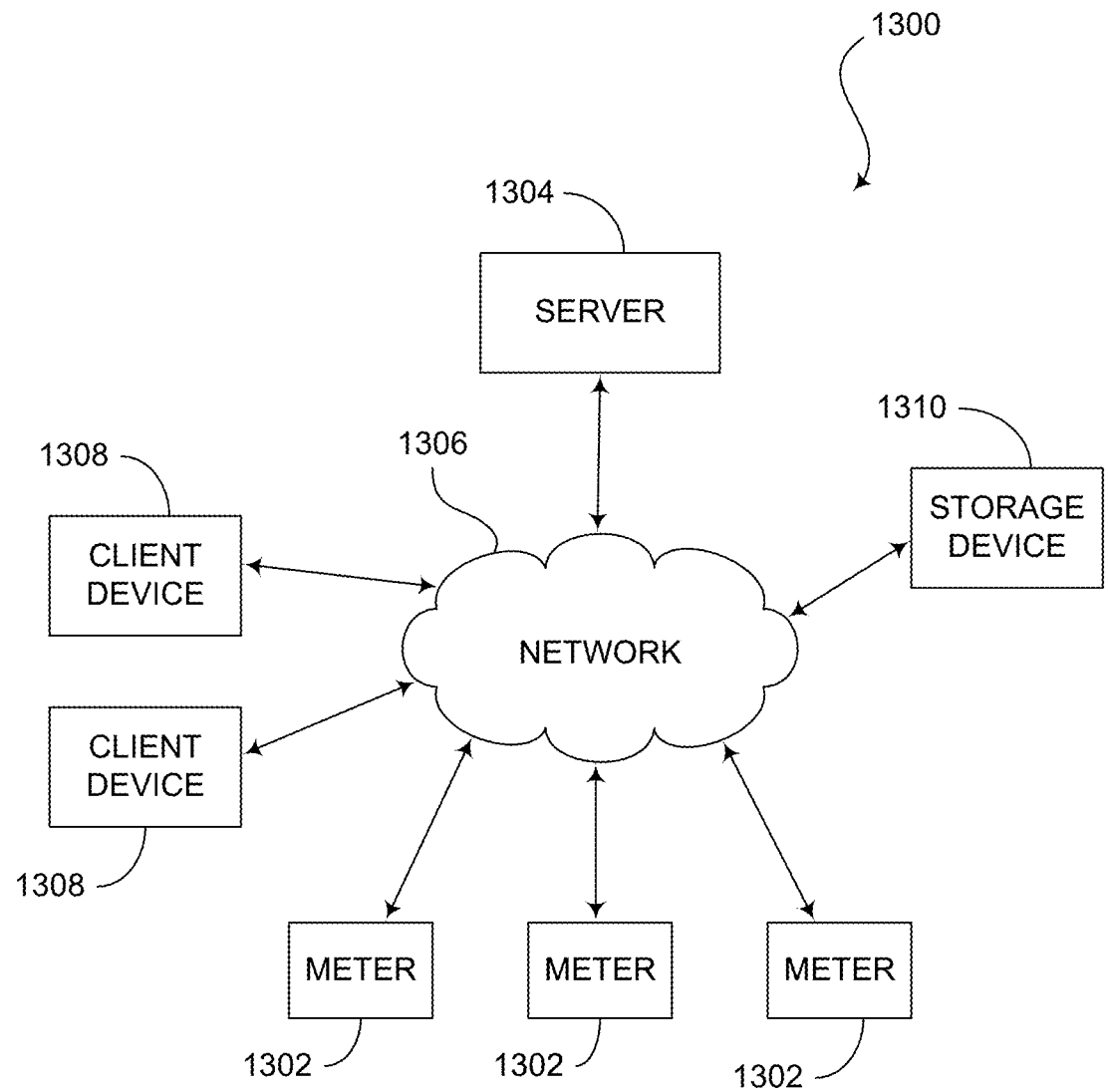

According to some embodiments of the present disclosure, systems are provided for overcoming these issues by managing parameters related to meter connections as described below. As illustrated in the embodiment of FIG. 38, a system 1300 that manages meter connection parameters comprises a plurality of meters 1302. Each meter is configured to measure commodity data representing at least one commodity being consumed at a location. The system 1300 also includes a server 1304 in communication with the meters via a network 1306. The server 1304 may be configured to receive and store the measured commodity data from the meters 1302. Also, the server 1304 is further configured to obtain meter connection parameters related to the meters 1302. The system further comprises a storage device 1312 in communication with the server 1304 via the network 1306. The storage device 1312 is configured to receive the meter connection parameters from the server 1304 and store the meter connection parameters. The meter connection parameters, for example, enable a client device

1308 connected to the network 1306 to identify at least one meter and communicate with the at least one meter.

One possible solution to finding communications parameters could be to provide a mechanism by which the device could be identified regardless of the address change. One possible implementation of this could be to design a USB to serial adapter such that it provides a unique identifier in addition to performing the serial conversion. This unique ID could then be used by a software application to detect each device uniquely, and assign the use of the associated com port to the device.

Another possible implementation could be to detect the addition of a USB device to the computer, and if it was a serial to USB converter, attempt to determine if a known device is connected to it. For example, when such an event was detected, a software application could send a request, such as a Modbus RTU message, to detect the device.

Another possible implementation could be to use a known MAC address, which is uniquely assigned to each network device, and send custom crafted network messages directly to that MAC address. If the device was on the same subnet as the requestor, it would then respond and a connection could be established. This could be further implemented by responding with the IP address that the device was configured to, which could then be used by the requestor for standard network communications.

Another possible implementation could be to use a known IP address and MAC combination, which would not conflict with any known device, such as a broadcast address. This message could then be sent to all listening devices using a protocol such as UDP or UPnP, which could then respond with an acknowledgment of their existence, along with their communications parameters.

Figure 40:
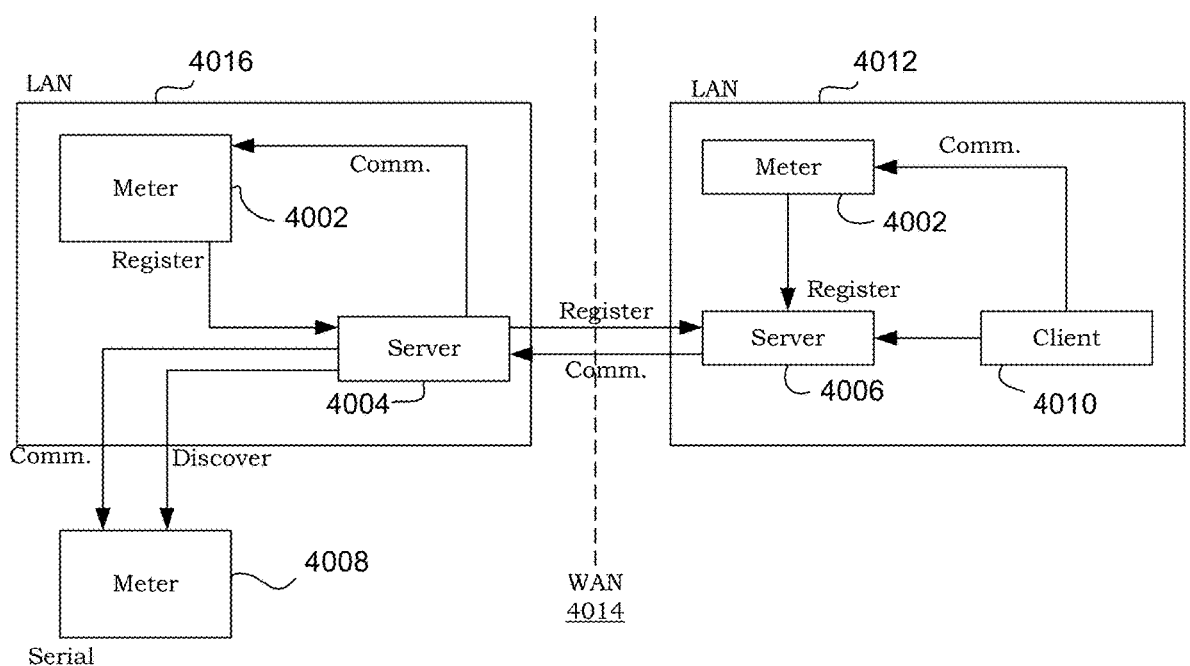
FIG. 40 illustrates an environment for device registration in accordance with an embodiment of the present disclosure.

Another possible implementation could be for the device to register itself with a common server, such as server 1304 or other server, which could then be used by a software application to determine the proper address to use, as shown in FIG. 40. For example, when a network device, e.g., meters 4002, received a new IP address, it could register that address with a common server, e.g., server 4004, which would be at a fixed known address. Such a fixed address could be a fixed ipv4 address, a fixed ipv6, or a fixed URL, which would allow dynamic redirection to an arbitrary server through a DNS. As another example, the device 4002 could broadcast the new address, which the common server could listen for, thus not requiring that a fixed known address be used.

Using a common register server could be implemented by allowing each device to also perform this registering service, such that a software application could query a device at a known address for other devices.

Devices supporting the register service could be further implemented by allowing them to query other known devices for their known lists. For example, a device which knows other devices could query those devices for the devices they know about, possibly adding more devices that registered with those devices first.

Using a common register server could be further implemented by allowing such a server to relay communications to devices it knows about, such that even devices which are normally inaccessible from a software application can be communicated with. Let such a server be called a Communications Server 4004, which may be include server 1304 or other suitable server. For example, the computer that a communications server is running on may be connected to a serial device 4008, which would not be accessible from another computer. The communications server 4004 could then be used to relay external communications, such as network connections, to the internal serial device. As another example, the computer that a communications server is running on may have access to multiple network subnets which are isolated from each other. The communications server could then be used to bridge those networks. This could also be applied to bridging local area networks and wide area networks. As another example, a device which the communication server knows about may not support a protocol that an external software application is required to use. The communication server could then translate from one protocol to the other.

Such a communications server could be further implemented by allowing such relaying to be performed across multiple such servers. For example, a software application may be on a computer 4010 which is isolated inside a local area network 4012. This software application could connect to a communication server 4006 which bridges onto a wide area network 4014, such as the internet, which could further connect to a communications server 4004 which bridges onto a remote local area network 4016. This could further relay onto a computer within that remote local area network, which could be connected to a device via serial communications.

Using communications servers could be further implemented by keeping quality information for each connection, such that the optimum path could be found. For example, a set of communications servers could exist such that two paths to a single device could exist. One path may require three hops, the other two, such that communications over the two hops would be more reliable and faster than the three. As another example, one path may go through a server which handles more traffic than the other, such that the less used server would be more optimal.

Keeping such quality information could be further implemented by allowing this information to be queried, such that another software application or server could use this information to choose the best path. For example, a software application could collect the path qualities, and choose to use one path over another. As another example, a server could query other servers' quality information to better update its own path quality information.

Figure 41:
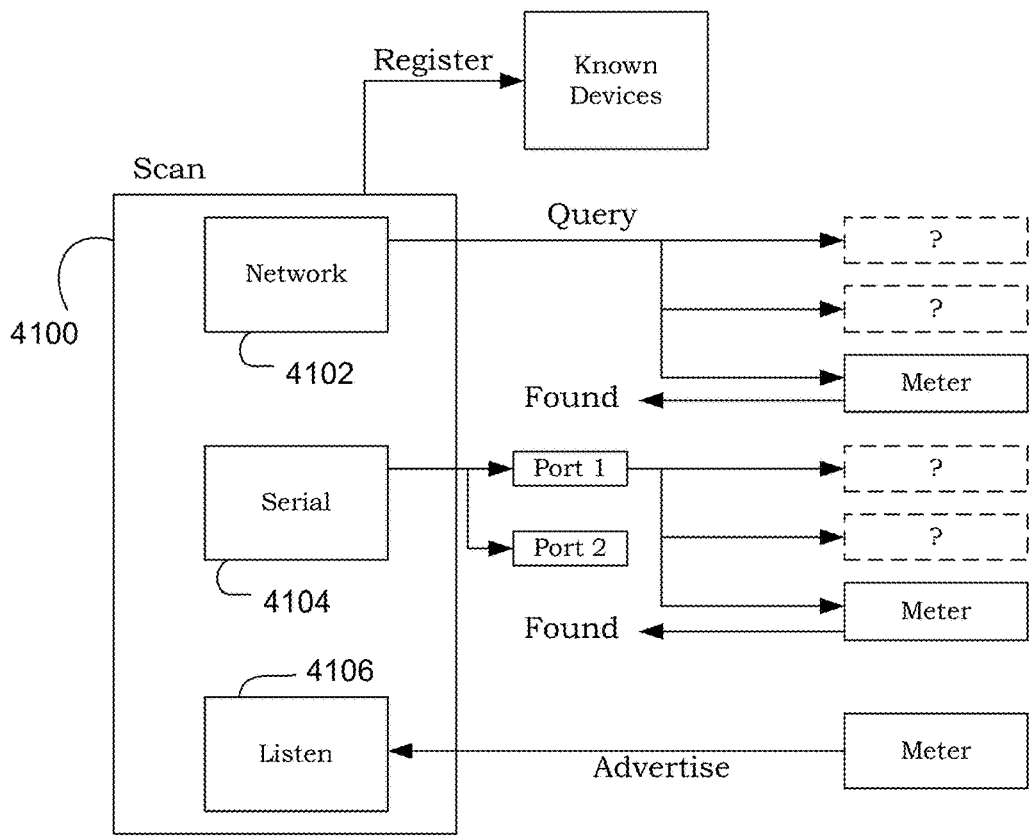
FIG. 41 illustrates an environment for scanning for devices in accordance with an embodiment of the present disclosure.

Another possible solution to finding communications parameters could be to provide a software application 4100 which searches for devices, as shown in FIG. 41. One possible implementation of this could be to attempt to connect to each network address accessible from the local computer via module 4102. For example, a TCP connection to be attempted to each network address, and each connection that succeeded could be considered accessible. As another example, a connectionless message, such as UDP or ICMP, could be sent to each network address, and each address that responded could be considered accessible. As another example, a web service could be discovered by sending an HTTP GET request.

Scanning network addresses could be implemented by automatically determining the range of addresses which are accessible from the local computer, by combining the local IP address with the subnet mask. Alternatively, the range of accessible addresses could be determined from the local computers routing table. These ranges of network addresses could be further extended by providing a user supplied range of network addresses.

Scanning network addresses could be further implemented by first sending a simple message to determine if a device is there, before attempting to communicate to establish the device's identity. For example, an ICMP ping could be first sent, and if a response is received, the scan could follow up with identifying the type of device discovered. As another example, an ARP request could be made to determine if a MAC address was known. As another example, a TCP SYN message could be sent alone, and only if an ACK was received in response would continue.

Another possible implementation of this could be to open each serial port accessible from the local computer, and attempt to communicate to a device via module 4104. For example, a software application could enumerate the serial com ports which are available on the local computer, and attempt to open each one in sequence. If the port succeeded in opening, a message such as Modbus could be sent, and if a response was received that connection could be considered accessible.

Scanning serial ports could be implemented by scanning over the different configuration properties of a serial port. For example, serial devices can communicate at different baud rates, such as 9600, 57600, and 115200, which must be tested independently.

Scanning for devices could be further implemented by including protocol specific information in the search. For example, for a device that supports Modbus, the scan could include trying the different Modbus addresses, in the range of 1 to 247. As another example, TCP supports multiple ports.

Scanning for devices could be further implemented by scanning over multiple protocols. For example, a device may support Modbus RTU, or DNP, or HTTP web requests.

Determining the communication parameters for a device could be implemented by using the described methods to fill the known devices list. For example, a network scanner could insert each device it found in the known devices list. Furthermore, it could be used to keep the device list up to date.

Using the known device list with a device scanning software application could be further implemented by using the list of known devices to periodically verify that those devices are still accessible. If the scanner was unable to communicate to a previously valid device, that connection could be marked as invalid. Otherwise, it could be marked as confirmed. Such a test could also be used to detect if the device using those communications settings is still the same device. For example, serial ports could easily be reused for multiple devices. As another example, with network devices that use DHCP for their address, the assignment of address could arbitrarily change between them.

Scanning for devices could be further implemented by also querying device information after detecting the device. This information could then be inserted into the known devices list, as well as keeping the information up to date.

Using the known devices list with the device scanner could be further implemented by automatically creating an unassigned devices location. This location could then be used by the user to easily organize all the devices which they have not yet assigned to their proper location.

Often the functionality that makes up a software product is split into multiple software applications. Let this be called a Software Suite. These software applications may be independently developed, without thought to them working together. Additionally, they may support standalone use, which in some cases may be preferable to standard usage. Such implementations make it difficult to present a consistent, cohesive feel across the whole software suite.

One possible solution to provide a cohesive feel could be to present a singular frontend to the user of the client device 1408 who is knowledgeable of the entire system and uses each of the individual software applications to perform functionality as required. Let such a frontend be called a Launchpad Application. For example, in a software suite that interacts with devices, three functionalities could be implemented as individual software applications, such as for polling, log retrieval, and device configuration. A frontend software application could be created that knows about each of the devices involved, and launches each of the individual software application with the appropriate command line when required.

Such launched applications could be implemented by allowing them to jump to specific components of the functionality, bypassing the normal navigation of the UI. For example, a polling software application could provide a means to show a specific polling screen, so that it appears that when launched, it is just another window of the calling application. As another example, a configuration software application could jump to a specific device configuration page, such as communications, without requiring the user to navigate through other settings. Such a jump could then be used by the frontend software application to give a more integrated feel to the software.

Such a Launchpad application could be further implemented by dynamically enabling and disabling components as they are available to be used by the user. For example, configuration of a device could be disabled if the configuration software is not installed. As another example, the log retrieval action could be disabled if the user does not have the license to use it.

Such dynamic enabling could be implemented by downloading and installing software which it does not have installed. For example, the software applications may have only been installed with configuration support. When the user clicks on a polling action, it could download and install that component. Such dynamic installation could be extended by also allowing software components to be removed.

Such dynamic installation could be implemented by requiring a security key to perform the download, install, and uninstall. For example, a user name and password, or just a password, could be required for the user to install new software components.

Such dynamic enabling could be further implemented by providing user groups, such that only certain users are allowed to use certain features. For example, two groups could be created, a configuration group, and a viewer group. The configuration group may have permission to access the configuration components of the software, and the viewer group may only have permission to view the polling components of the software.

Such dynamic enabling could be further implemented by providing a license for each feature, and preventing access until the proper license key has been entered by the user. For example, the user may have the license to configure device A, but not device B. In such an example, the configuration feature for device A would be enabled, but for device B it would be disabled.

Such a license feature could be further implemented by providing a way in the software application for the user to purchase the license. For example, when the user clicks on a feature for which he or she does not have the license, the software application could redirect them to a website to purchase the license. As another example, it could ask for their information, and purchase the license directly. As another example, it could send a request, such as an email, to the sales force to contact that customer about a license purchase.

Such dynamic enabling could be implemented by providing a visual cue to the user as to the current state of the feature. For example, a disabled feature could be grayed out and may not be able to be clicked. As another example, a feature which doesn't have a license could display an exclamation icon over it. As another example, a spinning icon could be displayed over a feature that is currently being installed.

Another possible solution to a cohesive feel could be for each software application to use a common source and format of information for display and usage. For example, using the known devices list to deal with the same device across multiple software applications. As another example, using the known devices list to display a common grouping of devices. Such a common format could be stored as a database, xml, or other such format which could be parsed by both sides.

Using a common source and format of information could be implemented by using it to move information between software applications. For example, a common format could be used to store device information, allowing the user to drag a device from a software application which displays devices found while scanning, and insert it in another software application which is used to configure locations. As another example, a common reference could be used to describe an individual device's log item, allowing the user to drag the item from log viewing software, to be used in report configuration software.

Such a common source of information could be further implemented by allowing changes to be displayed to the user relatively simultaneously in multiple applications. For example, a newly found device could be added to the known devices, and that device could show up in each of the currently running software applications. As another example, assigning a device to a location could cause that device to disappear from a list of unassigned devices in another software application. As another example, changing the configuration of what items a device logs could cause the list of items to view in log view software to update. As another example, an automation process that retrieves logs could cause the data being viewed in log view software to update.

One possible implementation of this could be for each software application to periodically check if the known devices list had changed. Another possible implementation of this could be for each software application to register for notification when changes occur.

Such common display of information could be implemented by providing a common set of actions that the user could perform on those displays. For example, polling software which displays information about a device could provide the same actions as device list software or a device scan results software, which could include polling, log retrieval, and configuration. No matter which software the user was in, they would be presented with the same set of actions they could perform on similar concepts.

Another possible solution to a cohesive feel could be to configure the UI of each of the individual software applications so that they could be rendered inside an arbitrary container, such as another software application. For example, a software suite that retrieves and displays log data, but which has external viewer software, could launch the external viewer software, and display its UI as an internal frame of the launching software.

One possible implementation of this could be to implement the UI of the individual software applications as HTTP servers, and read and render this UI in the launching software as a webpage. For example, polling software could generate a webpage that could be rendered in the calling software, and contain the layout and values to be displayed. As another example, log retrieval and conversion software could generate a webpage that contains the progress and status of the conversion.

Implementing the UI as a webpage could be implemented by allowing the rendering software to specify the style of the UI, such as with a cascade style sheet. For example, a polling page could be made to use the same color scheme as the rendering application.

Implementing the UI as a web server could be further implemented by allowing the webpage to stand on its own. This would allow the webpage to be used directly from a web browser.

Implementing the UI as a web server may include configuring the transport over other interfaces, such as but not limited to pipes, disk or ram files, UDP, or shared memory. For example, the webpage for an application could be saved to a ram file, to be read periodically by the calling application.

Implementing the UI as a webpage could be further improved by defining rendering commands specific to the software. For example, a HTML command could be defined to display a table of values without requiring <TR> and <TD> elements. As another example, a built in JavaScript function could be defined that grabs a file from another location and parses it into a list.

Another possible implementation of embedding the UI in another software application could be to run a wrapper that transfers the UI contents to be rendered to the calling application. For example, a remoting protocol, such as VNC or X-Server, could be used. Such a protocol could be rendered by the calling application, and expose the displayed UI of the embedded application without redesigning the UI.

In many User Interfaces, it is common to present the user with too much information, or to provide the user with too many options for what action they should take. Alternatively, it is also common to present the user with too few options, or hide options in such a way that it is not intuitive as to where to find them, or provide too little information in one location, requiring that they navigate to multiple locations to understand what is going on.

One possible solution to this is to use color to draw the user's attention to pertinent information, while still presenting all the information. One possible implementation of this could be to use simple, monotone, or low saturation colors to represent the user interface. Information which was relevant to the action at hand could then be represented with colors and styles that make it stand out, such as using bright primary colors, shading, borders, or auras, as to draw the attention of the user. For example, a UI which presented a device list could represent all the devices in the list using light grays, and represent newly added devices in bright blue.

Another possible implementation of drawing the user's attention could be to combine a 2d and 3d appearance, such that information is grouped on 2d surfaces, but those surfaces are separated 3-dimentionally. For example, a UI could display a device list on one such surface, and display the details of a selected device on another such surface, such that the device details surface appears to be floating above the device list surface, and the two surfaces floating above the background. One possible way to achieve this effect could be to use a drop shadow. Another possible way to achieve this effect could be to use monotone colors with little to no texture for the 2d surfaces, and use textured, shaded, and contrasted color borders to imply that the surface is floating.

Floating 2d surfaces could be implemented by making relevant information float above surrounding information. For example, when a user is editing a device's information, that device could be highlighted in the device list by raising its entry visually above the other entries. As another example, the input field that the user is entering data to could be raised.

Another possible solution to drawing user's attention is to use motion to highlight the areas requiring attention. One possible implementation of this could be to dynamically change the color of a highlighted item. For example, when a new device is found, it could be highlighted with blue, which could fade to the normal color over time. As another example, when a running script has an error, it could be highlighted with red, that cycles between light and dark until the error is acknowledged.

Another possible implementation of this could be to visually move active items to bring them into focus. For example, when editing a device list, when a device is selected, the device editing surface could be slid into view from off screen. When the user was done with editing the device, that surface could then be slid off screen. As another example, such a surface could visually rise up from a flat background. As another example, such a surface could visually flip over to present the new information.

Using motion could be implemented by providing a smooth motion transition, so as to not jar the user. For example, a sliding frame could extend from the side of the screen smoothly over a second. As another example, a highlight color could fade to the background color over time.

Another possible solution to drawing user's attention is to use non-orthogonal shapes and lines to denote areas of focus, while the background information remains orthogonal. For example, a popup menu could be represented as a circle. As another example, the border of the currently selected item could use beveled corners.

Such a segregation of information could be implemented by arranging common information into frames, which could be visually separated from other frames, but could be shown simultaneously. For example, a surface for a device list, a script list, and a script configuration could be shown, allowing the user to link specific devices to the script they are configuring.

Such segregation into frames could be implemented by rearranging the other frames on the user interface to make room, and allow the user to focus on the new frame. For example, a user interface that displays a location list could shrink the location list surface to make room for a surface displaying polled data for a device, and a surface for actions to navigate the polled data. When the user was done with that polled data, the location list could expand again.

Another possible solution to displaying too many actions to the user could be to reduce the number of actions displayed on the main user interface to only those actions commonly used, and then provide a way for the user to perform the less common actions by interacting with the common one. For example, a device could have the common action of connecting, and its less common actions of update firmware, change settings, and view logs.

One possible implementation of this could be to display a menu of less common actions when the user interacts with a button for a common action, such as right clicking it or clicking and holding the button. Another possible implementation of this could be to display additional actions by sliding the common button to the side, revealing multiple additional buttons.

With the increase in touch screen devices, it has become difficult to present contextual information or actions for an item, as the hover capability of a mouse has disappeared. This can be replaced with a hold action by the user, with a popup window or menu displayed, but the traditional dropdown arrangement is often difficult to see with a finger in the way.

Figure 42:
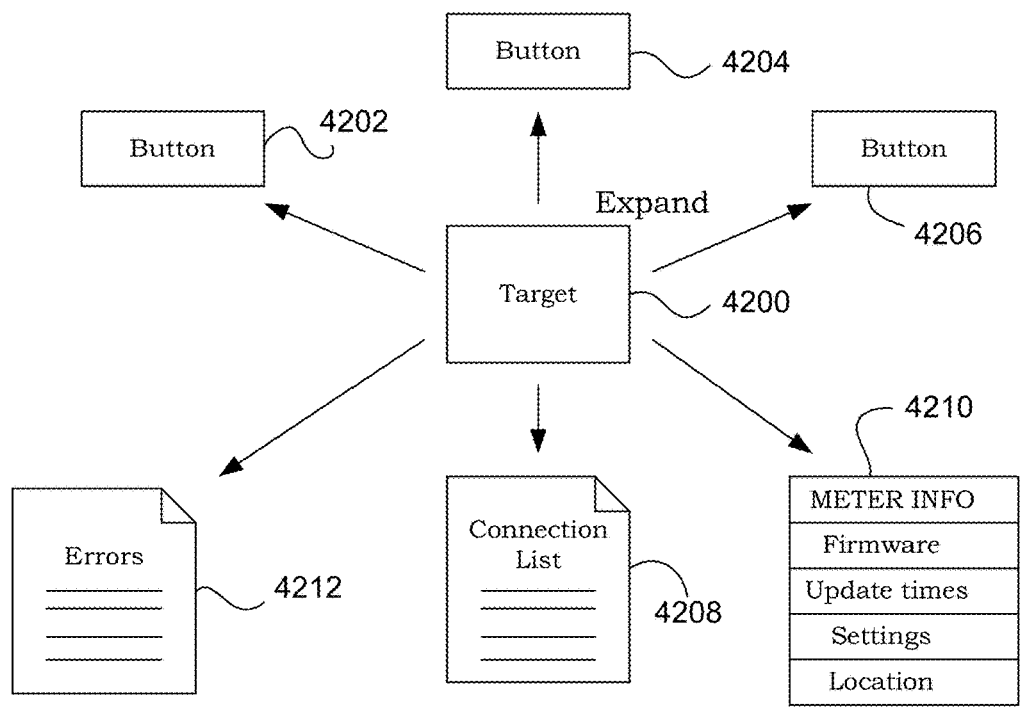
FIG. 42 illustrates a radial menu in accordance with an embodiment of the present disclosure

One possible solution to this is to present a radial menu, such that the new information or actions are displayed in a circle around the item selected. For example, as shown in FIG. 42, three icons 4202, 4204, 4206 may be displayed, arranged around the item selected 4200, to represent the actions the user could perform on that item. The action could be performed by clicking on or touching the icon. As another example, multiple information pop-ups could be displayed, such as a device's connection list 4208, firmware versions 4210, errors 4212 and stored log information. As another example, and action could be displayed as a bubble with text representing the action in it.

A radial menu could be further implemented by displaying a combination of both information and actions. For example, a menu for a device could contain a connect action, a view log action, and display its connection list.

A radial menu could be further implemented by visually providing links between the actions and information, and items they are relevant to. For example, a device edit surface could have a radial menu which provides a connect action, linked to the displayed connection string on the edit surface. As another example, a device list surface could have a radial menu which displays a link to the device actions are performed on.

A radial menu could be further implemented by allowing for radial menu items to have radial menus of their own. For example, a connection menu action could have the list of connections as sub-menu items. As another example, a firmware info popup could have a sub-menu with an upgrade firmware action. As another example, clicking on a connection in a connection list info pop-up could bring up a sub-menu with actions to perform on that connection, such as connecting or removing the entry.

One possible implementation of this could be to arrange the sub-menu around the menu item in question, creating a tree of menu items. Another possible implementation of this could be to display the sub-menu when the main menu item is interacted with, by replacing the original menu. The original menu item selected could be centered between this new menu, and clicking it would return to the original menu.

A radial menu could be further implemented by allowing the user to select an item by indicating motion in the direction of the item. For example, in a touch screen interface, swiping in the direction of the menu item and releasing could select and perform that action.

A radial menu could be further implemented by making the majority of its rendering transparent, such that only the relevant actions and information blocks the surface below it, and as much information of the blocked surface is still visible as possible.

A radial menu could be further implemented by using it even in a traditional mouse environment. As information related to an item is commonly displayed adjacent to the item, a radial menu would allow the user to still see those items while making their choice of action.

A radial menu could be further configured by expanding it from the point of the item selected, using motion to draw the user's attention to the menu.

Further features and implementations of the ScriptManager, KnownDevices, DeviceScan, and Front End of the present disclosure may become apparent to one of ordinary skill in the art from an understanding of the description provided herein. It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. A system for providing meter information, the system comprising:
    a plurality of meters, each of the plurality of meters configured to measure parameters of a commodity consumed at a customer location;
    a server in communication with the plurality of meters by way of a network, the server configured to store the measured parameters from the meters;
    a plurality of client devices in communication with the server by way of the network, the plurality of client devices including one or more calling devices; and
    a storage device in communication with the plurality of client devices by way of the network, the storage device configured to store meter information related to the meters, wherein the meter information includes at least connection information for each meter to be used to enable the one or more calling devices to access the meters, the at least connection information for each meter being updated as needed by the server;
    wherein the one or more calling devices include software configured to reference the storage device to look up the connection information for one or more meters and to receive meter information from the one or more meters using the connection information without reconfiguring the software after the connection information for at least one meter has changed.

2. The system of claim 1, wherein the storage device is configured to store multiple connections for each meter, and the one or more calling devices enables a user to select one of the connections.

3. The system of claim 2, wherein each meter includes multiple communication ports.

4. The system of claim 3, wherein the communication ports include one of a network connection, a serial connection, a USB connection, a wireless network connection, and a cellular data connection.

5. The system of claim 2, wherein the connections for each meter are prioritized such that a primary connection is a default selection unless another connection is otherwise selected.

6. The system of claim 2, wherein the storage device is configured to store information about the connections to enable a user to select a connection based on a name or characteristic of the connection.

7. The system of claim 2, wherein the connections for a meter are configured to allow parallel transmissions.

8. The system of claim 1, wherein the one or more calling devices are further configured to update the meter information as needed.

9. The system of claim 8, wherein the storage device comprises an identification library that allows the calling device to query features of the meters.

10. The system of claim 9, wherein the identification library uses a configuration file.

11. The system of claim 8, wherein the calling device is configured to group meters to enable processing of the meter information for the meters in the group at one time.

12. The system of claim 11, wherein step of processing the meter information at one time includes at least one of displaying the log data of the meters together, resetting the meters at one time, updating the timestamps of the meters at one time, and displaying the sequence of events of the meters.

13. The system of claim 11, wherein the calling device is configured to store a list of meters.

14. The system of claim 13, wherein at least one meter may be stored in multiple groups.

15. The system of claim 11, wherein the calling device is configured to store location information related to the group.

16. The system of claim 11, wherein the calling device is configured to calculate trends of the group of meters.

17. The system of claim 11, wherein the calling device is configured to store information related to the group of meters in a library or application programming interface (API).

18. The system of claim 17, wherein the API includes at least one of a library code base, a dynamically loaded library (DLL), a statically linked library, a plug-in, common source code, and a command line application.

19. The system of claim 1, wherein the storage device is configured to store connection information on a portable device.

20. The system of claim 19, wherein the portable device is one of a hard drive, a compact flash disk, an SD card, a USB flash drive, and a CD.

21. The system of claim 1, wherein the meter information for each meter further comprises at least one of security information and login information, which are accessible by authorized calling devices.

22. The system of claim 21, wherein the security information and login information are encrypted.

23. The system of claim 22, wherein each meter comprises multiple information fields related to different aspects of the meter, wherein each information field is associated with a different key, each key enabling authorization by the calling device that is limited to the associated information field.

24. The system of claim 1, wherein the storage device and meter information are accessible by multiple calling devices simultaneously.

25. The system of claim 1, wherein each of the one or more calling devices are configured to enable a user to select one or more meters from which data is obtained.

26. The system of claim 1, wherein the storage device is configured to store the meter information in a directory, as a list in a database, or as a paired entry in a text file.

27. The system of claim 1, wherein the storage device is configured to store an indication of a last time a connection for a meter was used.

28. The system of claim 1, wherein the storage device is a database server.

29. The system of claim 1, wherein the storage device is configured to store connection information in one or more files accessible from a networked or shared drive.

30. The system of claim 1, wherein the calling device is further configured to receive meter information from the storage device without later connecting to the meter related to the meter information.

31. The system of claim 1, wherein the meter information for each meter further comprises at least one of a serial number, calibration information, log settings, display name, identifier information, rest information, firmware information, device type, meter features, communication protocol, installation information, service information, wiring information, image information, setting history information, action history information, and user notes.

* * * * *